United States Patent [19]
Ikeda et al.

[11] Patent Number: 5,886,580
[45] Date of Patent: Mar. 23, 1999

[54] TUNED AMPLIFIER

[76] Inventors: Takeshi Ikeda, Asahi San-no Mansion 213, 5-6, San-no 2-chome, Ohta-ku Tokyo 143, Japan; Tadataka Ohe, 10-7-203, Higashiohmiya2-chome, Ohmiya-shi Saitama 330, Japan

[21] Appl. No.: 750,346
[22] PCT Filed: Jun. 13, 1995
[86] PCT No.: PCT/JP95/01180
  § 371 Date: Mar. 12, 1997
  § 102(e) Date: Mar. 12, 1997
[87] PCT Pub. No.: WO95/34953
  PCT Pub. Date: Dec. 21, 1995

[30] Foreign Application Priority Data

Jun. 13, 1994 [JP] Japan ...................................... 6-153102
Sep. 27, 1994 [JP] Japan ...................................... 6-256039

[51] Int. Cl.⁶ ...................................................... H03F 1/34
[52] U.S. Cl. ........................... 330/293; 330/98; 330/305; 330/306; 327/553; 327/557
[58] Field of Search ................................ 330/98, 146, 293, 330/302, 303, 304, 305, 306, 307; 327/553, 556, 557; 331/108 B, 110, 135, 136, 138, 140

[56] References Cited

U.S. PATENT DOCUMENTS 3,707,685 12/1972 Geffe ........................................ 330/303

Primary Examiner—James B. Mullins
Attorney, Agent, or Firm—Dellett and Walters

[57] ABSTRACT

A tuned amplifier that can be produced easily in an integrated circuit and by which the tuning frequency and the maximum damping are arbitrarily adjusted without mutual interference. The tuned amplifier is constituted of two phase shifting circuits (10C, 30C) each of which comprises a first serial circuit consisting of two resistors for dividing the voltage of the inputted AC signal to obtain a signal of half the voltage of the inputted signal, a second serial circuit consisting of a capacitor and a variable resistor for shifting the phase of the inputted signal by a predetermined angle, and a differential amplifier for amplifying the difference between the outputs of the first and second serial circuits, a noninverting circuit (50) connected to the input of the phase shifting circuit (10C) of the first stage, and an adding circuit which adds signals outputted from the phase shifting circuit (30C) of the second stage and input signals inputted to an input terminal (90) at a specific rate through a feedback resistor (70) and an input resistor (74).

120 Claims, 27 Drawing Sheets

TUNED AMPLIFIER

FIELD OF INVENTION

The present invention relates to a tuned amplifier capable of easily implementing in an integrated circuit, more specifically to a tuned amplifier capable of adjusting the tuned frequency and the maximum attenuation to any desired value without interaction.

BACKGROUND OF INVENTION

Various types of amplifiers using active devices and reactance elements have been proposed as tuned amplifiers and are practically used for certain applications.

Disadvantages of such conventional tuned amplifiers include interaction between the tuned frequency and the maximum attenuation, i.e., an adjustment of the tuned frequency accompanies a change in the maximum attenuation and also an adjustment of the maximum attenuation accompanies a change in the tuned frequency.

Additionally, it is difficult to implement in an integrated circuit the tuned amplifier free from such interaction between the tuned frequency and the maximum attenuation.

It is, therefore, an object of the present invention to overcome the above-mentioned disadvantages of the conventional tuned amplifiers.

DISCLOSURE OF INVENTION

The tuned amplifier according to the present invention comprises an input impedance element to receive an input signal at one end, a feedback impedance element to receive a feedback signal at one end, a summing circuit to add the input signal and the feedback signal, a pair of phase shift circuits connected in a cascade manner each comprising a first series circuit of first and second resistors of substantially equal resistance to receive an input AC signal across both ends thereof, a second series circuit of a third resistor and a capacitor to receive the input AC signal across both ends thereof, and a differential amplifier to amplify by a predetermined amplification factor the difference in potential between the junction of the first and second resistors in the first series circuit and the junction of the third resistor and the capacitor in the second series circuit. The phase shift circuits are connected in a cascade manner. A front stage of the pair of phase shift circuits is configured to receive the output from the summing circuit and to receive the feedback signal from the subsequent stage of the phase shift circuits through the feedback impedance. A tuned signal is derived from the output of either one of the phase shift circuits.

Also, the tuned amplifier according to the present invention comprises an input impedance element to apply an input signal to an input end, a feedback impedance element to apply a feedback signal to the input end, a summing circuit to add the input signal and feedback signal, a pair of phase shift circuits each comprising a first series circuit of first and second resistors of substantially equal resistance to receive an input AC signal across both ends thereof, a second series circuit of a third resistor and a capacitor to receive the input AC signal across both ends thereof, a differential amplifier for amplifying by a predetermined amplification factor the difference in potential at the junction of the first and second resistors in the first series circuit and the junction of the third resistor and the capacitor in the second series circuit, and a non-inverting circuit to output the input AC signal without altering the phase. The pair of phase shift circuits and the non-inverting circuit are connected in a cascade manner. The added signal from the summing circuit is applied as an input to a first stage of the cascade connected circuits. The output from a final stage is applied to the input end as the feedback signal by way of the feedback impedance element. A tuned signal is derived as an output from either one of the cascade connected circuits.

The tuned amplifier according to the present invention comprises a summing amplifier to add an input signal applied thereto by way of an input impedance element and a feedback signal applied thereto by way of a feedback impedance, and a pair of phase shift circuits, each comprising a first series circuit having first and second resistors of substantially equal resistance to receive an input AC signal applied across both ends thereof and a second series circuit of a third resistor and an inductor, and a differential amplifier for amplifying by a predetermined amplification factor the difference in potential at the junction point of the first and second resistors of the first series circuit and the junction point of the third resistor and the inductor of the second series circuit. The two phase shift circuits are connected in a cascade manner with the phase shift circuit in the front stage receiving the summed signal from the summing circuit and the output from the final stage of the phase shift circuit being applied to the input end by way of the feedback signal feedback impedance element. A tuned output signal is derived from the output of either one of the two phase shift circuits. The tuned amplifier according to another embodiment of the present invention comprises a summing circuit for summing an input signal applied thereto by way of an input impedance element and a feedback signal applied thereto by way of a feedback impedance element, a pair of phase shift circuits each comprising a first series circuit of first and second resistors of substantially equal resistance and a second series circuit of a third resistor and an inductor both receiving an input AC signal across both ends, and a non-inverting circuit to output the input AC signal without altering the phase. The pair of phase shift circuits and the non-inverting circuit are connected in a cascade manner with the summed output signal from the summing circuit applied to the first stage of the plurality of circuits and feeding the output from the subsequent stage to the input end as the feedback signal by way of the feedback impedance element. The tuned output signal is derived from any one of the plurality of circuits.

The tuned amplifier of the present invention comprises a summing circuit to add an input signal applied to an input end by way of an input impedance element and a feedback signal applied to the input end by way of feedback impedance element, a first phase shift circuit including a first series circuit of first and second resistors having substantially equal resistance and receiving an input AC signal across both ends thereof, a second series circuit of a third resistor and a capacitor and a differential amplifier for amplifying by a predetermined amplification factor the difference in potential at the junction point of the first and second resistors in the first series circuit and the junction point of the third resistor and the capacitor, and a second phase shift circuit including a first series circuit of first and second resistors of substantially equal resistance, a second series circuit of a third resistor and an inductor, both receiving an input AC signal across both ends thereof, and a differential amplifier for amplifying by the predetermined amplification factor the difference in potential at the junction point of the first and second resistors in the first series circuit and the junction point of the third resistor and the inductor in the second series circuit. The first and the second phase shift circuits are connected in cascade manner with the input stage of the phase shift circuit receiving the summed output signal from the summing circuit while the output stage of the phase shift circuits supplying the feedback signal to one end of the feedback impedance element. The tuned output signal is derived from either one of the first and the second phase shift circuits.

The tuned amplifier of the present invention comprises a summing circuit to add an input signal applied to one end of an input impedance element and a feedback signal applied to one end of a feedback impedance element, a first phase shift circuit including a first series circuit of first and second resistors of substantially equal resistance and a second series circuit of a third resistor and a capacitor, both receiving an input AC signal across both ends thereof, and a differential amplifier for amplifying by the predetermined amplification factor the difference in potential at the junction point of the first and the second resistors in the first series circuit and the junction point of the third resistor and the capacitor in the second series circuit, a second phase shift circuit including a first series circuit of first and second resistors of substantially equal resistance and a second series circuit of a third resistor and an inductor, both receiving an input AC signal across both ends thereof, and a differential amplifier for amplifying by the predetermined amplification factor the difference in potential at the junction point of the first and the second resistors in the first series circuit and the junction point of the third resistor and the inductor in the second series circuit, and a non-inverting circuit to output the input AC signal without altering the phase. The first and the second phase shift circuits and the non-inverting circuit are connected in a cascade manner. The summed output signal from the summing circuit is applied to the input stage of the cascade connected circuits and the output from the first stage is applied to the other end of the feedback impedance element as the feedback signal. The tuned output signal is derived from the output of either one of the plurality of circuits.

Each of the above-mentioned tuned amplifiers features a pair of phase shift circuits or a pair of phase shift circuits and a non-inverting circuit to provide 0 overall phase shift and the unity loop gain of the entire circuits to provide the tuned operation.

Also, the tuned amplifier of the present invention comprises a summing circuit to add an input signal applied to one end of an input impedance element and a feedback signal applied to one end of a feedback impedance element, a pair of phase shift circuits including a first series circuit of first and second resistors of substantially equal resistance and a second series circuit of a third resistor and a capacitor, both receiving an input AC signal across both ends thereof, and a differential amplifier for amplifying by the predetermined amplification factor the difference in potential at the junction point of the first and the second resistors in the first series circuit and the junction point of the third resistor and the capacitor in the second series circuit, and an inverting circuit to output the input AC signal without altering the phase. The pair of phase shift circuits and the inverting circuit are connected in a cascade manner. The output from the summing circuit is applied to the input stage of the cascade connected plural circuits while the output from the final stage circuit is applied to the other end of the feedback impedance element as the feedback signal. The tuned output signal is derived from the output of either one of the plural circuits.

The tuned amplifier of the present invention comprises a summing circuit to add an input signal applied to one end of an input impedance element and a feedback signal applied to one end of a feedback impedance element, a pair of phase shift circuits each including a first series circuit of first and second resistors of substantially equal resistance and a second series circuit of a third resistor and an inductor, both receiving an input signal across both ends thereof, and a differential amplifier for amplifying by the predetermined amplification factor the potential difference at the junction point of the first and the second resistors in the first series circuit and the junction point of the third resistor and the inductor in the second series circuit, and an inverter circuit to output the input AC signal with inverted phase. The pair of phase shift circuits and the inverter circuit are connected in a cascade manner with the summed output from the summing circuit applied to the first stage of the cascade connected circuits and the output of the final stage applied to the other end of the feedback impedance element as the feedback signal. A tuned output signal is derived from either one of the cascade connected circuits.

Another tuned amplifier of the present invention comprises a summing circuit to add an input signal applied to one end of an input impedance element and a feedback signal applied to one end of a feedback impedance element, a first phase shift circuit including a first series circuit of first and second resistors of substantially equal resistance and a second series circuit of a third resistor and a capacitor, both receiving an input AC signal across both ends thereof, and a differential amplifier for amplifying by the predetermined amplification factor the potential difference at the junction point of the first and second resistors in the first series circuit and the junction point of the third resistor and the capacitor in the second series circuit, a second phase shift circuit including a first series circuit of first and second resistors of substantially equal resistance and a second series circuit of a third resistor and an inductor, both receiving an input AC signal across both ends thereof, and a differential amplifier for amplifying by the predetermined amplification factor the potential difference at the junction point of the first and second resistors in the first series circuit and the junction point of the third resistor and the inductor in the second series circuit, and an inverter circuit to output the input AC signal with inverted phase. The first and second phase shift circuits and the inverter circuit are connected in a cascade manner. The summed output from the summing circuit is applied to the first stage of the cascade connected circuits while the output from the final stage is applied to the one end of the feedback impedance element as the feedback signal. A tuned output signal is derived from either one of the cascade connected circuits.

Either one of the foregoing tuned amplifier is configured to provide the net 0 overall phase shift of the two phase shift circuits and the inverter circuit and substantially unity loop gain by adjusting the amplification factor of each circuit, thereby performing a tuned operation.

BEST MODES TO IMPLEMENT THE INVENTION

1st Embodiment

Figure 1:
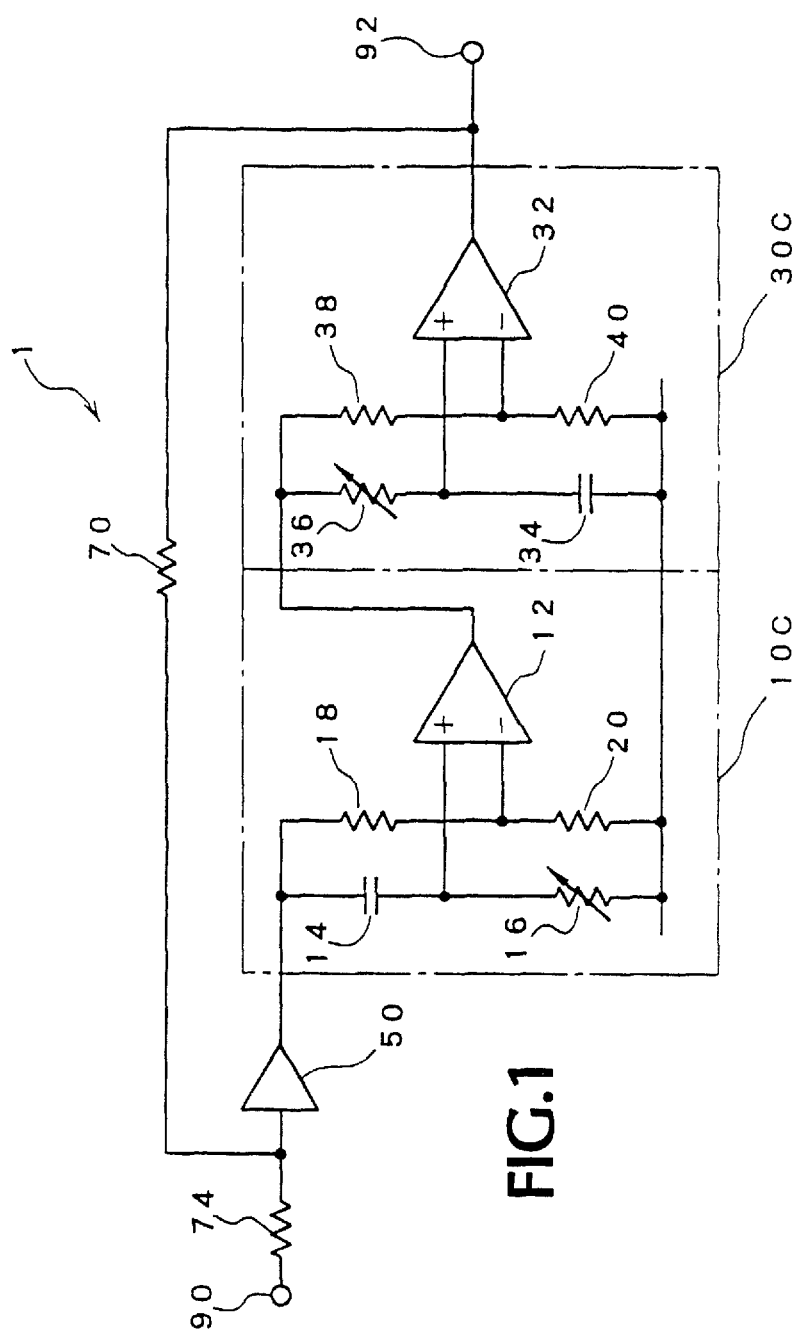
FIG. 1 is a circuit schematic of a first embodiment of a tuned amplifier according to the present invention.

FIG. 1 shows a circuit schematic of a first embodiment of the tuned amplifier. The tuned amplifier 1 as shown in FIG. 1 comprises a non-inverting circuit 50 to output an input signal without altering its phase, a pair of phase shift circuits 10C, 30C each shifting the phase of an input thereto by a predetermined amount so as to provide the 0° overall phase shift at a predetermined frequency, and a summing circuit to add by a predetermined ratio an input signal applied from an input terminal 90 by way of an input resistor 74 and a signal (feedback signal) from the subsequent phase shift circuit 30C applied by way of a feedback resistor 70 (where the resistance of the input resistor 74 is chosen to be n times of that of the feedback resistor 70). It is to be noted that the non-inverting circuit 50 acts as a buffer circuit but may be eliminated because it is not essential to the basic operation of the tuned amplifier.

Figure 2:
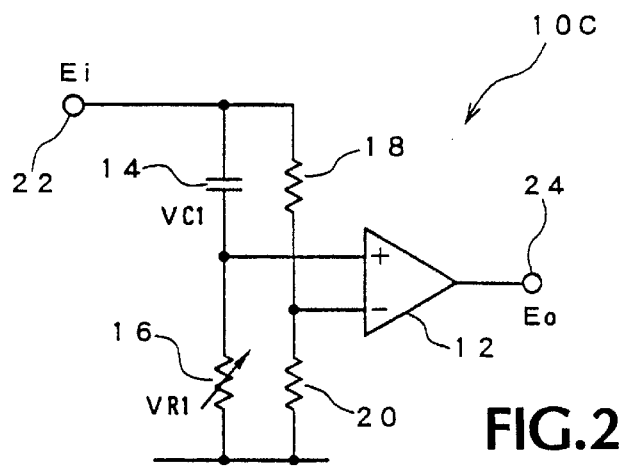
FIG. 2 is a circuit schematic of a front stage of the phase shift circuits in FIG. 1.

Shown in FIG. 2 is a circuit schematic of only the front stage phase shift circuit 10C in FIG. 1. The phase shift circuit 10C comprises a differential amplifier 12 to amplify the voltage difference between the 2 input terminals by a given amplification factor (e.g., about 2), a capacitor 14 and a variable resistor 16 to apply the input signal to the input terminal 22 with a certain phase shift, and an voltage divider circuit of resistors 18, 20 to divide the input signal into about one half (½) without introducing phase shift before being applied to the inverting input of the differential amplifier 12. It is to be noted that the junction point of the variable resistor 16 and the resistor 20 is connected to ground in the following description.

When an AC signal is applied to an input terminal 22 of the phase shift circuit 10C as configured above, a voltage equal to the input voltage Ei applied to the input terminal 22 divided by the resistors 18, 20 is applied to the inverting input terminal of the differential amplifier 12. Since the resistors 18, 20 are chosen to have substantially equal resistance, the input voltage Ei is divided to about one-half (Ei/2) by the divider formed by a series circuit of these resistors 18, 20 before being applied to the inverting input terminal of the differential amplifier 12.

On the other hand, the voltage appearing on the junction point of the capacitor 14 and the variable resistor 16 is applied to the non-inverting input terminal of the differential amplifier 12. Since the input voltage Ei is applied to one end of a CR circuit (series circuit)of the capacitor 14 and the variable resistor 16, the voltage to be applied to the non-inverting input terminal of the differential amplifier 12 encounters a predetermined phase shift by the CR circuit.

Accordingly, the differential amplifier 12 amplifies the voltage difference between the voltages applied to the 2 input terminals by a predetermined amplification factor, for example, about 2.

Figure 3:
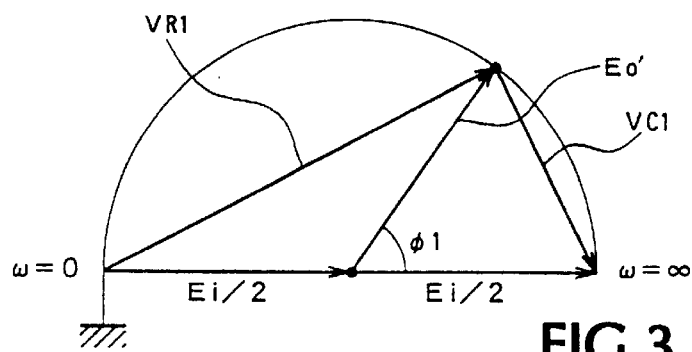
FIG. 3 is a vector diagram to illustrate the relationship between input and output voltages and the voltage across the capacitor in the phase shift circuit in FIG. 2.

Illustrated in FIG. 3 is a vector diagram of the input and output voltages to the phase shift circuit 10C and also the voltage across the resistor and the capacitor.

As illustrated in FIG. 3, the voltage VR1 across the variable resistor 16 and the voltage VC1 across the capacitor 14 are out of phase by 90 degrees from each other. Vector combination (addition)of these voltages VR1, VC1 is equal to the input voltage Ei, As a result, when the input signal is constant in amplitude but varies in frequency, the voltage VR1 across the variable resistor 16 and the voltage VC1 across the capacitor 14 vary along the circumference of a semi-circle as illustrated in FIG. 3.

Also, vector subtraction of the voltage(VR1 across the variable resistor 16)to be applied to the non-inverting input terminal of the differential amplifier 12 from the voltage (Ei/2 across the resistor 20) represents the voltage difference Eo'. The voltage difference Eo' can be illustrated by the vector starting at the center of the semi-circle and ending at the circumference of the semi-circle at the cross point of the voltages VR1 and VC1. The magnitude is equal to the radius or Ei/2 of the semi-circle. In fact, however, the differential amplifier 12 amplifies the voltage difference Eo' by the factor of 2, thereby providing the output voltage Eo=Eo'× 2=Ei. As a result, the phase shift circuit 10C of the above embodiment equalizes the output voltage to the input voltage in amplitude, thereby causing no signal attenuation between the input and output signals.

Also, as apparent from FIG. 3, the voltages VR1 and VC1 cross at right angle with each other on the circumference of circle. The phase difference between the input voltage Ei and the voltage VR1 varies from 90° to 0° when the frequency ω is varies from 0 to ∞. And the phase shift φ of the entire phase shift circuit 10C is twice as large as the above phase shift, thereby varying from 180° to 0° depending on the frequency.

Now, the relationship between the input and output voltages will be verified quantitatively.

Figure 4:
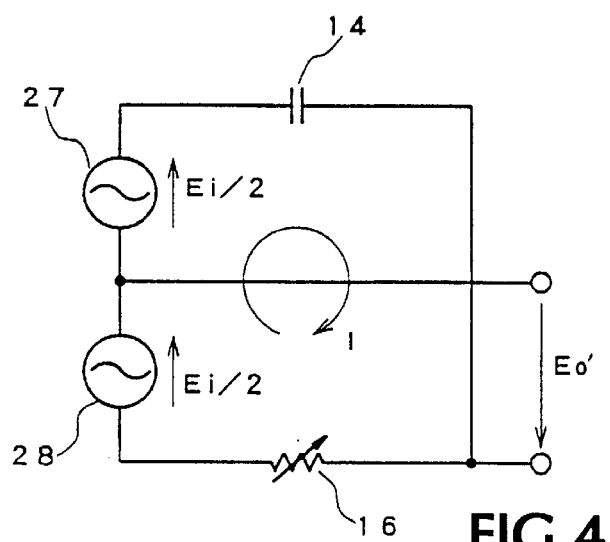
FIG. 4 is an equivalent circuit schematic of the phase shift circuit in FIG. 2.

Shown in FIG. 4 is an equivalent circuit of the front stage of the phase shift circuit 10C. This corresponds to the two series circuits at the input side of the differential amplifier 12.

Since the input voltage Ei is applied across the series circuit of the resistors 18 and 20, a voltage equal to one-half of the input voltage Ei, i.e., Ei/2 is applied across each of the resistors 18, 20 which is replaced by a pair of voltage sources 27, 28 each generating Ei/2. At this time, the current I flowing through the closed loop of the equivalent circuit in FIG. 4 is given by the following expression (1):

$$I = \frac{Ei}{R + \frac{1}{Cs}} = \frac{Cs}{1 + CRs} \cdot Ei \qquad (1)$$

Where, C and Rs represent the capacitance of the capacitor 14 and the resistance of the variable resistor 16, respectively. The potential difference Eo' between the two points in FIG. 4 is given by the following expression (2):

$$Eo' = I \times R - \frac{1}{2} Ei \qquad (2)$$

Now, substitution of the expression (2) into the expression (1) derives the following expression (3):

$$Eo' = \frac{CRs}{1 + CRs} Ei - \frac{1}{2} Ei = -\frac{1 - CRs}{2(1 + CRs)} Ei \qquad (3)$$

The output voltage Eo from the phase shift circuit 10C of this embodiment is twice as large as the above potential difference Eo' and thus given by the following expression (4):

$$Eo = 2 \times Eo' = -\frac{1 - CRs}{1 + ERs} Ei = -\frac{1 - Ts}{1 + Ts} Ei \qquad (4)$$

Where, the time constant of the CR circuit comprising the capacitor 14 and the variable resistor 16 is set to Ts(=CR).

In the expression (4), S is replaced by jω to obtain the following expression (5):

$$\begin{aligned} Eo &= -\frac{1 - j\omega T}{1 + j\omega T} Ei = \frac{(1 - j\omega T)^2}{1 + (\omega T)^2} Ei \\ &= -\frac{1 - (\omega T)^2 - j2\omega T}{1 + (\omega T)^2} Ei \end{aligned} \qquad (5)$$

Now, the absolute value of the output voltage Eo (i.e.,|Eo|) is given by the following expression (6):

$$\begin{aligned} |Eo| &= \frac{\sqrt{\{1 - (\omega T)^2\}^2 + 4(\omega T)^2}}{1 + (\omega T)^2} Ei \\ &= \frac{\sqrt{1 + 2(\omega T)^2 + (\omega T)^2}}{1 + (\omega T)^2} Ei = Ei \end{aligned} \qquad (6)$$

The expression (6) means that the amplitude of the output signal in the phase shift circuit 10C of this embodiment remains constant and is equal to that of the input signal regardless of the rotation in phase angle between the input and output signals.

Now, according to the expression (5), the phase shift φ 1 of the output signal Eo with respect to the input signal Ei is given by the following expression (7):

$$\phi 1 = \tan^{-1} \left\{ \frac{2\omega T}{(\omega T)^2 - 1} \right\} \qquad (7)$$

The expression (7) indicates that the phase shift φ 1 for example at the frequency where ω is substantially equal to 1/T(=1/(CR)) is about 90°. This means that only phase can be shifted by 90° without causing any attenuation of the input signal. Additionally, the frequency ω can be varied to achieve the phase shift φ 1 of substantially 90° by varying the resistance R of the variable resistor 16.

Figure 5:
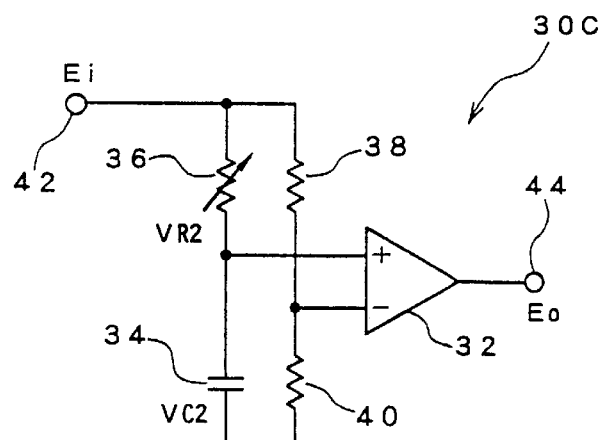
FIG. 5 is a circuit schematic of the rear stage of the phase shift circuits in FIG. 1.

Illustrated in FIG. 5 is a circuit diagram of the rear stage of the phase shift circuit 30C in FIG. 1. The phase shift circuit 30C comprises a differential amplifier 32 to output the voltage difference between the two input terminals by a given amplification factor (e.g., about 2), a variable resistor 36 and a capacitor 34 to apply to the non-inverting input terminal of the differential amplifier 32 the input signal applied to the input terminal 42 after shifting the phase, and a voltage divider circuit including resistors 38, 40 to divide the input signal applied to the input terminal 42 by about one-half (½) for application to the inverting input terminal of the differential amplifier 32 without causing any phase shift.

In the phase shift circuit 30C of the above configuration, when an AC signal is applied to the input terminal 42, applied to the inverting input terminal of the differential amplifier 32 is the input voltage (Ei) applied to the input terminal 42 and divided by the resistors 38, 40. Since the resistance of the both resistors 38, 40 is chosen substantially equal to each other, the input voltage Ei is divided into about one half (Ei/2) by the divider comprising the two resistors 38, 40 before being applied to the inverting input terminal of the differential amplifier 32.

On the other hand, applied to the non-inverting input terminal of the differential amplifier 32 is the signal appearing on the junction point of the variable resistor 36 and the capacitor 34 to which the input signal is applied at the input terminal 42. Since the input signal is applied to one end of the CR circuit (series circuit) of the variable resistor 36 and the capacitor 34, the input signal experiences phase shift by the CR circuit before being applied to the non-inverting input terminal of the differential amplifier 32.

As a result, the differential amplifier 32 amplifiers the voltage difference between the two input terminals by the predetermined amplification factor of, for example, about 2.

Figure 6:
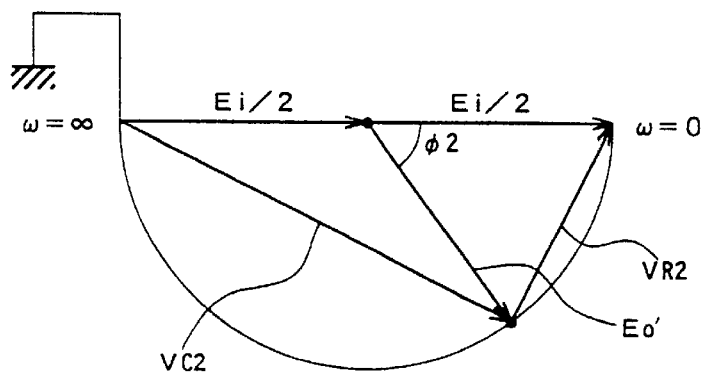
FIG. 6 is a vector diagram of input and output voltages and the voltage across the capacitor of the phase shift circuit in FIG. 5.

Illustrated in FIG. 6 is a vector diagram of the input and output voltages and the voltage across the capacitor in the phase shift circuit 30C.

As illustrated in FIG 6, the voltage VC2 across the capacitor 34 and the voltage VR2 across the variable resistor 36 are out of phase by 90° with each other. Vector summation of these two voltages provides the input voltage Ei. As a result, when the input signal frequency is varied while maintaining its amplitude constant, the voltage VC2 across the capacitor 34 and the voltage across VR2 vary along the circumference of a semicircle as shown in FIG. 6.

Vector subtraction of the voltage (VC2 across the capacitor 34) to be applied to the non-inverting input terminal of the differential amplifier 32 and the voltage (Ei/2 across the resistor 40) to be applied to the inverting input terminal thereof is the voltage difference Eo'. The voltage difference Eo' is represented by the vector starting from the center of the semicircle in FIG. 6 and ending at the cross-point of the voltages VC2 and VR2 on the circumference. Its amplitude is equal to the radius Ei/2 of the semicircle. In fact, the differential amplifier 32 amplifies the voltage difference Eo' by the factor of 2, This leads to the conclusion that the output signal from the phase shift circuit 30C of the above embodiment is equal in amplitude to that of the input signal, thereby causing no signal attenuation between the input and output signals.

Also, as apparent from FIG. 6, the voltages VC2 and VR2 cross at a right angle on the circumference and the phase difference between the input voltage Ei and the voltage VC2 varies from 0° to 90° when the frequency ω varies from 0 to ∞. Since the phase shift φ 2 of the entire phase shift circuit 30C is twice as large as the above, the entire phase shift is from 0° to 180° depending on the frequency. Now, quantitative consideration is made on the relationship between the above mentioned input and output voltages.

Figure 7:
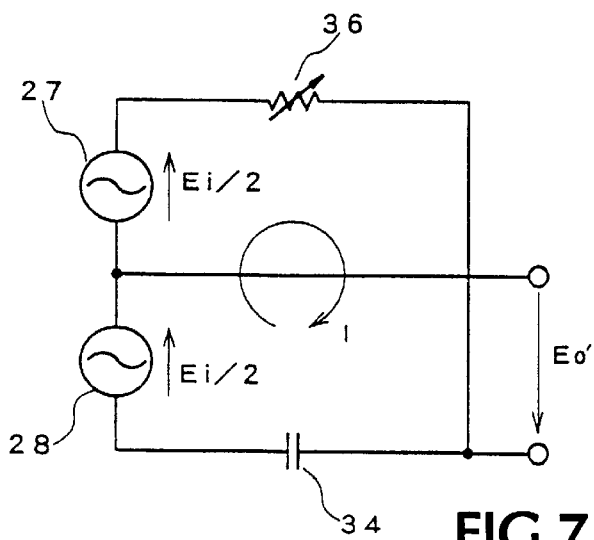
FIG. 7 is an equivalent circuit schematic of the phase shift circuit in FIG. 5.

Shown in FIG. 7 is an equivalent circuit of the subsequent stage phase shift circuit 30C, illustrating the configuration corresponding to the two series circuits at the input side of the differential amplifier 32.

Applied across the series circuit of the resistors 38, 40 is the input voltage Ei. Similar to the case in the front stage phase shift circuit 10C, the resistors 38, 40 are replaced by two voltage sources 27, 28 each generating Ei/2. Then, the current I flowing through the closed loop of the equivalent circuit in FIG. 7 is given by the above expression (1) when the resistance of the variable resistor 36 and the capacitance of the capacitor 34 are represented by R and C, respectively.

Now, the potential difference Eo' between the two points in FIG. 7 is given by the following expression (8):

$$Eo' = \frac{1}{Cs} - \frac{1}{2} Ei \qquad (8)$$

Now, the following expression (9) is derived by incorporating the expression (1) with the expression (8):

$$Eo' = \frac{1}{1 + CRs} Ei - \frac{1}{2} Ei = \frac{1 - CRs}{2(1 + CRs)} Ei \qquad (9)$$

The output voltage Eo from the phase shift circuit of this embodiment is obtained by doubling the above voltage difference Eo' and is given by the following expression (10):

$$Eo = 2 \times Eo' = \frac{1 - CRs}{1 + CRs} Ei = \frac{1 - Ts}{1 + Ts} Ei \qquad (10)$$

As in the case of the phase shift circuit 10C, the time constant of the capacitor 34 and the variable resistor 36 is represented by T(=CR).

By representing s=jω in the above expression (10), you will get the following expression (11):

$$\begin{aligned} Eo &= \frac{1 - j\omega T}{1 + j\omega T} Ei = \frac{(1 - j\omega T)^2}{1 + (\omega T)^2} Ei \\ &= \frac{1 - (\omega T)^2 - j \cdot 2\omega T}{1 + (\omega T)^2} Ei \end{aligned} \qquad (11)$$

You will recognize that the above expressions (10) and (11) are different from the expressions (4) and (5) only in sign. As a result, the above expression (6) applies to the absolute value of the output voltage Eo without any modification. The amplitude of the output signal is equal to that of the input signal and remains constant regardless of any rotation in phase of the input and output signals in the subsequent stage phase shift circuit 30C.

Now, the above expression (11) is used to calculate the phase shift φ 2 of the output voltage Eo with respect to the input voltage Ei, which is given by the following expression (12):

$$\phi 2 = \tan^{-1}\left\{ \frac{2\omega T}{(\omega T)^2 - 1} \right\} \qquad (12)$$

The expression (12) indicates that the phase shift φ 2 is about 90° at the frequency ω is substantially equal to 1/T(=1/(CR)) without attenuating the amplitude of the input signal. Also, frequency ω can be varied so that the phase shift φ 2 is about 90° by varying the resistance R of the variable resistor 36.

As described hereinbefore, phase can be shifted by a predetermined angle in each of the two phase shift circuits 10C, 30C. Also, as shown in FIG. 3 and 6, the relative phase between the input and output signals is opposite to each other in the phase shift circuits 10C, 30C. The output signal is derived at a certain frequency where the overall phase shift of the two phase shift circuits 10C, 30C is 0°.

Note that the output from the subsequent stage phase shift circuit 30C is fed back to the input of the non-inverting amplifier 50 at the front stage of the phase shift circuit 10C by way of the feedback resistor 70. The feedback signal is added to the input signal applied thereto by way of the input resistor 74. The added signal is fed to the input terminal (input terminal 22 in FIG. 2) of the phase shift circuit 10C by way of the non-inverting amplifier 50 acting as a buffer circuit.

By forming such feedback loop, the phase shift of the signal around the feedback loop becomes 0° at a certain frequency. A tuned operation is achieved by adjusting amplification factors of the non-inverting circuit 50 and the two phase shift circuits 10C, 30C so that the overall loop gain of the tuned amplifier is substantially unity.

Figure 8:
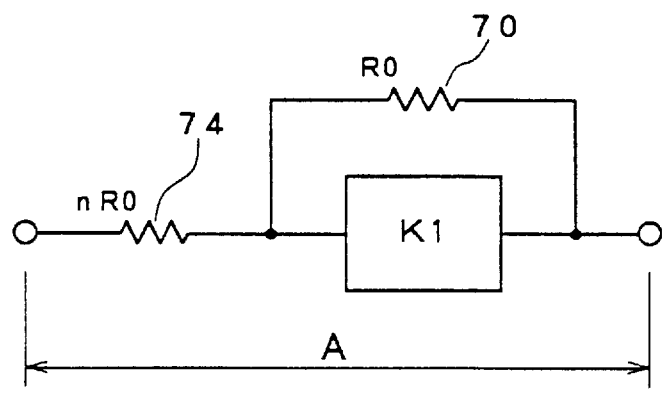
FIG. 8 is a circuit schematic of the tuned amplifier of the present invention using the transfer function K1.
Figure 9:
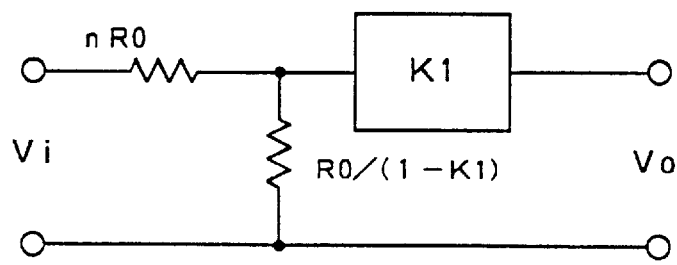
FIG. 9 is a circuit schematic of the circuit in FIG. 8 converted by using the Miller's principle.

FIG. 8 is a circuit including the above two phase shift circuits 10C, 30C and the non-inverting circuit 50 represented by the transfer function K1. Connected in parallel to the circuit having the transfer function K1 are a feedback resistor 70 having resistance Ro and a series input resistor 74 which has resistance n times of the feedback resistor 70 (nRo). Shown in FIG. 9 is a circuit in FIG. 8 converted in accordance with the Miller's constant. The overall transfer function A after conversion is given by the following expression (13)

$$A = \frac{Vo}{Vi} = \frac{K1}{n(1 - K1) + 1} \quad (13)$$

Now, as apparent from the above expression (4), the transfer function K2 of the front stage phase shift circuit 10C is given by the following expression (14):

$$K2 = -\frac{1 - Ts}{1 + Ts} \quad (14)$$

As apparent from the above expression (10), the transfer function K3 of the back stage phase shift circuit 30C is given by the following expression (15):

$$K3 = \frac{1 - Ts}{1 + Ts} \quad (15)$$

Accordingly, the overall transfer function K1 of the cascade connected phase shift circuits 10C, 30C are given by the following expression (16):

$$K1 = -\frac{(1 - Ts)^2}{(1 + Ts)^2} = -\frac{1 + (Ts)^2 - 2Ts}{1 + (Ts)^2 + 2Ts} \quad (16)$$

By incorporating the above expression (13) with the above expression (16), the following expression (17) is derived:

$$A = -\frac{1 + (Ts)^2 - 2Ts}{(2n + 1)\{1 - (Ts)^2\} + 2Ts}$$

$$= -\frac{1}{2n + 1} \cdot \frac{1 + (Ts)^2 - 2Ts}{1 - (Ts)^2 + \frac{2Ts}{2n + 1}} \quad (17)$$

Figure 10:
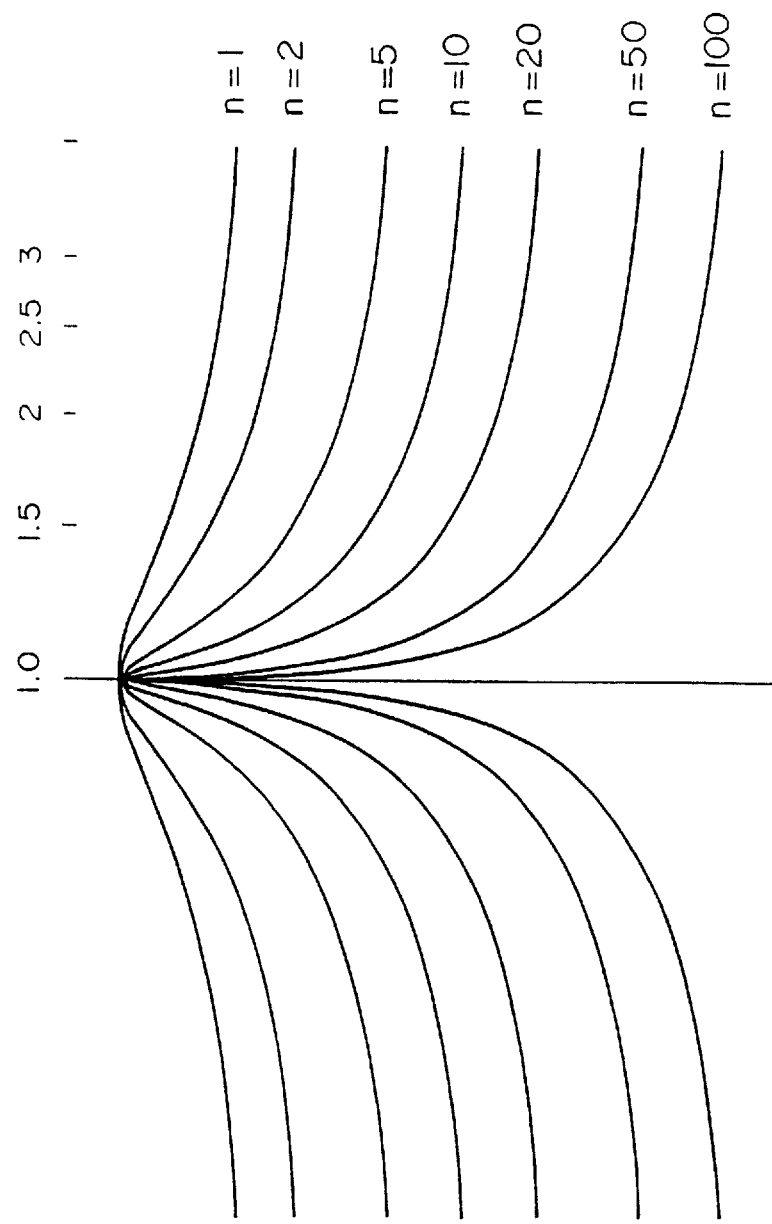
FIG. 10 is a characteristic curve showing the relationship between the resistance ratio of the input and feedback resistors and the maximum attention of the tuned amplifier in FIG. 1.

According to the expression (17), A=−1/(2n+1) when ω=0 (DC domain). This provides the maximum attenuation. Also, the maximum attenuation is obtained when ω=∞. Additionally, when =1/T or at the tuned frequency, A=1 and is not a function of the resistance ratio n of the feedback resistor 70 and the input resistor 74. (Note that if the time constants of the two phase shift circuits 10C, 30C are T1, T2 and different from each other, ω=1/√(T1·T2) is the tuned frequency.) In other words, as illustrated in FIG. 10, the tuned frequency and the attenuation at the tuned frequency remain unchanged.

As described above, the tuned amplifier 1 of the present embodiment provides constant tuned frequency and the gain at the tuned frequency regardless of the resistance ratio n between the feedback resistor 70 and the input resistor 74. Only the maximum attenuation varies. On the contrary, since the maximum attenuation depends on the resistance ratio n as mentioned above, there is no influence in the maximum attenuation even if the tuned frequency is changed by varying the resistance of the resistor 16 or 36 in the phase shift circuits 10C, 30C. This means that the tuned frequency, the gain at the tuned frequency and the maximum attenuation can be adjusted without interaction therebetween.

Also, it is to be noted that the tuned amplifier 1 in this embodiment comprises a combination of differential amplifiers, capacitors and resistors, thereby enabling to implement on a semiconductor substrate. This means that the entire tuned amplifier 1 having adjustable tuned frequency and maximum attenuation can be implemented as an integrated circuit on a semiconductor substrate.

It is to be noted that the phase shift circuits 10C and 30C are located respectively at the front and subsequent stages in the first embodiment. However, the phase shift circuits 10C, 30C can be interchanged to implement the tuned amplifier because there is no different in operation so long as the overall phase shift between the input and output signals of the entire circuit is 0°.

2nd Embodiment

Figure 11:
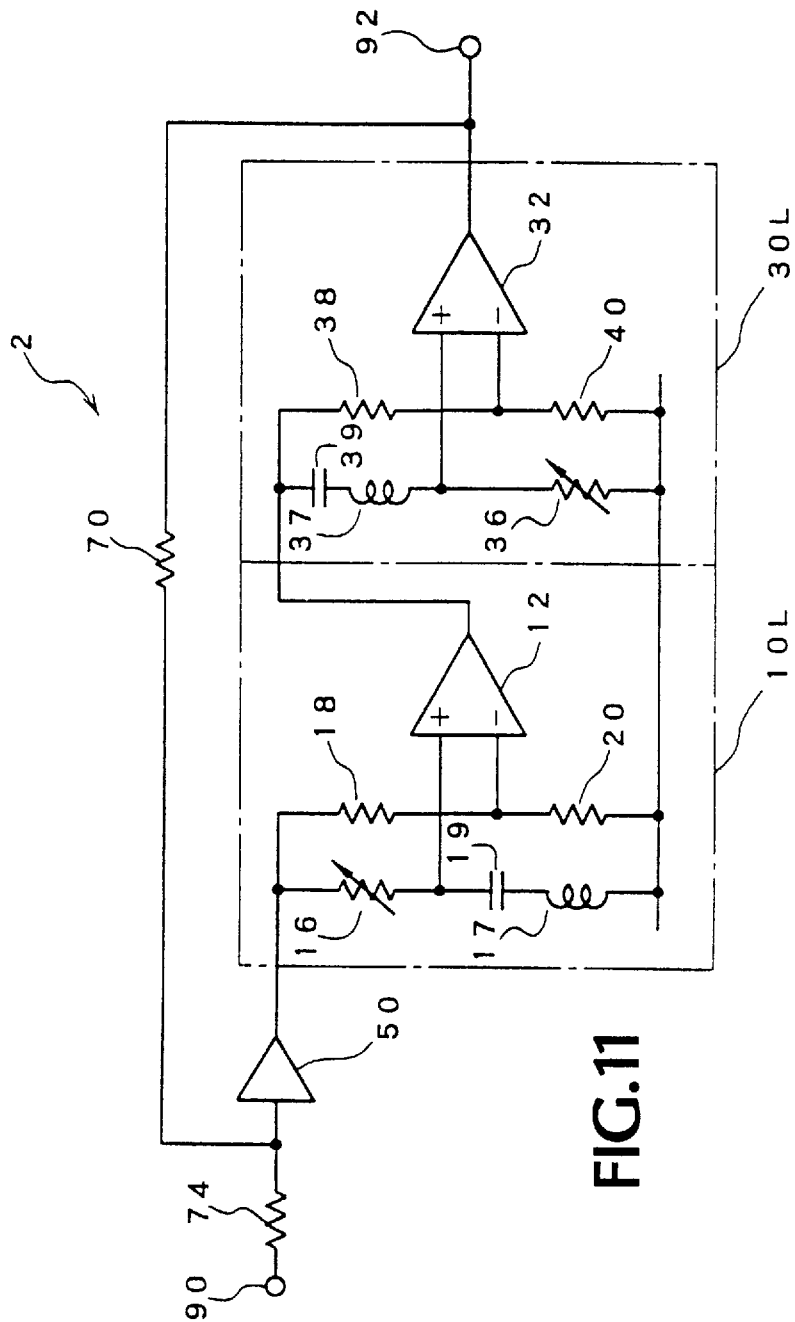
FIG. 11 is a circuit schematic of a second embodiment of the tuned amplifier according to the present invention.

Ilustrated in FIG. 11 is a circuit schematic of a second embodiment of the tuned amplifier according to the present invention. The tuned amplifier 2 comprises a non-inverting circuit 50 to output the input signal without altering its phase, a pair of phase shift circuits 10L, 30L to cause a predetermined phase shift of the input signal thereto with the overall phase shift being 0° at a given frequency, and a summing circuit including a feedback resistor 70 and an input resistor 74 (having resistance equal to n times of thatof the feedback resistor 70)for adding the signal (input signal) applied to an input terminal 90 and the output signal (feedback signal) from the subsequent stage phase shift circuit 30L by way of the feedback resistor 70. It is to be noted here that the non-inverting circuit 50 acts as a buffer circuit. However, it may be eliminated in the fundamental operation of the tuned amplifier.

Figure 12:
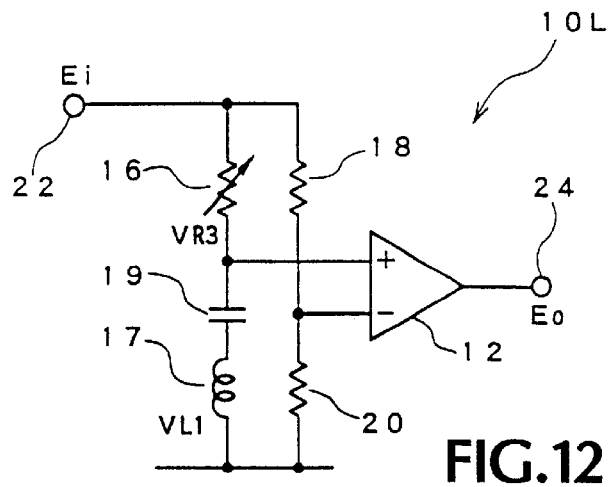
FIG. 12 is circuit schematics of the front stage phase shift circuit in FIG. 11.

Now, FIG. 12 shows a circuit schematic of only the front stage phase shift circuit 10L in FIG. 11. The phase shift circuit 10L comprises a differential amplifier 12 to amplify the voltage difference between the two input terminals by a predetermined amplification factor (e.g., about 2), a variable resistor 16 and an inductor 17 to apply the input signal on the input terminal 22 to the non-inverting input terminal of the differential amplifier 12 by introducing a given phase shift, a voltage divider including resistors 18, 20 to apply the input signal on the input terminal 22 by dividing into ½ without shifting the phase.

A capacitor 19 interposed between the inductor 17 and the variable resistor 16 is used for DC blocking purpose and has a large capacitance to provide a negligible small impedance at the operating frequency. Now, the following description is made on a case where the common junction of the inductor 17 and the resistor 20 is grounded.

When a given AC signal is applied to the input terminal 22 of the phase shift circuit 10L as constructed above, applied to the inverting input terminal of the differential amplifier 12 is the voltage equal to the input voltage(Ei) applied to the input terminal 22 divided by the voltage divider of the resistors 18, 20. Note that the resistors 18, 20 are chosen to have substantially equal resistance, thereby applying to the inverting input terminal of the differential amplifier 12 about one half of the input voltage, or Ei/2 by divider circuit of a series connection of the resistors 18, 20.

On the other hand, applied to the non-inverting input terminal of the differential amplifier 12 is the voltage appearing on the junction of the variable resistor 16 and the inductor 17 more accurately the junction point of the variable resistor 16 and capacitor 19 connected in series with the inductor 17. However, since the DC blocking capacitor 19 does not cause any influence in the operation and thus can be neglected as mentioned above. The input signal Ei is applied to one end of the LR (series) circuit of the variable resistor 16 and the inductor 17 to cause a predetermined phase shift of the input signal before being applied to the non-inverting input terminal of the differential amplifier 12.

The differential amplifier 12 amplifies the voltage difference between the two input terminals by the amplification factor of about 2.

Figure 13:
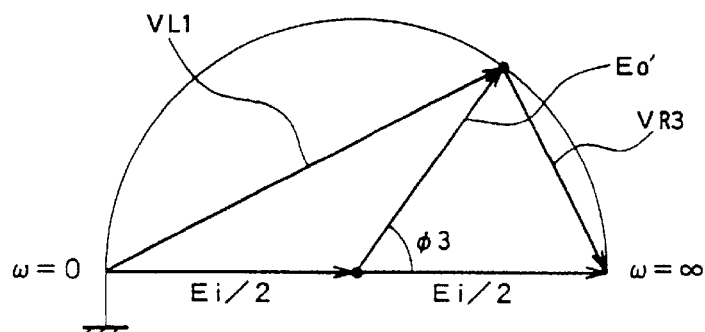
FIG. 13 is a vector diagram showing the relationship between the input and output voltages and the voltage across the inductor in the phase shift circuit in FIG. 12.

Illustrated in FIG. 13 is a vector diagram of the relationship between the input and output voltage of the phase shift circuit 10L and the voltage across the inductor 17. The voltage VL1 across the inductor 17 and the voltage VR3 across the variable resistor 16 are out of phase by 90° with each other. A vector addition of these voltages is equal to the input voltage Ei. Accordingly, as the input signal frequency changes while maintaining the amplitude constant, the voltage VL1 across the inductor 17 and the voltage VR3 across the variable resistor 16 vary along the circumference of the semi-circle as shown in FIG. 13.

Now, the voltage difference Eo' to be applied to the differential amplifier 12 is the vector subtraction of the voltage VL1 across the inductor 17 to be applied to the non-inverting input terminal and the voltage Ei/2 across the tesisitor 20 to be applied to the inverting input terminal. The voltage difference Eo' is represented by the vector in the semi-circle of FIG. 13 staring from the center of the semi-circle and terminating at one point on the circumference where the voltage VL1 and VR3 cross and the magnitude or the amplitude is equal to the radius Ei/2 of the semi-circle. In fact, the voltage difference Eo' to the differential amplifier 12 is amplified by the differential amplifier 12 by the factor of two (2), thereby providing the output voltage Eo=Eo'× 2=Ei. As a result, the input and output signals of the phase shift circuit 10L in this embodiment are equal to each other in amplitude, thereby causing no attenuation between the input and output signals.

Also, as apparent from FIG. 13, the voltage VL1 and VR3 cross on the circumference at right angle with each other. The phase angle between the input voltage Ei and the voltage VL1 varies from 90° to 0° as the frequency ω changes from 0 to ∞. It is to be noted that the phase shift φ 3 of the entire phase shift circuit 10L is equal to twice as large as the above phase shift, thereby varying from 180° to 0° depending on the frequency.

Figure 14:
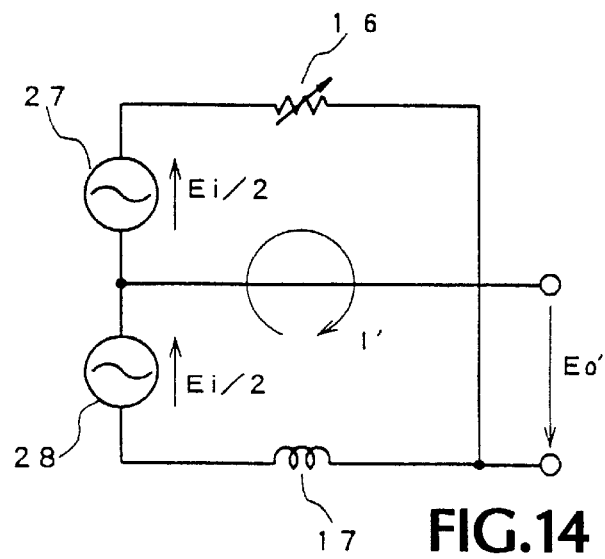
FIG. 14 is an equivalent circuit diagram of the phase shift circuit in FIG. 12.

Now, a quantitative study of the above mentioned relationship between the input and output voltages will be made. FIG. 14 is an equivalent circuit of the front stage phase shift circuit 10L. Shown in FIG. 14 is the two series circuits at the input stage of the differential amplifier 12.

Applied to the both ends of the series circuit comprising the resistors 18 and 20 is the input voltage Ei. The voltages across the resistors 18, 20 can be replaced by two voltage sources 27, 28 each generating the voltage Ei/2. The current I' flowing through the closed loop in the equivalent circuit in FIG. 14 can be given by the following expression (18) when the inductance of the inductor 17 and the resistance of the variable resistor 16 are represented by L and R, respectively:

$$I' = \frac{Ei}{R+Ls} \tag{18}$$

Now, the potential difference Eo' between the two points in FIG. 14 is given by the following expression (19):

$$Eo' = I' \times Ls - \frac{1}{2} Ei \tag{19}$$

The I' in the expression (19) is substituted by the expression (18) to obtain the following expression (20):

$$Eo' = \frac{Ls}{R+Ls} Ei - \frac{1}{2} Ei = -\frac{R-Ls}{2(R+Ls)} Ei \tag{20}$$

Since the output voltage Eo from the phase shift circuit 10L in this particular embodiment is equal to two times of potential difference Eo', the output voltage Eo is given by the following expression (21):

$$Eo = 2 \times Eo' = -\frac{R-Ls}{R+Ls} Ei \tag{21}$$
$$= -\frac{1-\frac{L}{R}s}{1+\frac{L}{R}s} Ei = -\frac{1-Ts}{1+Ts} Ei$$

Where, the time constant T of the LR circuit comprising the variable resistor 16 and the inductor 17 is equal to L/R similar to the CR circuit in the phase shift circuit 10C in FIG. 1.

The expression (21) is the same as the calculation represented by the expression (4) in the first embodiment. It is understand that the phase shift circuit 10L in this embodiment has the same input output relationship as the phase shift circuit 10C in FIG. 2. This means that the phase shift circuit 10L maintains the output signal amplitude constant regardless of any phase angle between the input and output signals.

Also, the phase shift φ 1 of the expression (7) applies to the phase shift φ 3 of the output voltage Eo with respect to the input voltage. For example, at the particular frequency to satisfy ω being substantially equal to 1/T(=R/L), the phase shift is about 90°. Additionally, by varying the resistance R of the variable resistor 16, the frequency ω to achieve the phase shift of about 90° can be controlled.

Figure 15:
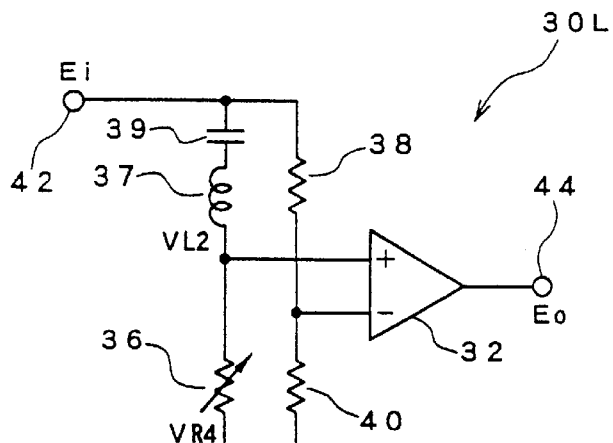
FIG. 15 is a circuit schematic diagram of the rear stage phase shift circuit in FIG. 11.

Illustrated in FIG. 15 is a circuit schematic of the subsequent stage phase shift circuit 30L in FIG. 11. The phase shift circuit 30L comprises a differential amplifier 32 to amplify the voltage difference between the two inputs by a predetermined amplification factor (e.g., about 2), an inductor 37 and a variable resistor 36 to apply the input signal on the input terminal 42 to the non-inverting input terminal of the differential amplifier 32 after shifting the phase, and a voltage divider circuit of resistors 38, 40 to divide the input signal on the input terminal 42 to about ½ without shifting its phase before being applied to the inverting input terminal of the differential amplifier 32.

It is to be noted, here, that the capacitor 39 in series with the inductor 37 is for DC blocking and has a certain large capacitance to exhibit fairly low impedance at the operating frequency. When a given AC signal is applied to the input terminal 42 of the phase shift circuit 30L having the above mentioned configuration, applied to the inverting input terminal of the differential amplifier 32 is the voltage equal to the voltage (input voltage Ei) on the input terminal 42 divided to about ½ by the voltage dividing circuit comprising the series circuit of the two resistors 38, 40.

On the other hand, when the input signal Ei is applied to the input terminal 42, applied to the non-inverting input terminal of the differential amplifier 32 is a signal appearing on the junction of the inductor 37 and the variable resistor 36. Since the input signal is applied to one end of the LR (series) circuit comprising the inductor 37 and the variable resistor 36, the signal to be applied to the non-inverting input of the differential amplifier 32 is the input signal phase shifted by the LR circuit.

The differential amplifier 32 amplifies the voltage difference between the two input terminals by a predetermined amplification factor, e.g., about 2.

Figure 16:
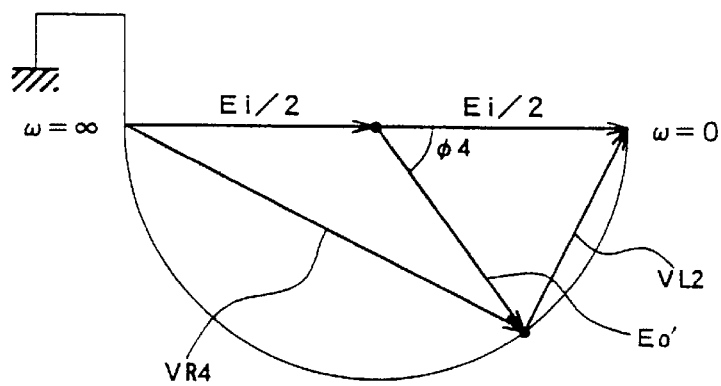
FIG. 16 is a vector diagram of the input and output voltages and the voltage across the inductor of the phase shift circuit in FIG. 15.

Illustrated in FIG. 16 is a vector diagram to show the relationship between the input/output voltages of the phase shift circuit 30L and the voltages across the inductor, etc.

As apparent from FIG. 16, the voltage VR4 across the variable resistor 36 and the voltage VL2 across the inductor 37 are 90° out of phase with each other. The vector addition of these voltages VR4 and VL2 is equal to the input voltage Ei. If the input signal varies only in frequency while maintaining its amplitude constant, the voltages VR4 and VL2 across the variable resistor 36 and the inductor 37 move along the circumference of the semi-circle in FIG. 16.

Now, the vector subtraction of the voltage (Ei/2 across the resistor 40) to be applied to the inverting input terminal of the differential amplifier 32 from the voltage (VR4 across the variable resistor 36) to be applied to the non-inverting terminal is the voltage difference Eo' which is represented by a vector starting at the center of the semi-circle in FIG. 16 and terminating on the circumference of the semi-circle where the voltage VR4 and VL2 cross. The amplitude is equal to the radius Ei/2 of the semi-circle. In fact, the voltage difference Eo' is amplified by the factor of two(2) by the differential amplifier, thereby providing the output voltage EO=EO'×2=Ei. As a result, it is understood that in the phase shift circuit 30L of the particular embodiment, the input and output signals are equal in amplitude, thereby causing no attenuation between the input and output signals.

Also, as apparent from FIG. 16, the voltages VR4 and VL2 cross at a right angle on the circumference of the semi-circle. As the frequency ω varies from 0 to ∞, the phase angle of the input voltage Ei and the voltage VR4 varies from 0° to 90°. The phase shift φ 4 of the entire phase shift circuit 30L is twice as large as the above phase shift, therefore varying from 0° to 180° depending on the frequency.

Now, the relationship of the above mentioned input and output voltages will be studied quantitatively.

Figure 17:
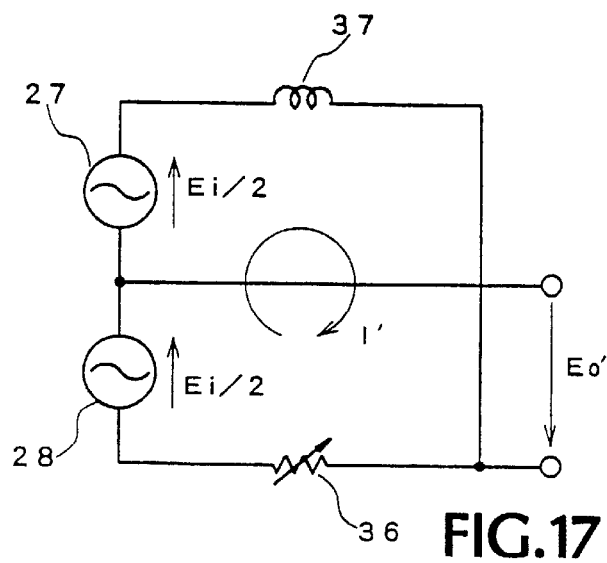
FIG. 17 is an equivalent circuit diagram of the phase shift circuit in FIG. 15.

FIG. 17 is an equivalent circuit of the subsequent stage phase shift circuit 30L, particularly the two series circuits at the input side of the differential amplifier 32.

Since the input voltage Ei is applied across the series circuit of the resistors 38 and 40, an equal voltage Ei/2 is applied across each resistor 38, 40 similar to the front stage phase shift circuit 10L and thus replaced by two voltage sources 27, 28. The current I' flowing through the closed loop of the equivalent circuit in FIG. 17 is given by the above expression (18), wherein the resistance of the variable resistor 36 and the inductance of the inductor 37 are represented by R and L, respectively.

Now, the potential difference Eo' between the two points in FIG. 17 is given by the following expression (22):

$$Eo' = I' \times R - \frac{1}{2} Ei \quad (22)$$

By substituting the expression (18) for the current I' in the above expression (22), you will obtain the following expression (23):

$$Eo' = \frac{R}{R+Ls} Ei - \frac{1}{2} Ei = \frac{R-Ls}{2(R+Ls)} Ei \quad (23)$$

The output voltage Eo of the phase shift circuit 30L of the particular embodiment is equal to two times of the above potential difference Eo' and is given by the following expression (24):

$$Eo = 2 \times Eo' = \frac{R-Ls}{R+Ls} Ei \quad (24)$$
$$= \frac{1 - \frac{L}{R} s}{1 + \frac{L}{R} s} Ei = \frac{1-Ts}{1+Ts} Ei$$

Similar to the phase shift circuit 10L, the time constant of the LR circuit comprising the inductor 37 and the variable resistor 36 is represented by T(=L/R).

The above expression (24) is identical to the expression (10) for the first embodiment. The phase shift circuit 30L in this particular embodiment is understood to have the same input and output voltage relationship as the phase shift circuit 30L in the first embodiment. As a result, the output signal amplitude of the phase shift circuit 30L remains constant regardless of any phase angle (or rotation) between the input and output signals.

Also, the phase shift φ 4 of the output voltage Eo with respect to the input voltage is given by φ 2 as represented by the above expression (12) and is about 90° at the frequency, for example, when ω=1/T(=R/L). By controlling the resistance R of the variable resistor 36, the frequency ω to provide about 90° phase shift can be varied.

The two phase shift circuits 10L, 30L provide phase shift in the manner described above. As apparent from FIGS. 13 and 16, the relative phase relationship of the input and output voltages is opposite to each other in the phase shift circuits 10L, 30L. As a result, the overall phase shift of the two phase shift circuits 10L, 30L will be 0° at a certain frequency.

On the other hand, the output from the subsequent stage phase shift circuit 30L is fed back to the input of the non-inverting circuit 50 at the front stage of the phase shift circuit 10L by way of the feedback resistor 70, thereby summing the feedback signal and the input signal supplied by way of the input resistor 74. The summing signal is fed to the input terminal (the input terminal 22 in FIG. 12) of the phase shift circuit 10L by way of the non-inverting circuit 50 acting as a buffer circuit.

Such feedback loop will provide 0° overall phase shift around the feedback loop at a certain frequency. In this frequency, the gain of the phase shift circuits 10L, 30L and the non-inverting circuit 50 is adjusted so that the loop gain of the entire tuned amplifier is substantially 1 when the tuning takes place.

Incidentally, the tuned amplifier 2 in the second embodiment including the aforementioned non-inverting circuit 50 and the two phase shift circuits 10L, 30L is represented by a circuit having the transfer function K1, then realizing the circuit as illustrated in FIG. 8. Then, the Miller's principle is applied to replace it by the circuit in FIG. 9 and the transfer function A of the entire circuit can be represented by the above expression (13).

Also, as apparent from the above expressions (21) and (24), the transfer functions of the two phase shift circuits 10L, 30L in this particular embodiment are identical to those of the two phase shift circuits 10C, 30C in the first embodiment. The transfer function K1 of the entire circuit having the non-inverting circuit 50 and the two phase shift circuits 10L, 30L is also identical to the expression (16). As a result, the transfer function of the entire tuned amplifier of the second embodiment is identical to the above expression (17).

Accordingly, the second embodiment of the tuned amplifier 2 has the same characteristic as the first embodiment of the tuned amplifier. The attenuation becomes the maximum, $A=-1/(2n+1)$ when $\omega=0$ (DC domain). Also, when $\omega=\infty$, the attenuation is the maximum. At the tuning point when $\omega=1/T$ (if time constants of the two phase shift circuits 10L, 30L are respectively $T_1$, $T_2$ and differ from each other, the tuning point is $\omega=1/\sqrt{(T_1 \cdot T_2)}$), $A=1$ which is independent of the resistance ratio n of the feedback resistor 70 and the input resistor 74. This means that the tuning point and the attenuation at the tuning point remain unchanged regardless of the resistance ratio n as shown in FIG. 10.

As understood from the above description, the particular embodiment of the tuned amplifier 2 exhibits constant tuned frequency and gain at the tuning point regardless of the resistance ratio n of the feedback resistor 70 and the input resistor 74, and the maximum attenuation can be varied. On the contrary, since the maximum attenuation depends on the resistance ratio n, the maximum attenuation is unaffected even if the tuned frequency is varied by varying the resistance of the variable resistors 16, 36 in the phase shift circuits 10L, 30L. The tuned frequency and the gain and the maximum attenuation at the tuned frequency may be adjusted without interference.

It is also noted that the inductors 17, 37 may be formed on a semiconductor substrate using a spiral form of conductors formed by a photoetchig technology. Attention should be paid that the use of such inductors 17, 37 makes it possible to easily implement the entire tuned amplifier 2 in a semiconductor circuit along with other components (differential amplifiers, resistors, etc.). Especially, when the tuned amplifier 2 is formed in an integrated circuit, inductance of the inductors 17, 37 may be decreased to increase the tuned frequency $\omega(=R/L)$.

Although the front and subsequent stage phase shift circuits 10L, 30L are respectively located at the front and the subsequent stages in the second embodiment of the tuned amplifier 2, they may be interchanged, i.e., the phase shift circuit 30L may be at the front stage and the phase shift circuit 10L at the subsequent stage as long as the phase shift between the overall input and output signals is 0°.

3rd Embodiment

Figure 18:
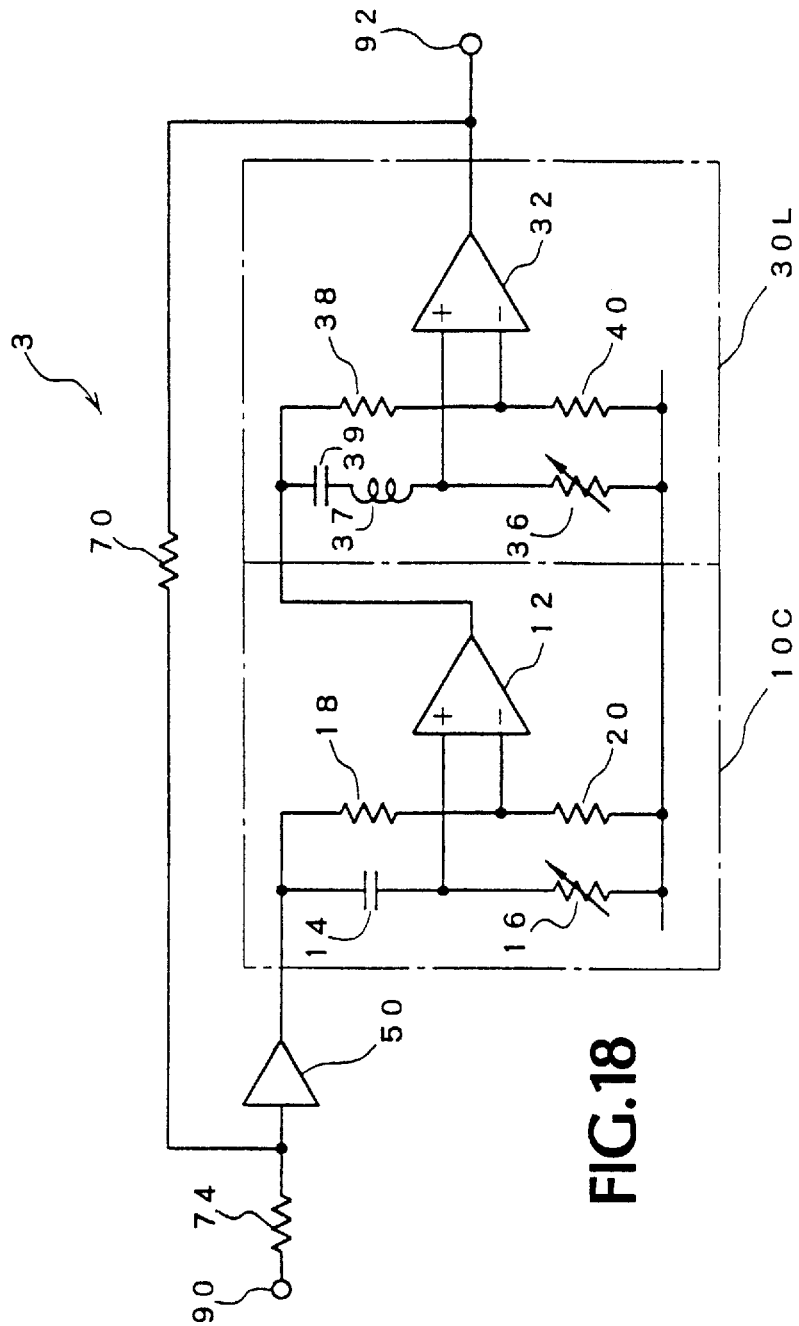
FIG. 18 is a circuit schematic of a third embodiment of the tuned amplifier according to the present invention.

Shown in FIG. 18 is a circuit schematic of a third embodiment of the tuned amplifier according to the present invention. The tuned amplifier 3 comprises a non-inverting circuit 50 to provide the output of the same phase as the input signal, phase shift circuits 10C and 30L as shown in FIG. 2 or FIG. 15, and a summing circuit to add the signal (feedback signal) from the subsequent stage phase shift circuit 30L by way of the feedback resistor 70 and the input signal applied to the input terminal 90 by way of the input resistor 74 (having the resistance equal to n times of that of the feedback resistor 70) by the predetermined ratio.

As described above by reference to the first and second embodiments, the third embodiment of the tuned amplifier 3 provides a predetermined phase shift by the two phase shift circuits 10C, 30L contained in the tuned amplifier 3. As shown in FIGS. 3 and 16, the relative phase relationship between the input and output voltages of the phase shift circuits 10C, 30L is opposite to each other and the overall phase shift of the two shift circuits 10C, 30L becomes 0° at a certain frequency.

Also, the output from the subsequent stage phase shift circuit 30L is fed back to the input side of the non-inverting circuit 50 at the front stage of the phase shift circuit 10C by way of the feedback resistor 70. The feedback signal and the input signal from the input resistor 74 are added to each other for application to the input terminal (the input terminal 22 in FIG. 2) of the phase shift circuit 10C by way of the non-inverting circuit 50 operating as a buffer circuit.

Such feedback loop will make the loop phase shift equal to 0° at a certain frequency. At this frequency, when the loop gain of the entire tuned amplifier 3 is set to substantially 1 (unity) by adjusting the amplification factor of the non-inverting circuit 50 and the two phase shift circuits 10C, 30L, the tuned operation is be achieved.

Incidentally, the third embodiment of the tuned amplifier 3 including the above mentioned non-inverting circuit 50 and the two phase shift circuits 10C, 30L may be replaced by a circuit having the entire transfer function K1, which takes the circuit schematic as shown in FIG. 8 as is the case in the above first embodiment. As a result, the Miller's principle is applied to replace it by the circuit schematic as shown in FIG. 9. The transfer function A of the converted entire circuit is given by the above expression (13).

Also, as apparent from the expression (24), the transfer function of the subsequent stage phase shift circuit 30L in this particular embodiment is the same as the transfer function of the subsequent stage phase shift circuit 30C in the first embodiment. The expression (16) is applicable to the overall transfer function K1 of the circuit including the non-inverting circuit 50 and the two phase shift circuits 10C, 30L. Also, the transfer function A as given by the expression (17) is applicable to the entire tuned amplifier 3 of the third embodiment.

Accordingly, the tuned amplifier 3 of the third embodiment has the same characteristics as the tuned amplifier 1 of the first embodiment, wherein $A=-1/(2n+1)$ and the maximum attenuation at $\omega=0$ (DC domain). Also, it exhibits the maximum attenuation at $\omega=\infty$. At the tuning point or $\omega=1/T$ (when the time constants of the two phase shift circuits 10C, 30L are T1, T2, the tuning point $\omega=1\sqrt{(T1 \cdot T2)}$), $A=1$ which is independent of the resistance ratio n of the feedback resistor 70 and the input resistor 74. This means that the tuning point remains unchanged and so is the attenuation at the tuning point even if the resistance ratio n varies as illustrated in FIG. 10.

As understood from the above description, the tuned amplifier 3 of this particular embodiment maintains the tuned frequency and the gain at the tuning point constant regardless of n and only the maximum attenuation varies. On the contrary, since the maximum attenuation depends on the resistance ratio n, variation of the tuned frequency under control of the variable resistor 16 or 36 in each phase shift circuit 10C, 30L does not affect the maximum attenuation and the tuned frequency, the gain at the tuned frequency and the maximum attenuation may be controlled without interference.

Also, as described above by reference to the second embodiment, the inductor 37 may be formed an a semiconductor substrate in a spiral form by photo lithographic or similar technique. The use of such inductor 37 makes it possible to easily implement the tuned amplifier 3 on a semiconductor substrate along with all other components (differential amplifier, resistors, etc.).

Note that the time constant T of the CR circuit in the front stage phase shift circuit 10C is equal to CR while that of the LR circuit in the subsequent stage phase shift circuit 30L is L/R. That is, the resistance R is numerator in the phase shift circuit 10C but is denominator in the phase shift circuit 30L. This means that, if the variable resistors 16, 36 are formed using e.g., FETs and the entire tuned amplifier 3 is implemented on a semiconductor substrate, any tuned frequency drift due to temperature characteristic of these resistors may be effectively suppressed or compensated.

In the particular embodiment of the tuned amplifier 3, the phase shift circuit 10C is disposed in the front stage and the phase shift circuit 30L is disposed in the subsequent stage. However, arrangement may be changed as long as the phase shift between the overall input and output signals is 0°.

4th Embodiment

Figure 19:
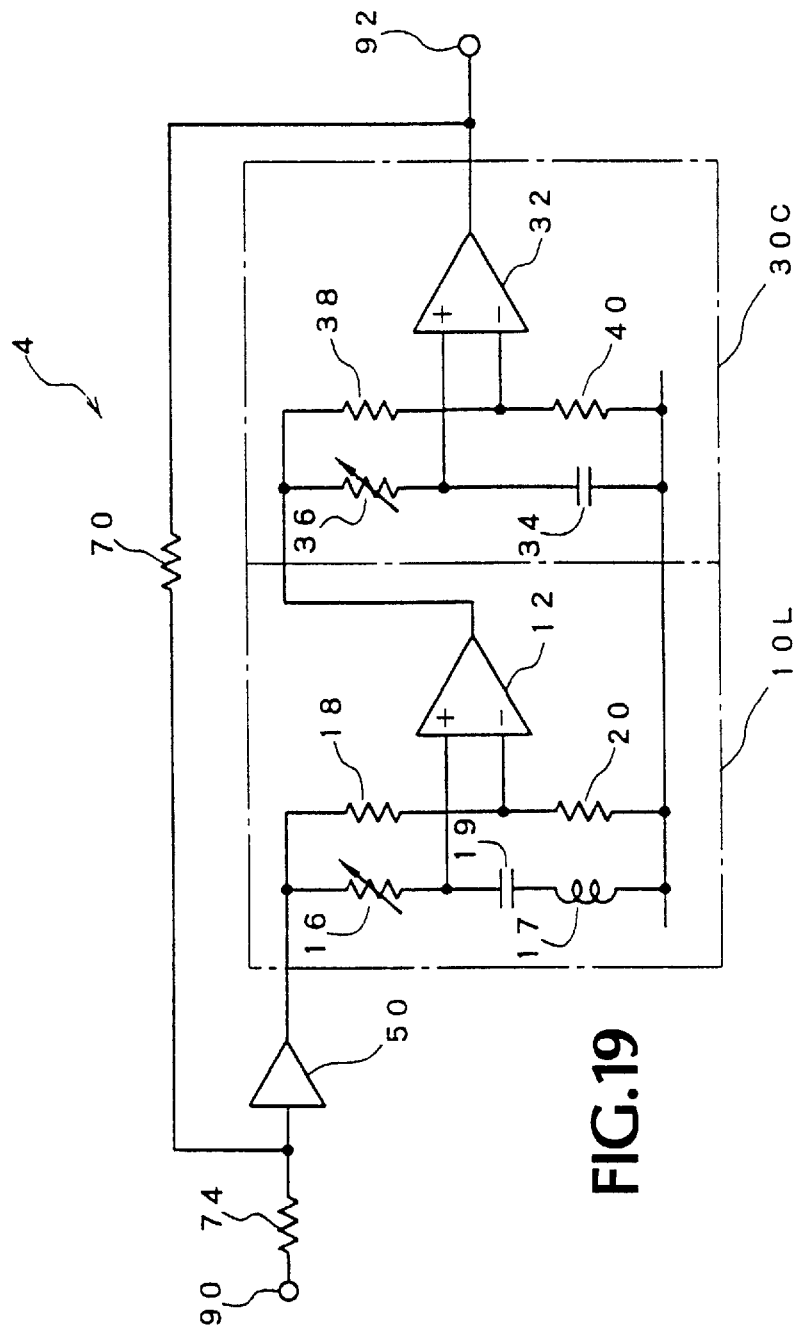
FIG. 19 is a circuit schematic of a fourth embodiment of the tuned amplifier according to the present invention.

Now, shown in FIG. 19 is a circuit schematic of a fourth embodiment of the tuned amplifier. The tuned amplifier 4 comprises a non-inverting circuit 50 to output the input signal without shifting the phase, phase shift circuits 10L, 30C of the configuration as shown in either FIG. 12 or FIG. 5, and a summing circuit to add with a predetermined ratio the input signal applied to the input terminal 90 and the feedback signal from the subsequent stage phase shift circuit 30C by way of the input resistor 74 and the feedback resistor 70 (the resistance of the input resistor 74 being n times of that of the feedback resistor 70), respectively.

As described above by reference to the first and the second embodiments, phase is shifted by the two phase shift circuits 10L, 30C in the fourth embodiment of the tuned amplifier 4. Also, as shown in FIGS. 13 and 5, the relative phase between the input and the output voltages is opposite to each other in the phase shift circuits 10L, 30C. There is a certain frequency in which the overall phase shift of the two phase shift circuits 10L, 30C is 0°.

The output from the subsequent stage phase shift circuit 30C is fed back to the input side of the non-inverting circuit 50 at the front stage of the phase shift circuit 10L by way of the feedback resistor 70. The feedback signal and the input signal through the input resistor 74 are added to each other. The added signal is then applied to the input terminal (the input terminal 22 in FIG. 12) of the phase shift circuit 10L by way of the non-inverting circuit 50 acting as a buffer circuit.

By forming such feedback loop, phase shift along the feedback loop becomes 0° at a certain frequency. Then, amplification factors of the two phase shift circuits 10L, 30C and the non-inverting circuit 50 are adjusted to provide the unity loop gain of the tuned amplifier, thereby effecting the tuned operation.

The fourth embodiment of the tuned amplifier 4 including the non-inverting circuit 50 and the two phase shift circuits 10L, 30C is replaced by a circuit having the overall transfer function K1. Then, the circuit is as shown in FIG. 8 similar to the first embodiment. Using the Miller's principle, the circuit can be converted as shown in FIG. 9 and the overall transfer function A of the converted circuit can be represented by the expression (13).

Also, as apparent from the expression (21), the transfer function of the front stage phase shift circuit 10L in this particular embodiment is identical to that of the front stage phase shift circuit 10C in the first embodiment. The overall transfer function K1 given by the expression (16) is applicable to the entire circuit including the non-inverting circuit 50 and the two phase shift circuits 10L, 30C. Also, the transfer function A as given by the expression (17) is applicable to the fourth embodiment of the tuned amplifier.

Accordingly, the fourth embodiment of the tuned amplifier 4 has a similar characteristic to the first embodiment of the tuned amplifier 1 or the third embodiment of the tuned amplifier 3. The attenuation becomes the maximum $A=-1/(2n+1)$ at $\omega=0$ (DC domain) and $\omega=\infty$. At the tuned frequency of $\omega=1/T$ (or $\omega=1/\sqrt{T1 \cdot T2}$) in a case of different time constant T1, T2 of the two phase shift circuits 10L, 30C, respectively), $A=1$ which is independent of the resistance ratio n of the feedback resistor 70 and the input resistor 74. As shown in FIG. 10, the tuned frequency and the attenuation at the tuned frequency remain constant as the resistance ratio n varies.

As understood from the above description, the tuned amplifier 4 in this particular embodiment provides variable maximum attenuations while maintaining the tuned frequency and the gain at the tuned frequency constant as a function of the resistance ratio n. On the contrary, since the maximum attenuation depends on the resistance ratio n, the maximum attenuation is not affected by the variable resistor 16 or 36 in the phase shift circuit 10L, 30C and the tuned frequency, the gain at the tuned frequency and the maximum attenuation may be controlled without interference.

Also, the inductor 17 may be fabricated on a semiconductor substrate by forming a spiral form of conductor by photo etching technique as described hereinbefore by reference to the second embodiment. The use of such inductor 17 is effective to fabricate the entire tuned amplifier 4 in an integrated circuit along with the other components (e.g., differential amplifiers, resistors, etc.).

The time constant T of the LC circuit in the front stage phase shift circuit 10L is L/R and that of the CR circuit in the subsequent stage phase shift circuit 30C is CR. This means that the resistance R is numerator in one circuit and denominator in the other circuit. For example, if the entire circuit of the tuned amplifier 4 is fabricated on a semiconductor substrate, and both resistors 16, 36 are formed using FETs, any change in the tuned frequency due to temperature change of the resistors is suppressed, thereby providing so-called temperature compensation.

Although the phase shift circuits 10L and 30C are connected respectively at the front stage and the subsequent stage in this particular embodiment of the tuned amplifier 4, they may be interchanged as long as the phase shift between the input and output signals is 0°.

5th Embodiment

In each of the above embodiments of the tuned amplifier comprising two phase shift circuits of opposite phase relationship between the input and output signals as shown in FIG. 3 or FIG. 6, a tuned amplifier may comprise with a combination of two phase shift circuits of the same relative phase relationship.

Figure 20:
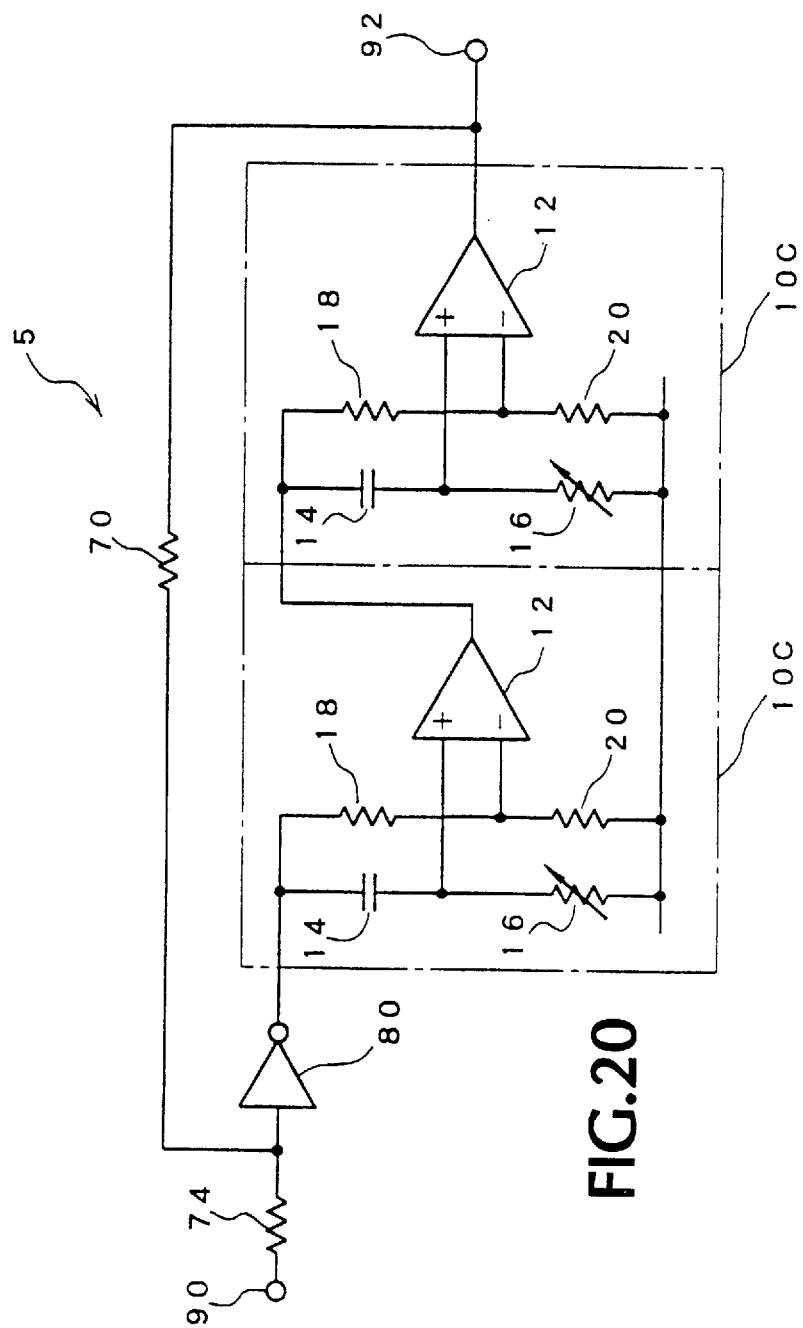
FIG. 20 is a circuit schematic of a fifth embodiment of the tuned amplifier according to the present invention.

Shown in FIG. 20 is a circuit schematic of the fifth embodiment of the tuned amplifier 5 comprising a phase inverting circuit 80 to output the signal inverting the phase of the input signal, a pair of phase shift circuits 10C, 10C and a summing circuit to add at a predetermined ratio the input signal applied to an input terminal 90 and a feedback signal from the subsequent stage phase shift circuit 10C by way of an input resistor 74 and a feedback resistor 70 (where the resistance of the input resistor 74 is n times of that of the feedback resistor 70), respectively.

The phase inverting circuit 80 inverts the phase of the input signal and simultaneously provides the output signal amplifying the input signal by a predetermined amplification factor. Proper adjustment of the amplification factors of the phase inverter circuit 80 and differential amplifiers 12 in the pair of phase shift circuits 10C, 10C easily sets the loop gain equal to substantially 1.

As described above by reference to the first embodiment, each of the two phase shift circuits 10C, 10C provides variable phase shift from 180° to 0° as the input signal frequency ω changes from 0 to ∞. Now, it is assumed that the time constants of the CR circuits in the two phase shift circuits 10C, 10C are equal to each other and equal to T. At frequency ω=1/T, the phase shift of each of the two phase shift circuits 10C, 10C is 90°, thereby providing total 180° phase shift. In addition to this 180° phase shift, the phase inverter circuit 80 in the front stage provides inverted phase, thereby providing 0° phase shift by the entire circuit and such output signal is derived from the subsequent stage phase shift circuit 10C. The output from the subsequent stage phase shift circuit 10C is fed back to the input side of the phase inverter circuit 80 in the front stage of the front stage phase shift circuit 10C by way of the feedback resistor 70. It is the feedback signal and the input signal applied through the input resistor 74 that are added by the summing circuit.

By forming the feedback loop in this manner, the phase shift around the loop becomes 0° at a certain frequency. At this time, amplification factors of the phase inverter circuit 80 and the two phase shift circuits 10C, 10C are adjusted to set the loop gain of the entire tuned amplifier 5 to substantially 1 where tuned operation takes place.

The transfer function of the two phase shift circuits 10C, 10C are K2 as represented by the above expression (14), wherein T is the time constant of the CR circuits. Consequently, cascade connection of the phase inverter circuit 80 and the two phase shift circuits 10C, 10C provides the overall transfer function K1 given by the following expression (25):

$$K1 = (-1) \times K2 \times K2 \quad (25)$$
$$= -\frac{(1-Ts)^2}{(1+Ts)^2} = -\frac{1+(Ts)^2-2Ts}{1+(Ts)^2+2Ts}$$

You will see that the above expression is equal to the expression (16) in the first embodiment. This means that the A given in the above expression (17) can be applied to the transfer function of the entire tuned amplifier 5 in the fifth embodiment.

As a result, the fifth embodiment of the tuned amplifier 5 has the same characteristic as the first embodiment of the tuned amplifier 1. That is, A=−1/(2n+1) and the maximum attenuation is at ω=0 (DC domain). Also, the maximum attenuation is achieved at ω=∞. At ω=1/T or tuned frequency (ω=1/√($T_1 \cdot T_2$) when the time constants of the two phase shift circuits 10C, 10C are different from each other and $T_1$, $T_2$, respectively), A=1 which is independent of the resistance ratio n between the feedback resistor 70 and the input resistor 74. The tuned frequency and the maximum attenuation at the tuned frequency remain constant regardless of the change in n as shown in FIG. 10.

As understand from the foregoing description, the tuned amplifier 5 of this particular embodiment provides constant tuned frequency and gain at the tuned frequency while varying only the maximum attenuation as the resistance ratio n between the feedback resistor 70 and the input resistor 74 varies. On the contrary, since the maximum attenuation varies depending on the resistance ratio n, the maximum attenuation is unaffected by the tuned frequency controlled by varying the variable resistor 16 in each phase shift circuit 10C. This makes it possible to control the tuned frequency, the gain and maximum attenuation at the tuned frequency without interference.

Additionally, since the tuned amplifier 5 of this particular embodiment can be made by a combination of differential amplifiers, resistors and capacitors which may be fabricated on a semiconductor substrate, the entire tuned amplifier 5 with adjustable tuned frequency and maximum attenuation can be easily integrated on a semiconductor substrate.

6th Embodiment

Figure 21:
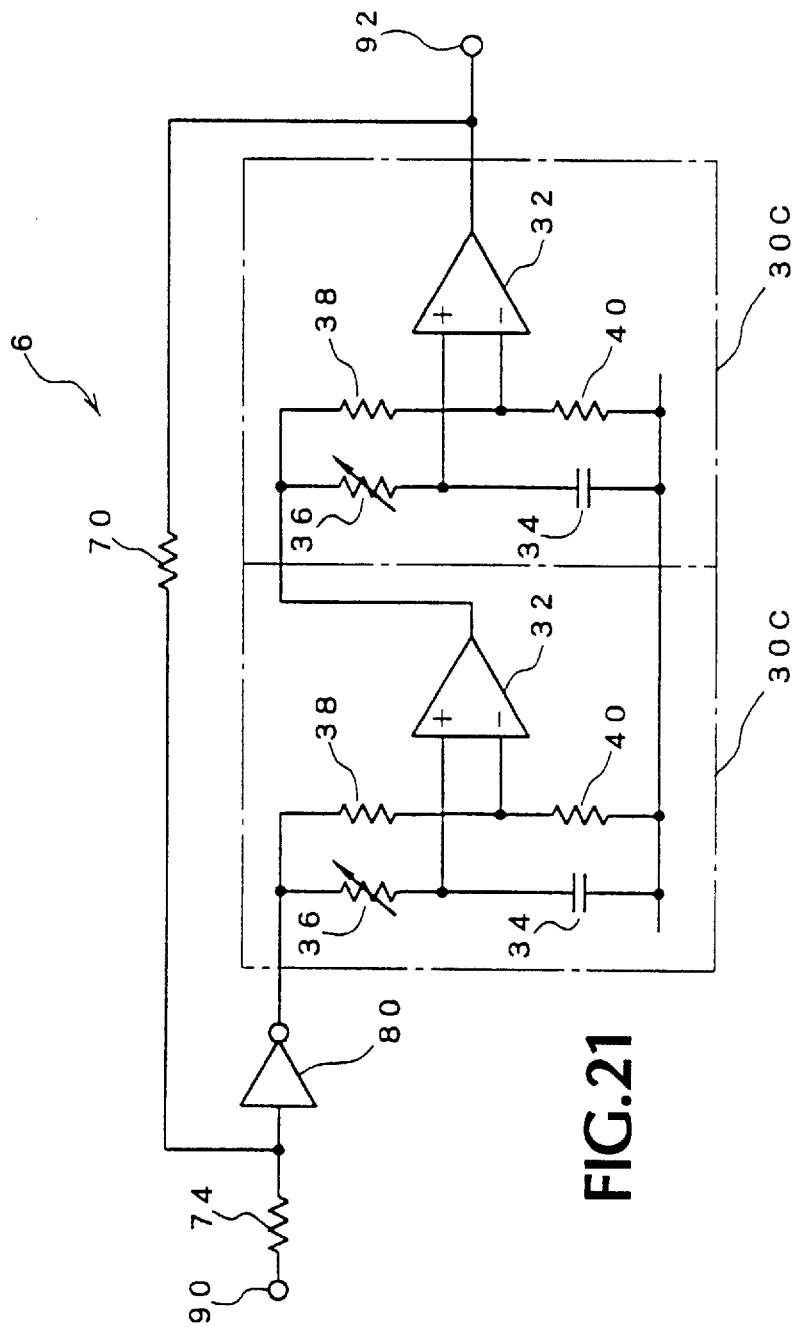
FIG. 21 is a circuit schematic of a sixth embodiment of the tuned amplifier according to the present invention.

Shown in FIG. 21 is a tuned amplifier of a sixth embodiment of the present invention. The tuned amplifier 6 comprises a phase inverting circuit 80 to provide the output inverting the phase of the input signal thereto, a pair of phase shift circuits 30C, 30C as shown in FIG. 5 and a summing circuit to add with a predetermined ratio an input signal applied to an input terminal 90 and a feedback signal from the subsequent stage phase shift circuit 30C by way of an input resistor 74 and a feedback resistor 70 (the resistance of the input resistor 74 is n times of that of the feedback resistor 70), respectively.

The phase inverter circuit 80 inverts the phase of the input signal thereto and also provides the amplified output signal with a predetermined amplification factor. The loop gain of the entire circuit can be easily set to substantially 1 by adjusting amplification factors of the phase inverter circuit 80 and differential amplifiers 32 in the two phase shift circuits 30C, 30C.

Now, as described above by reference to the first embodiment, each of the two phase shift circuits 30C provides phase shift from 0° to 180° as the input signal frequency ω varies from 0 to ∞. If it is assumed that time constants of CR circuits in the two phase shift circuits 30C, 30C are equal to each other, let say T, phase shift of each phase shift circuit 30C is equal to 90° when the frequency ω=1/T. The total phase shift of the two phase shift circuits 30C, 30C is therefore 180°. Additional phase inversion by the phase inverter circuit 80 in the front stage provides 0° phase shift around the loop and such output signal is derived from the subsequent stage phase shift circuit 30C which is fed back to the input side of the phase invert circuit 80 in front of the front stage phase shift circuit 30C by way of the feedback resistor 70. It is this feedback signal to be added with the input signal applied by way of the input resistor 74.

By forming the feedback loop described herein, the loop phase shift is 0° at a certain frequency. The intended tuned operation takes place at this frequency by adjusting amplification factors of the phase inverter circuit 80 and the two phase shift circuits 30C, 30C to provide substantially unity (1) loop gain of the entire tuned amplifier.

Transfer function of the two phase shift circuits 30C can be represented by K3 as given by the above expression(15) when time constants of the CR circuits are T. The entire transfer function K1 of the cascade connection of the phase inverter circuit 80 and the two phase shift circuits 30C is equal to the above expression(25). Thus, the overall transfer function A of the tuned amplifier 6 of the sixth embodiment is given by the above expression (67).

Therefore, the sixth embodiment of the tuned amplifier 6 has the similar characteristic to the first embodiment of the tuned amplifier 1. The attenuation A=−1/(2n+1) and is the maximum at ω=0(DC range) and also ω=∞. At the tuned frequency ω=1/T(or ω=1/√(T$_1$·T$_2$) when time constants of the two phase shift circuits 30C are different and T$_1$, T$_2$, respectively), A=1 and is independent of the resistance ratio n between the feedback resistor 70 and the input resistor 74. The tuned point and the attenuation at the tuned point remain unchanged as the resistance ratio n varies as illustrated in FIG. 10.

As understood from the above description, the tuned amplifier 6 in this particular embodiment provides constant tuned frequency and gain at the tuned frequency regardless of the resistance ratio n between the feedback resistor 70 and the input resistor 74 and only the maximum attenuation varies. On the contrary, since the maximum attenuation depends on the resistance ratio n, the tuned frequency, and the gain and the maximum attenuation at the tuned frequency can be controlled without interference even if the tuned frequency is varied by adjusting the variable resistors 36 in the two phase shift circuits 30C.

Also, the sixth embodiment of the tuned amplifier 6 comprises a combination of differential amplifiers, capacitors and resistors which may be fabricated on a semiconductor substrate. The entire tuned amplifier 6 with adjustable tuned frequency and the maximum attenuation can be easily formed in an integrated circuit on a semiconductor substrate.

7th Embodiment

Figure 22:
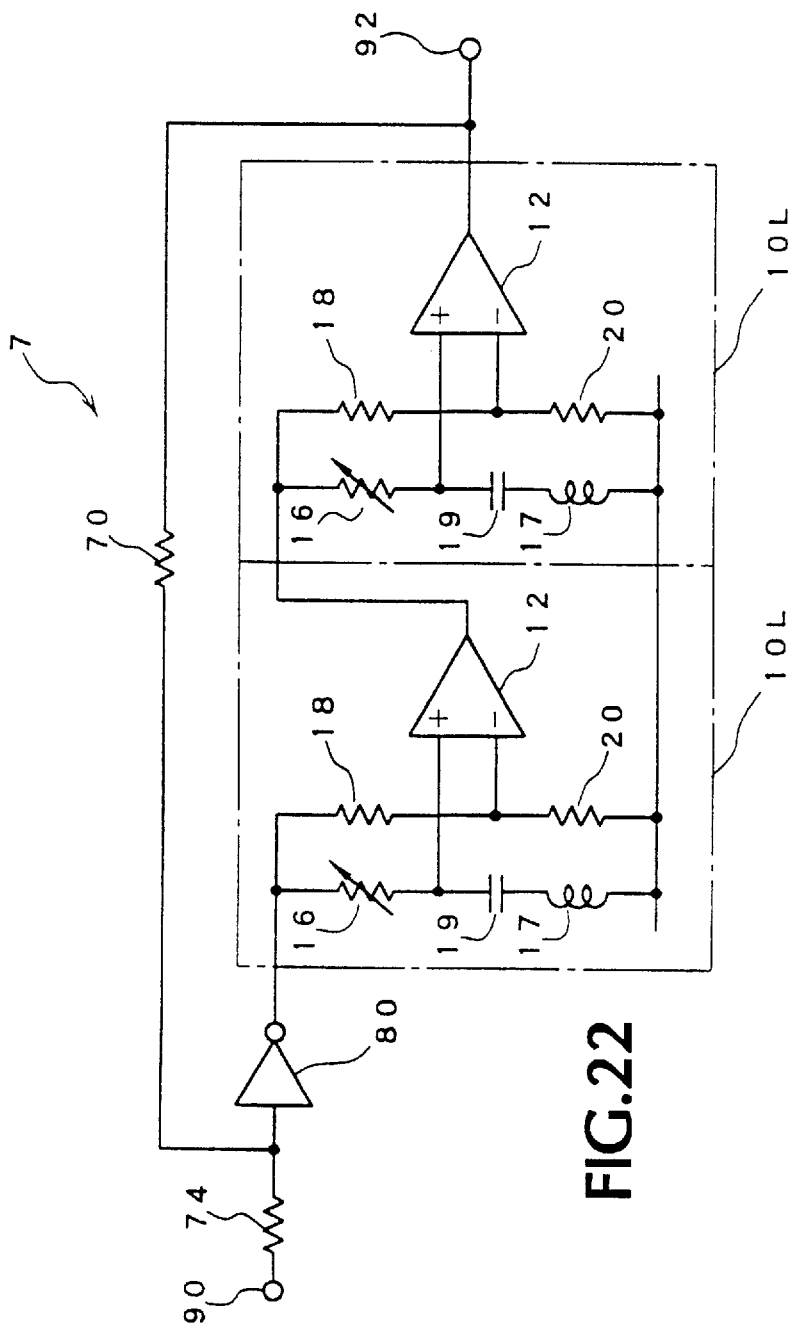
FIG. 22 is a circuit schematic of a seventh embodiment of the tuned amplifier according to the present invention.

Shown in FIG. 22 is a seventh embodiment of the tuned amplifier 7 which comprises a phase inverter circuit 80 to provide an output inverting the phase of an input signal thereto, two phase shift circuits 10L, 10L as shown in FIG. 12 and a summing circuit to add with a predetermined ratio an input signal applied to an input terminal 90 and a feedback signal from the subsequent stage phase shift circuit 10L by way of an input resistor 74 and a feedback resistor 70 (the resistance of the input resistor 74 being n times of that of the feedback resistor 70), respectively.

The phase inverter circuit 80 inverts the phase of the input signal thereto and simultaneously amplifies the input signal by a predetermined amplification factor. By adjusting the amplification factors of the phase inverter circuit 80 and differential amplifiers in the two phase shift circuits 10L, 10L, the loop gain of the tuned amplifier 7 can be easily set to substantially unity (1).

As described about the second embodiment, each of the two phase shift circuits 10L provides phase shift varying from 180° to 0° as the input frequency ω varies from 0 to ∞. Now, it is assumed that the time constant of the LR circuit in each of the phase shift circuits 10L is equal to each other, e.g., T, then the phase shift of each of the phase shift circuits 10L is 90° at the frequency ω=1/T. This means that the overall phase shift of the two phase shift circuits 10L is 180°. Additionally, since the phase is inverted by the phase inverter circuit 80 in the front stage, the output from the subsequent phase shift circuit 10L provides 0° loop phase shift. The output from the subsequent stage phase shift circuit 10L is fed back to the input side of the phase inverter circuit 80 in the front stage by way of the feedback resistor 70. It is the feedback signal added with the input signal applied by way of the input resistor 74.

Such feedback loop helps to provide 0° loop phase shift in the feedback loop at a certain frequency. Proper adjustment of amplification factors of the phase inverter circuit 80 and the two phase shift circuits 10L, 10L performs the tuned operation by setting the overall loop gain of the tuned amplifier substantially 1.

As described above by reference to the second embodiment, each of the two phase shift circuits 10L has the same input and output voltage relationship as the phase shift circuit 10C as shown in FIG. 2. The transfer function can be represented by K2 in the expression(14). Consequently, the transfer function of the entire circuit comprising the phase inverter circuit 80 and the two phase shift circuits 10L is represented by the K1 of the expression(25). As mentioned above, the transfer function K1 represented by the expression (25) is identical to the expression(16) in the first embodiment and the A as represented by the expression(17) is applicable to the transfer function of the overall tuned amplifier 7 in the seventh embodiment.

As a result, the seventh embodiment of the tuned amplifier 7 has the same characteristic as the first embodiment of the tuned amplifier 1 and the like. A=−1/(2n+1) and is the maximum attenuation at ω=0 (DC domain) and also ω=∞. At the tuned frequency or ω=1/T(or ω=1/√(T$_1$·T$_2$) when time constants of the two phase shift circuits 10L are different from each other and T$_1$, T$_2$ , respectively), A=1 and independent of the resistance ratio n, thereby maintaining the tuned frequency and the attenuation at the tuned frequency unchanged as shown in FIG. 10 by varying the resistance ratio n.

As described above, the seventh embodiment of the tuned amplifier 7 provides constant tuned frequency and gain at the tuned frequency independent of the resistance ratio n between the feedback resistor 70 and the input resistor 74 while varying only the maximum attenuation. On the contrary, the maximum attenuation depends on the resistance ratio and is not affected by the resistance of the variable resistors 16 in the two phase shift circuits 10L. This means that the tuned frequency, the gain at the tuned frequency and the maximum attenuation can be controlled without interaction.

As described above by reference to the second embodiment, the inductors 17 may be formed on a semiconductor substrate in a spiral form of conductor by photo etching or other technique. The use of such inductors 17 makes it possible to easily fabricate the entire tuned amplifier 7 on semiconductor substrate in conjunction with other components and parts (e.g., differential amplifiers, resistors, etc.). Especially, in case of forming the tuned amplifier 7 in an integrated circuit, the frequency ω(=R/L) can be increased easily by reducing the inductance of the inductors 17, thereby making it particularly suitable to high tuned frequency.

8th Embodiment

Figure 23:
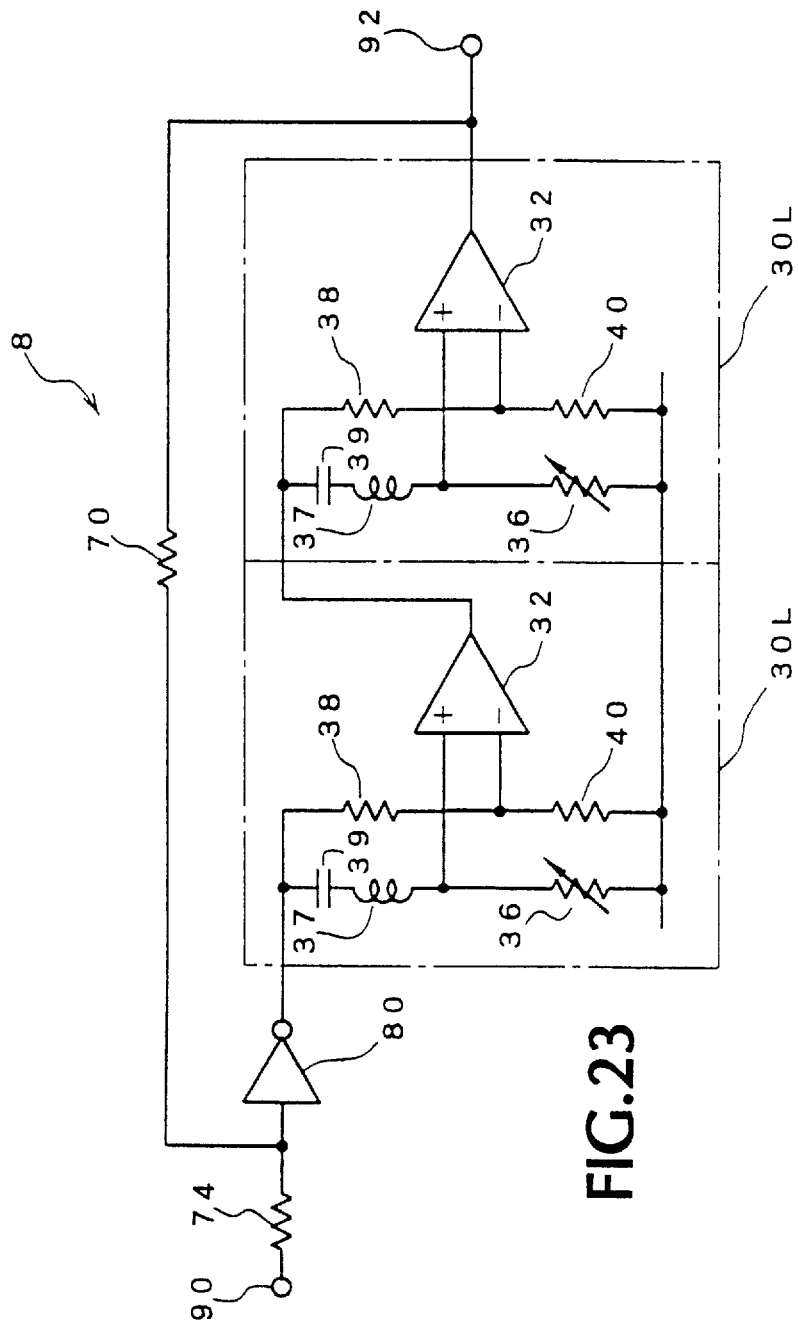
FIG. 23 is a circuit schematic of an eighth embodiment of the tuned amplifier according to the present invention.

Shown in FIG. 23 is a construction of an eighth embodiment of a tuned amplifier 8 comprising a phase inverter circuit 80 to provide an output inverting the phase of the input signal, a pair of phase shift circuits 30L as shown in FIG. 15, and a summing circuit to add with a predetermined ratio an input signal applied to an input terminal 90 and a feedback signal from the subsequent stage phase shift circuit 30L by way of an input resistor 74 and a feedback resistor 70(resistance of the input resistor 74 being n times of that of the feedback resistor 70), respectively.

The phase inverter circuit 80 is designed to invert the phase of the input signal and also amplifies the input signal by a predetermined amplification factor. Adjustment of the amplification factors of the phase inverter circuit 80 and differential amplifiers 32 in the two phase shift circuits 30L will establish the loop gain at substantially unity(1).

As described above by reference to the second embodiment, each of the two phase shift circuits 30L provides phase shift from 0° to 180° depending on varying frequency ω from 0 to ∞. Let assume, for example, the time constants of the LR circuits in the two phase shift circuits 30L are equal to each other and T, the phase shift is 90° at the frequency ω=1/T. Thus, the two phase shift circuits 30L cause 180° phase shift in total. An additional phase inversion by the phase inverter circuit 80 in the front stage causes 0° phase shift around the loop and such output is derived from the subsequent stage phase circuit 30L. The output from the subsequent stage phase shift circuit 30L is further fed to the input side of the phase inverter circuit 80 in front of the front stage shift phase shift circuit 30L by way of the feedback resistor 70 for being summed with the input signal applied by way of the input resistor 74.

By forming such feedback loop, the loop phase shift becomes 0° at a certain frequency. A tuned operation takes place when the loop gain of the overall tuned amplifier 8 is substantially unity(1) by adjusting amplification factors of the phase inverter circuit 80 and the two phase shift circuits 30L.

As described above by reference to the second embodiment, each of the two phase shift circuits 30L exhibits the input and output voltage relationship similar to the phase shift circuit 30C of the configuration in FIG. 5. Its transfer function can be K3 as represented by the above expression (15). The transfer function K3 is different only in sign from the transfer function K2 as represented by the above expression(14). By connecting the phase inverter circuit 80 to the two phase shift circuits 30L, the transfer function of the entire circuit is K1 as represented by the above expression(25). As described above, since the transfer function K1 in the expression (25) is the same as the expression (16) in the first embodiment, the A as represented by the above expression(17) is applicable to the transfer function of the eighth embodiment of the tuned amplifier 8.

Consequently, the eighth embodiment of the tuned amplifier 8 exhibits the same characteristic as the first embodiment of the tuned amplifier 1 and provides the maximum attenuation of A=−1/(2n+1) at ω=0 (DC domain) and also ω=∞. A=1 at the tuned frequency, ω=1/T (or ω=1/√($T_1 \cdot T_2$) if the time constants of the two phase shift circuits 30L are different and $T_1$, $T_2$), thereby independent of the resistance ratio n between the feedback resistor 70 and the input resistor 74. As best shown in FIG. 10, the tuning point (tuned frequency) and the attenuation at that point remain constant as the resistance ratio n varies.

The above description proves that the tuned frequency and the gain at the tuned frequency of the eighth embodiment of the tuned amplifier 8 are constant and the maximum attenuation changes as the resistance ratio n of the feedback resistor 70 and the input resistor 74 varies. On the contrary, since the maximum attenuation depends on the resistance ratio n but remains unaffected by the resistance of the variable resistors 36 in the two phase shift circuits 30 L for varying the tuned frequency, the tuned frequency, the gain at the tuned frequency and the maximum attenuation can be controlled without interference.

As also described above by reference to the second embodiment, the inductors 37 may be fabricated by spiral conductors on a semiconductor substrate by photo etching or other technology. The use of such inductors and other components (e.g., differential amplifiers, resistors, etc) makes it possible to fabricate the tuned amplifier 8 completely and easily on a semiconductor substrate. Especially, in case of fabricating the tuned amplifier 8 in an integrated circuit, it is particularly suitable for a high frequency tuned amplifier because the inductance of the inductors 37 can be reduced to increase the frequency ω(=R/L).

9th Embodiment

Figure 24:
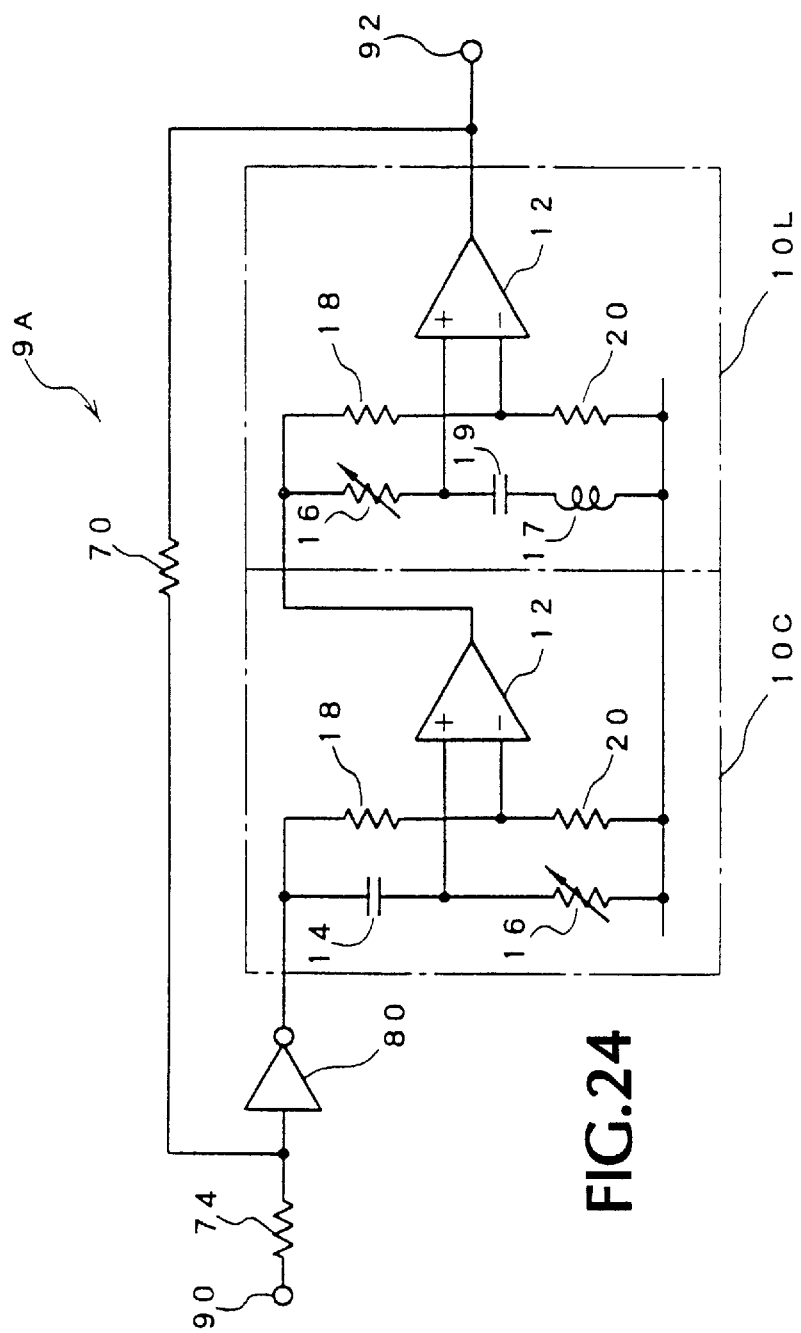
FIG. 24 is a circuit schematic of a ninth embodiment of the tuned amplifier according to the present invention.

Illustrated in FIG. 24 is a circuit schematic of a ninth embodiment of the tuned amplifier 9A comprising a phase inverter circuit 80 for inverting the phase of the input signal thereto, phase shift circuits 10C, 10L in configuration of either FIG. 2 or FIG. 12 and a summing circuit for adding with a predetermined ratio the input signal to an input terminal 90 by way of an input resistor 74 and a feedback signal from a subsequent stage phase shift circuit 10L by way of a feedback resistor 70 (where the resistance of the input resistor 74 is n times of that of the feedback resistor 70).

The phase inverter circuit 80 is designed to invert the phase of the input signal and simultaneously amplifies the input signal by a predetermined amplification factor or gain. Then, proper adjustment of the amplification factors of the phase inverter circuit 80 and differential amplifiers 12 in the two phase shift circuits 10C, 10L can set the loop gain substantially unity(1).

As described above by reference to the first or the second embodiment, each of the two phase shift circuits 10C, 10L exhibits from 180° to 0° phase shift as the input signal frequency ω varies from 0 to ∞. Let the time constant of the CR circuit in the phase shift circuit 10C be, for example, T and equal to the time constant of the LR circuit in the phase shift circuit 10L. The phase shift of each of the two phase shift circuits 10C, 10L is equal to 90° at the frequency ω=1/T, thereby providing 180° overall phase shift by the two phase shift circuits 10C, 10L. Now, the phase is inverted by the phase inverter circuit 80 at the front stage, thereby providing 0° overall phase shift along the loop before being derived from the subsequent stage phase shift circuit 10L. The output from the subsequent stage phase shift circuit 10L is fed back to the input of the phase inverter circuit 80 in front of the front stage phase shift circuit 10C by way of the feedback resistor 70 and is summed with the input signal applied by way of the input resistor 74.

By forming such feedback loop, the phase shift along the feedback loop becomes 0° at a certain frequency. A tuned operation is performed in the same manner as each of the above embodiments by adjusting the amplification factors of the phase inverter circuit 80, and differential amplifiers in the phase shift circuits 10C, 10L so that the entire loop gain of the tuned amplifier 9A is substantially unity(1).

According to the tuned amplifier 9A of this particular embodiment, the tuned frequency and the gain at the tuned frequency remain constant while only the maximum attenuation changes as the resistance ratio n between the feedback resistor 70 and the input resistor 74 varies. On the contrary, since the maximum attenuation depends on the resistance ratio n, when the tuned frequency is changed by varying the variable resistor 16 in the two phase shift circuits 10C, 10L, the maximum attenuation is not affected and the tuned frequency, the gain at the tuned frequency and the maximum attenuation can be controlled without interference.

As described above by reference to the second embodiment, the inductors 17 may be made of spiral conductors formed on a semiconductor substrate by photo etching or other technologies. The use of such inductors as well other components (e.g., differential amplifiers, resistors, etc.) makes it possible to easily fabricate the tuned amplifier 9A completely on a semiconductor substrate as an integrated circuit.

Also, the time constant T of the CR circuit in the front stage phase shift circuit 10 is CR while that of the LR circuit in the subsequent phase shift circuit 10L is L/R. This means that the resistance R is in the denominator in one circuit but is in the numerator in the other circuit, thereby suppressing fluctuation in the tuned frequency due to temperature drift of the resistance and thus providing temperature compensation, for example, when the entire tuned amplifier 9A is fabricated in an integrated circuit with FETs as the two variable resistors 16.

Although the phase shift circuits 10C, 10L are disposed respectively in the front and the subsequent stages in the above ninth embodiment of the tuned amplifier 9A, they may be interchanged as long as the entire phase shift between the input and output signals of the two phase shift circuits is 180°.

10th Embodiment

Figure 25:
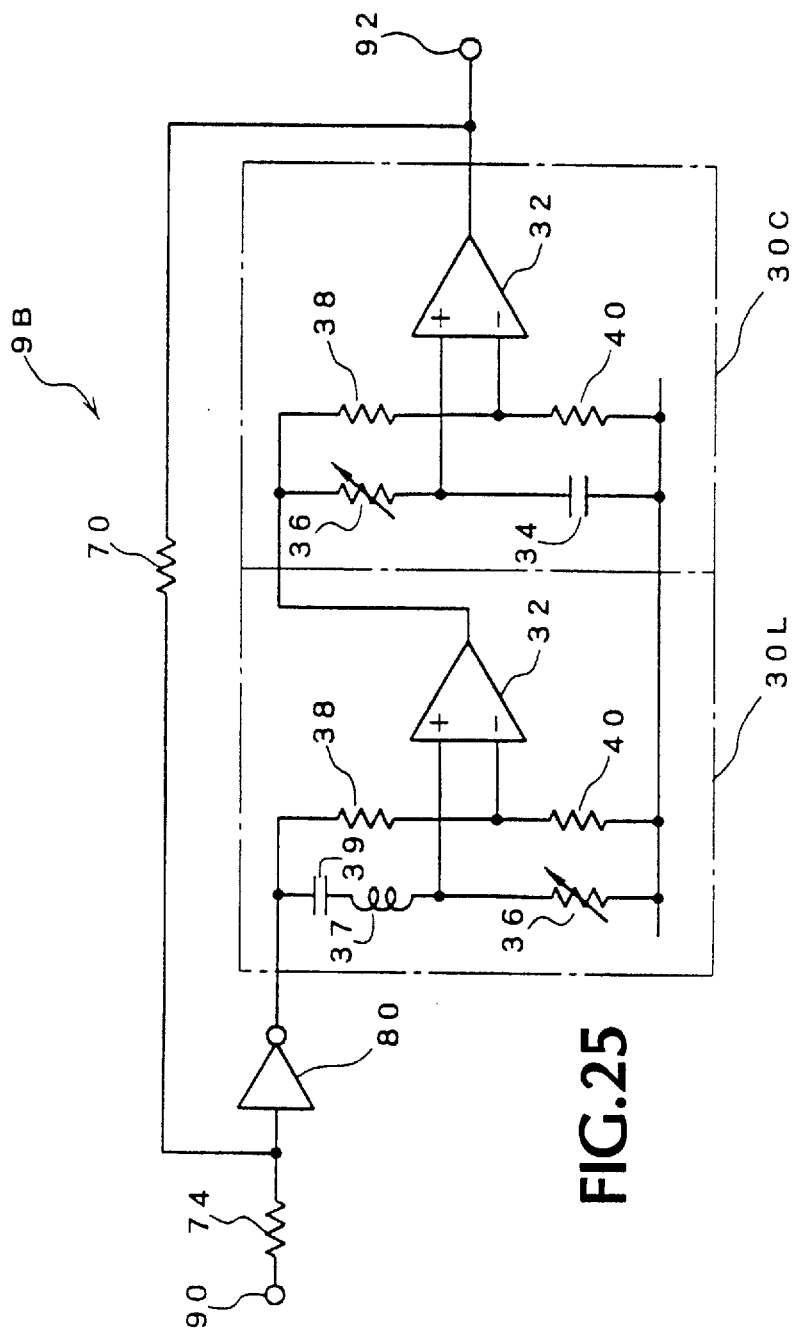
FIG. 25 is a circuit schematic of a tenth embodiment of the tuned amplifier according to the present invention.

Illustrated in FIG. 25 is a circuit schematic of a tenth embodiment of the tuned amplifier 10 comprising a phase inverter circuit 80 for inverting the phase of the input signal thereto, phase shift circuits 30L, 30C as shown in FIG. 15 or FIG. 5 and a summing circuit for summing with a predetermined ratio an input signal applied to an input terminal 90 through an input resistor 74 and a feedback signal from the subsequent stage phase shift circuit 30C through a feedback resistor 70 (wherein the resistance of the input resistor 74 is n times of that of the feedback resistor 70).

The phase inverter circuit 80 is designed to invert the phase of the input signal thereto and simultaneously amplifies the input signal by the predetermined amplification factor. As a result, the loop gain can be easily set to substantially unity (1) by adjusting amplification factors of the phase inverter circuit 80 and differential amplifiers 32 in the two phase shift circuits 30L, 30C.

As described above by reference to the second or the first embodiment, each of the two phase shift circuits 30L, 30C provide from 0° to 180° phase shift as the input signal frequency ω varies from 0 to ∞. Assuming that time constants of the LR circuit in the phase shift circuit 30L and the CR circuit in the phase shift circuit 30C are equal to each other and are, for example, T, each of the two phase shift circuits 30L, 30C. provides 90° phase shift at the frequency ω=1/T. Thus, the total phase shift of the two phase shift circuits 30L, 30C is 180°. Additionally, the phase inverter circuit 80 in the front stage inverts the phase. This means that the total loop phase shift of the signal from the subsequent stage phase shift circuit 30C becomes 0°. The output from the subsequent stage phase shift circuit 30C is fed back to the input side of the phase inverter circuit 80 in the front stage of the input stage phase shift ciucuit 30L by way of the feedback resistor 70. The feedback signal and the input signal by way of the input resistor 74 are summed with each other.

By forming such feedback loop, the overall phase shift along the loop becomes 0° at a certain frequency. The tuned operation similar to the above embodiments takes place when the loop gain of the entire tuned amplifier 9B is set to substartially unity (1) by adjusting the amplification factor of each of the phase inverter circuit 80 and the two phase shift circuits 30L, 30C.

According to this particular embodiment of the tuned amplifier 9B, as the resistance ratio n of the feedback resistor 70 and the input resistor 74 varies, the tuned frequency and gain at the frequency remain constant while only the maximum attenuation changes. On the contrary, since the maximum attenuation depends on the above resistance ratio n, controlling the variable resistors 36 in the two phase shift circuits 30L, 30C does not influence the maximum attenuation thereby enabling to adjust the tuned frequency, the gain at the frequency and the maximum attenuation without interference.

Again, as described above by reference to the second embodiment, inductors 37 may be formed on a semiconductor substrate by spiral conductors using photo etching or other technologies. The use of such inductors 37 will allow one to easily configure all of the tuned amplifier 9B on a semiconductor substrate as an integrated circuit including other components (e.g., differential amplifiers, resistors, etc.).

Also, since the time constant T of the LR circuit in the front stage phase shift circuit 30L is equal to L/R while that of the CR circuit in the subsequent stage phase shift circuit 30C is equal to CR, the resistance components R of these phase shift circuits are in denominator and numerator, respectively. This means that, it the entire tuned amplifier 9B is configured on a semiconductor substrate including FETs representing the two variable resistors 36, any drift in the tuned frequency as the result of temperature characteristic of the resistors is suppressed, thereby providing so-called temperature compensations Although the phase shift circuits 30L and 30C are respectively in the front and subsequent stage in the tenth embodiment of the tuned amplifier 9B, it is to be understood that the phase shift circuits 30C and 30L are respectively in the front and subsequent stages as long as the overall phase shift between the input and output signals is 180°.

Other Embodiments

The non-inverting circuits 50 or the phase inverter circuit 80 included in the tuned amplifier in each of the embodiments may be easily configured with a combination of transistors, operational amplifiers, resistors, etc.

Figure 26A:
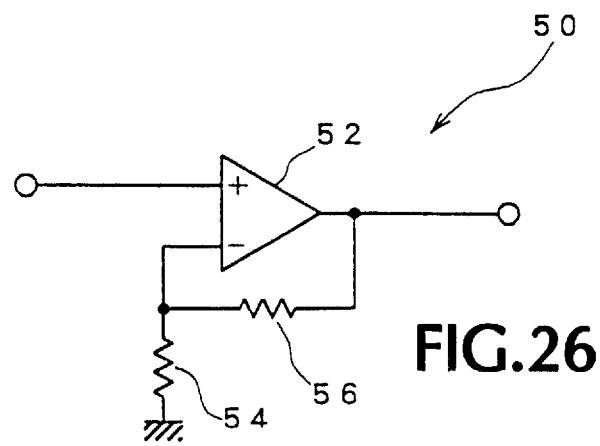
FIGS. 26A and 26B show circuit schematics of practical examples of non-inverting and inverting circuits.
Figure 26B:
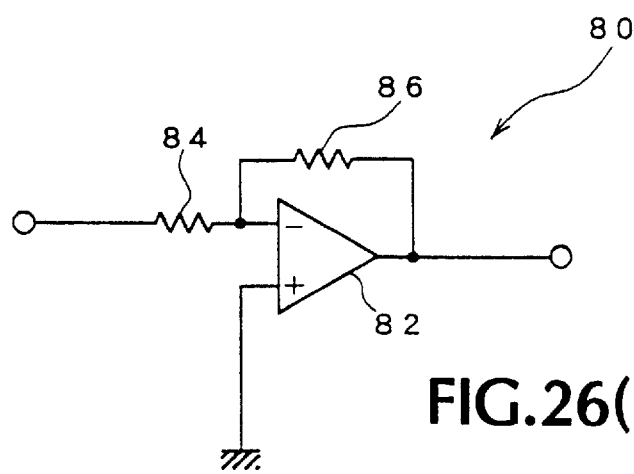

Illustrated in FIG. 26 is an example of a non-inverting circuit and a phase inverter circuit configured using an operational amplifier. The non-inverting circuit 50 as illustrated in FIG. 26(A) includes an operational amplifier 52 with its inverting terminal returned to ground by way of a resistor 54 and its inverting and output terminals connected together by way of a resistor 56. The non-inverting circuit 50 acts as a buffer having an amplification factor to be determined by the ratio of the two resistors 54, 56. An AC input signal applied to the non-inverting input terminal of the operational amplifier 52 is amplified to provide an in-phase (non-inverted) output signal from the output terminal of the operational amplifier 52.

On the other hand, the phase inverter circuit 80 as shown in FIG. 26 (B) includes an operational amplifier 82 having its inverting input terminal receiving an input signal by way of a resistor 84, its non-inverting input returned to ground and its output terminal coupled to the inverting input terminal by way of a resistor 86. The phase inverter circuit 80 has an amplification factor determined by the resistance ratio of the two resistors 84, 86. When an AC input signal is applied to the inverting input terminal of the operational amplifier 82 by way of the resistor 84, an inverted output signal is derived from the output terminal.

Each of the above tuned amplifiers comprises two phase shift circuits and a non-inverting circuit or two phase shift circuits and a phase inverter circuit. The overall phase shift of the three circuits becomes 0° at a certain frequency at which the tuned operation takes place. This means that as far as phase shift is connected, the three circuits may be connected in any desired order depending on particular need.

Illustrated in FIG. 27 are block diagrams of three different combinations of the two phase shift circuits and the non-inverting circuit to configure the tuned amplifier. It is to be noted here that a feedback impedance element 70a and an input impedance element 74a are used to sum the output and input signals of the tuned amplifier with a predetermined ratio. Typically, the feedback impedance element 70a and the input impedance element 74a are respectively the feedback resistor 70 and the input resistor 74 as shown in FIG. 1, etc.

Since the feedback impedance element 70a and the input impedance element 74a are used to sum the signals applied to these elements without introducing phase shift, the feedback impedance element 70a and the input impedance element 74a may be capacitors or inductors. Alternatively, these elements may be a combination of resistors and capacitors or inductors for simultaneously adjusting both real part and imaginary part of the impedance.

Figure 27A:
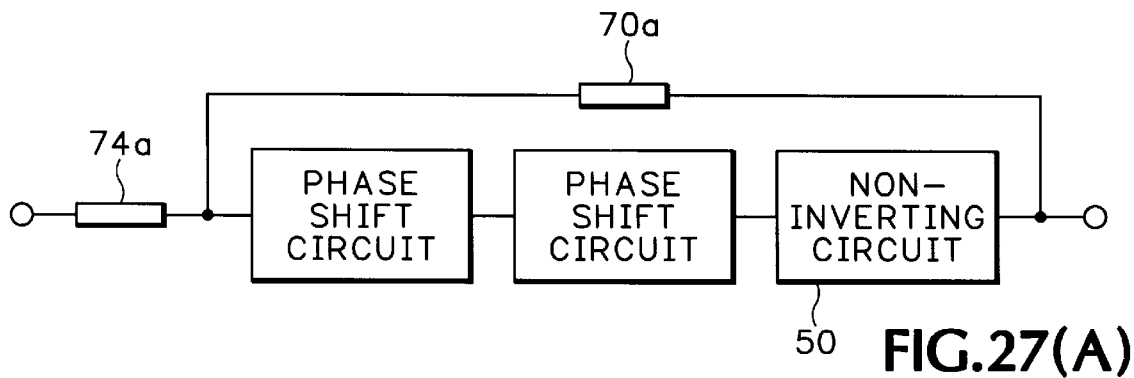
FIGS. 27A, 27B, and 27C show block diagrams of various connection configurations of the phase shift circuit and the non-inverting circuit.

Illustrated in FIG. 27(A) is a circuit arrangement where the non-inverting circuit 50 is connected at the subsequent stage of the two phase shift circuits.

Figure 27B:
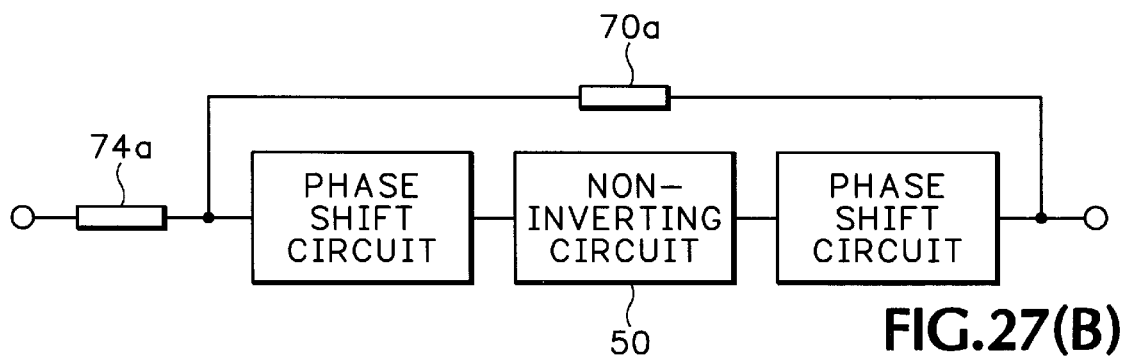

Illustrated in FIG. 27(B) is a circuit arrangement where the non-inverting circuit 50 is interposed between the two phase shift circuits. Such arrangement having the non-inverting circuit 50 in the intermediate position is effective to completely prevent interference between the front and the subsequent phase shift circuits.

Figure 27C:
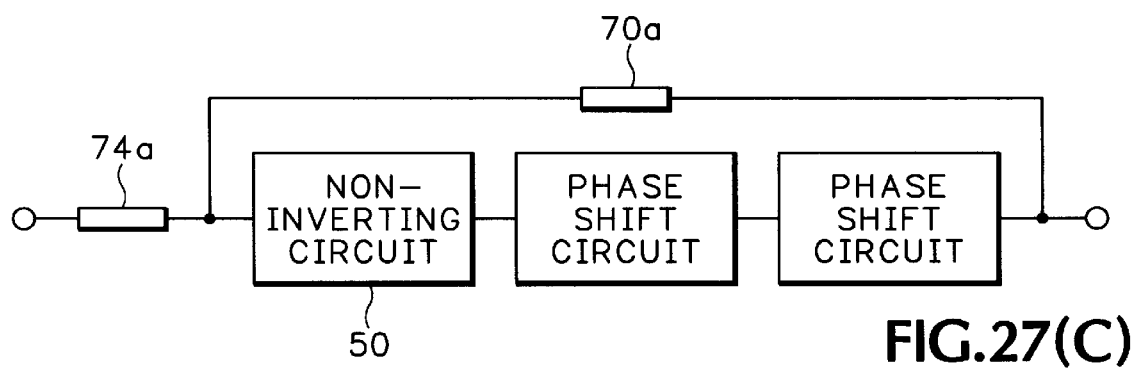

Illustrated in FIG. 27(C) is a circuit arrangement having the non-inverting circuit 50 in front of the two phase shift circuits. This particular arrangement corresponds to the tuned amplifier 1 in FIG. 1, the tuned amplifier 2 in FIG. 11, the tuned amplifier 3 in FIG. 18 and the tuned amplifier 4 in FIG. 19. Such arrangement of the non-inverting circuit 50 in the front most stage is particularly effective to minimize the effect of the feedback impedance element 70a and the input impedance element 74a to the front stage phase shift circuit.

Similarly, shown in FIG. 28 are block diagrams of different combinations of two phase shift circuits and a phase inverter circuit comprising the tuned amplifier according to the present invention. As described above by reference to FIG. 27, the feedback impedance element 70a and the input impedance element 74a are used to determine the ratio of summing the input and output signals to and from the tuned amplifier and are typically feedback resistor 70 and input resistor 74 as shown in FIG. 1 and the like. Since the feedback impedance element 70a and the input impedance element 74a are used to sum the signals applied thereto without causing any phase shift, they may be capacitors or other elements.

Figure 28A:
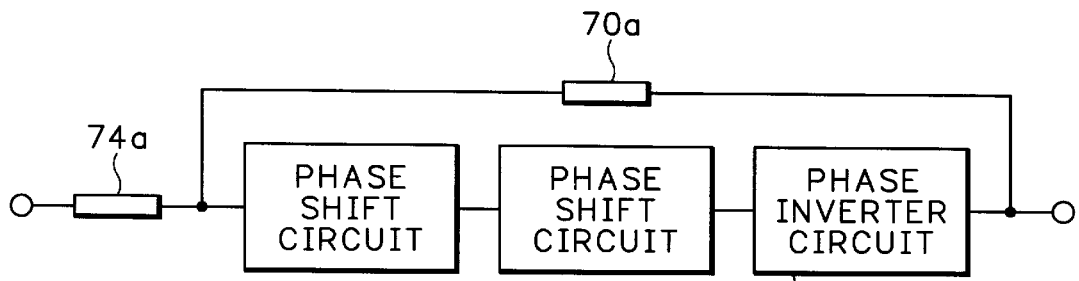
FIGS. 28A, 28B and 28C show block diagrams of various connection configurations of the phase shift circuit and the inverting circuit.

Illustrated in FIG. 28(A) is a circuit arrangement of the tuned amplifier having the phase inverter circuit 80 disposed at the subsequent stage of the two phase shift circuits. This particular arrangement having the phase inverter circuit 80 in the output stage is useful to provide an output buffer from which a large output current can be derived.

Figure 28B:
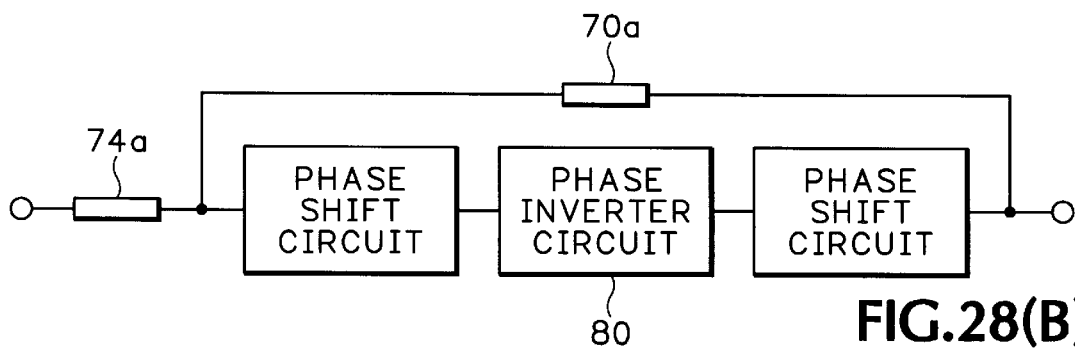

Illustrated in FIG. 28(B) is a circuit arrangement having the phase inverter circuit 80 between the two phase shift circuits, thereby preventing interference between the two phase shift circuits.

Figure 28C:
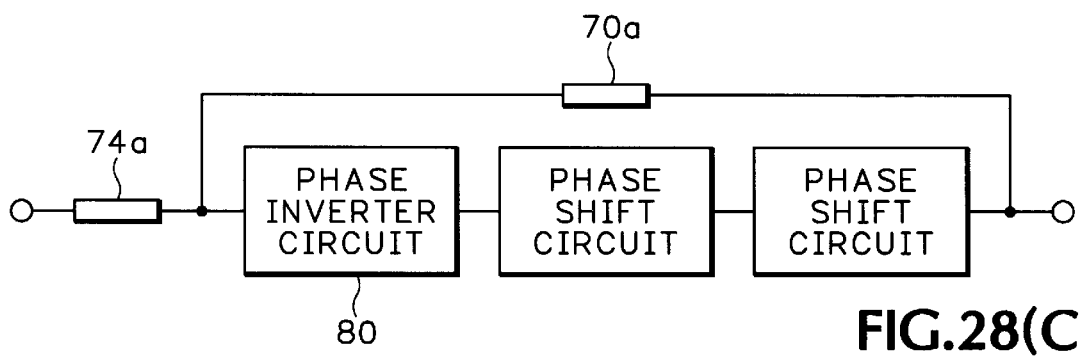

Illustrated in FIG. 28(C) is a circuit arrangement having the phase inverter circuit 80 at the front most stage, which corresponds to the tuned amplifier 5 in FIG. 20, the tuned amplifier 6 in FIG. 21, the tuned amplifier 7 in FIG. 22, the tuned amplifier 8 in FIG. 23, the tuned amplifier 9A in FIG. 24 and the tuned amplifier 9B in FIG. 25. The arrangement of the phase inverter circuit 80 at the front most stage is effective to minimize the effect of the feedback impedance element 70a and the input impedance element 74a to the front stage phase shift circuit.

The phase shift circuits in each of the above embodiments include variable resistors 16 or 36 which may be formed using junction type or MOS type FETs.

Figure 29A:
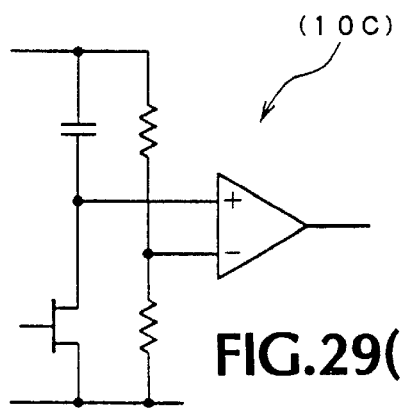
FIGS. 29A and 29B show circuit schematics with the variable resistor of the CR circuit in the phase shift circuit replaced by an FET.
Figure 29B:
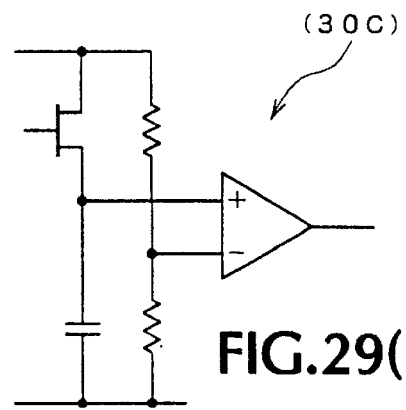

Now, illustrated in FIG. 29 are phase shift circuits including two types of phase shift circuits 10C or 30C with the variable resistors 16 or 36 replaced by an FET. FIG. 29(A) is the phase shift circuit 10C with the variable resistor 16 replaced by an FET while FIG. 29(B) shows the phase shift circuit 30C with the variable resistor 36 replaced by an FET.

Figure 30A:
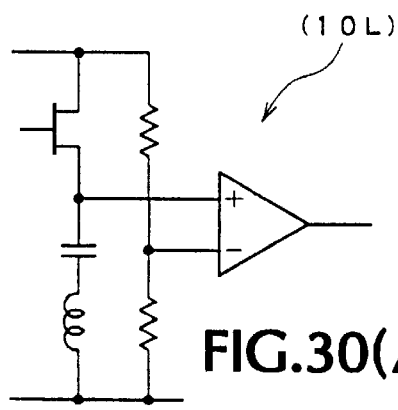
FIGS. 30A and 30B are circuit schematics of the phase shift circuit with the variable resistor in the LR circuit replaced by an FET.
Figure 30B:
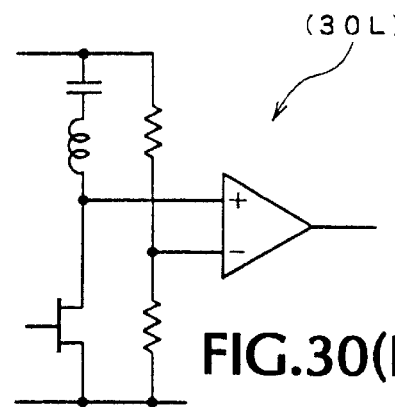

Similarly, illustrated in FIG. 30 are two types of phase shift circuits 10L, 30L each including an LR circuit with the variable resistor 16 or 36 replaced by FETs. FIG. 30(A) shows the phase shift circuit 10L with the variable resistor 16 replaced by an FET while FIG. 30(B) shows the phase shift circuit 30L with the variable resistor 36 replaced by an FET.

As described above, a channel resistance between the source and the drain electrodes of an FET is used as a replacement of the variable resistor 16 or 36. The gate voltage is controlled to adjust the channel resistance over a certain range, thereby controlling the phase shift of each phase shift circuit. This changes the frequency at which the phase shift along the loop of the tuned amplifier becomes 0°, thereby controlling the tuned frequency of the tuned amplifier to any desired value.

Although the variable resistance in each phase shift circuit in FIG. 29 and FIG. 30 is formed by a single p-channel or n-channel FET, a single variable resistor may be formed by a parallel combination of a p-channel FET and an n-channel FET, wherein gate voltages of the same magnitude but opposite in polarity are applied between the gate and the substrate of the FETs. The gate voltages are adjusted to control the resistance. Such variable resistor including a combination of two FETs improves non-linearity of an FET, thereby minimizing distortion in tuning output.

Also, in each of the above embodiments, the phase shift is varied by varying the variable resistor 16 or 36 connected in series with the capacitor 14 or 34 in the phase shift circuit 10C or 30C for controlling the tuned frequency. However, a variable capacitance element may be used as the capacitor 14, 34 to control the tuned frequency by varying the capacitance of such element.

Fig.31 illustrates phase shift circuits 10C or 30C with the capacitor 14 or 34 replaced by variable capacitance diodes. Illustrated in FIG. 31(A) is one of the phase shift circuits 10C as shown in FIG. 1 with the variable resistor 16 replaced by a fixed resistor and with the capacitor 14 replaced by a variable capacitance diode. Illustrated in FIG. 31(B) is another phase shift circuit 30C in FIG. 1 with the variable resistor 36 and the capacitor 34 replaced by a fixed resistor and a variable capacitance diode, respectively.

Figure 31A:
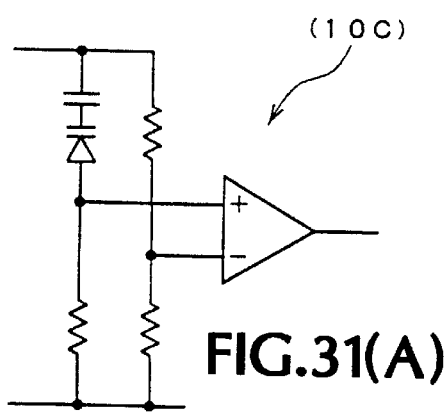
FIGS. 31A, 31B, 31C, and 31D show circuit schematics of the phase shift circuit with the capacitor in the CR circuit replaced by a variable capacitance diode.
Figure 31B:
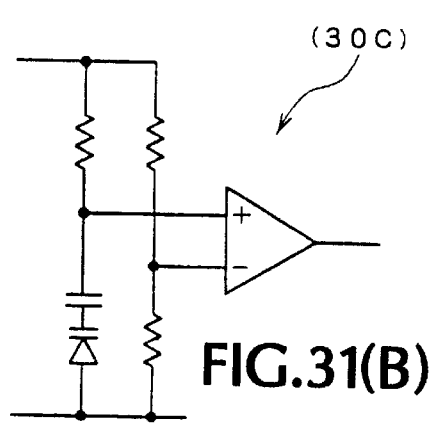

In FIG. 31(A) and (B), the capacitors connected in series with the variable capacitance diodes are used to block DC component of the reverse bias voltage to be applied between the anode and the cathode of each of the variable capacitance diodes. The impedance of such series capacitors is chosen to be fairly low at the operation frequency. In other words, they have a large capacitance. Also, since DC components in potential on both ends of the capacitors in FIG. 31(A) and (B) are constant, application of a reverses bias voltage larger than the AC component between the anode and the cathode of the variable capacitance diode helps to operate such diode as a variable capacitor.

In this manner, the capacitor 14 or 34 is replaced by a variable capacitance diode and the reverse bias voltage between the anode and the cathode is controlled to vary the capacitance of the variable capacitance diode to control the phase shift in a certain range. The tuned frequency of the tuned amplifier is controlled to any desired value by adjusting the frequency in which the phase shift along the loop of the tuned amplifier is 0°.

Although a variable capacitance diode is used in the embodiment in FIG. 31 (A) and (B), a fixed DC potential may be applied to the source and the drain while applying a variable voltage to the gate of the FET. Since the potentials on both ends of the variable capacitance diode in FIG. 31 (A) and (B) are fixed, such variable capacitance diode can be replaced by an FET. By varying the gate voltage, the gate capacitance, i.e., the capacitance of the FET can be varied.

Also, although only the capacitance of the variable capacitance diode is varied in FIG. 31(A) and (B), the resistance of the variable resistor 16 or 36 can be varied simultaneously.

Figure 31C:
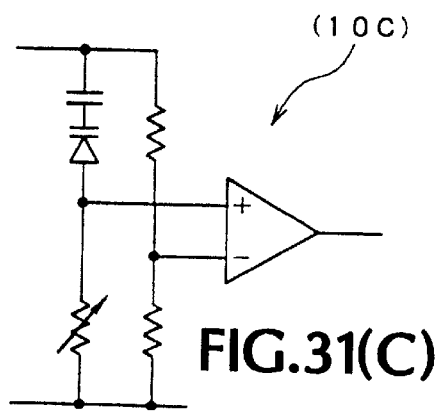
Figure 31D:
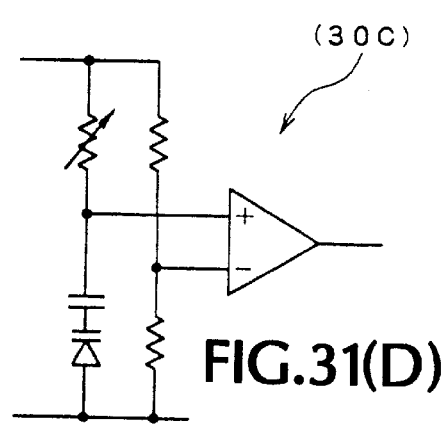

Shown in FIG. 31(C) is one of the phase shift circuits 10C as shown in FIG. 1, wherein the variable resistor 16 is used and the capacitor 14 is replaced by a variable capacitance diode. Shown in FIG. 31(D) is the other phase shift circuit 30C in FIG. 1 using the variable resistor 36 and a variable capacitance diode replacing the capacitor 34. The variable capacitance diode may be replaced by a variable gate capacitance FET.

It is of course possible to form the variable resistors in FIG. 31(C) and (D) using channel resistance of an FET as shown in FIG. 29. Especially, if a variable resistor is formed using a parallel connection of a p-channel and an n-channel FETs by applying gate voltages of equal magnitude and opposite polarity between the base and the substrate, the non-linear area of the FET is improved, thereby minimizing distortion of the tuning signal.

Even if such combination of a variable resistor and a variable capacitance element is used to configure the phase shift circuit, the phase shift of each phase shift circuit can be controlled by adjusting the resistance of the variable resistor and the capacitance of the variable capacitance element over a certain range. In this manner, the frequency to provide 0° phase shift along the loop of each tuned amplifier can be varied, thereby providing a controllable tuned frequency of the tuned amplifier.

In case of fabricating each embodiment of the tuned amplifier 1 and the like on a semiconductor substrate, the capacitors 14, 34 in the phase shift circuits 10C, 30C cannot be set to a large capacitance. However, apparent capacitance of the capacitors formed on a semiconductor substrate can be increased electronically, thereby increasing the time constant T and reducing the tuned frequency of the tuned amplifier.

Figure 32:
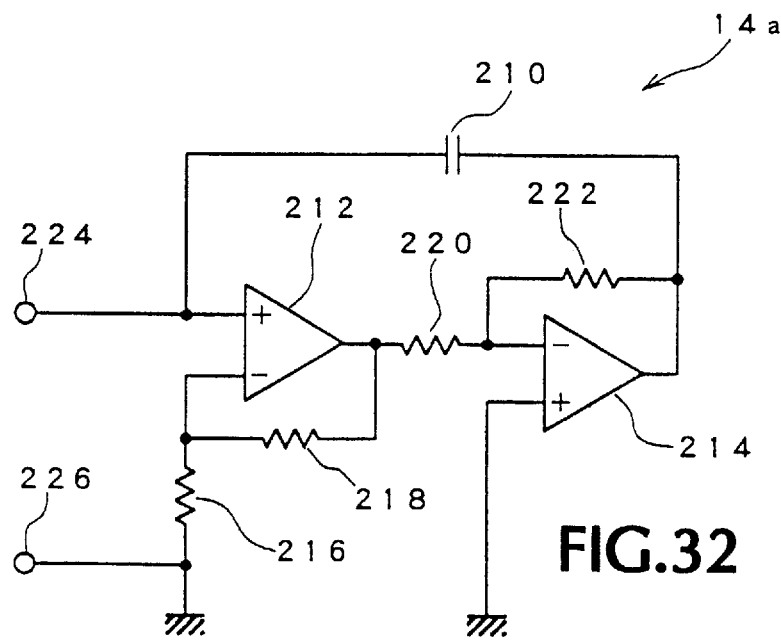
FIG. 32 is a circuit schematic of a capacitance converter circuit to be used in the tuned amplifier of the present invention.

Now, illustrated in FIG. 32 is a modified circuit schematic to replace the discrete capacitor 14, 34 used in the phase shift circuits 10C, 30C in FIG. 1, which is a capacitance converter circuit to increase the apparent capacitance of the capacitor fabricated on a semiconductor substrate. The circuit as shown in FIG. 32 corresponds to the capacitor 14 or 34 included in the phase shift circuits 10C, 30C.

The capacitance converter circuit 14a as shown in FIG. 32 comprises a capacitor 210 having a given capacitance C0, two operational amplifiers 212, 214 and four resistors 216, 218, 220 and 222.

The first stage operational amplifier 212 has an output terminal and an inverting terminal coupled together by way of a resistor 218 (having a resistance R18) and the inverting terminal is returned to ground through the resistor 216 (having a resistance R16).

The relationship as given by the following expression (26) does exist between the voltage E1 applied to the non-inverting input terminal of the first stage operational amplifier and the output voltage E2 from the output terminal:

$$E2 = 1 + \frac{R18}{R16} \cdot E1 \qquad (26)$$

The first stage operational amplifier 212 is primarily for impedance conversion and acts as a buffer with a unity (1) gain. This occurs when R18/R16 =0, i.e., R16 is $\infty$ (removing the resistor 216) or R18=0 $\Omega$ (direct coupling).

The second stage operational amplifier 214 has a resistor 222 (R22) between its output and inverting input terminals and its non-inverting input terminal returned to ground. A resistor 220 (R20) is interposed between the inverting input terminal of the second stage operational amplifier 214 and the output terminal of the second stage operational amplifier 212.

Let the output voltage appearing on the output terminal of the second stage operational amplifier 214 be E3. Then, there is the following relationship between the voltage E3 and the voltage E2 appearing on the output terminal of the first stage operational amplifier 212:

$$E3 = -\frac{R22}{R20} E2 \qquad (27)$$

This means that the second stage operational amplifier 214 operates as an inverting amplifier and that the first stage operational amplifier 212 is used to increase the input impedance of the second stage.

Also, there is connected a capacitor 210 having the above mentioned capacitance between the non-inverting input terminal of the first stage operational amplifier 212 and the output terminal of the second stage operational amplifier 212.

Figure 33:
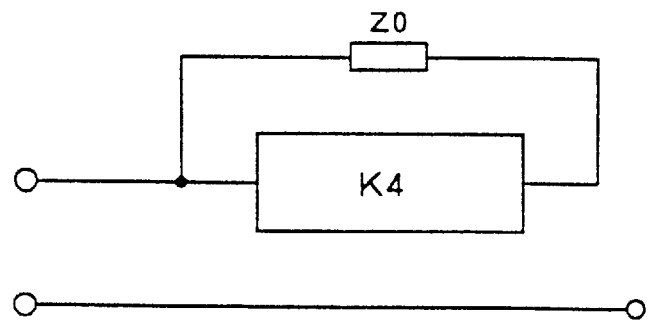
FIG. 33 is a circuit diagram of the capacitance converter circuit in FIG. 32 represented by the transfer function K.
Figure 34:
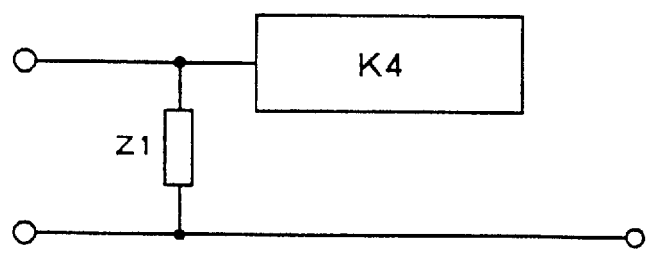
FIG. 34 is a circuit schematic of the circuit in FIG. 33 converted in accordance with the Miller's principle.

In the capacitance converter circuit 14a as shown in FIG. 32, let the transfer function of the entire circuit excluding the capacitor 210 be K4, Then, the capacitance converter circuit 14a can be represented by a circuit schematic as shown in FIG. 33, which can be converted to a circuit schematic as shown in FIG. 34 by applying the Miller's principle.

Now, the impedance Z1 in FIG. 34 can be given by the following expression (28) by using the impedance Z0 in FIG. 33:

$$Z1 = \frac{Z0}{1 - K4} \qquad (28)$$

In case of the capacitance converter circuit 14a as shown in FIG. 32, the impedance Z0=1/(jωC0). This is substituted for the expression (28) to obtain the following expression (29):

$$Z1 = \frac{\frac{1}{j\omega C0}}{1 - K4} = \frac{1}{j\omega\{(1 - K4)C0\}} \qquad (29)$$

$$C = (1 - K4)C0 \qquad (30)$$

The above expression (30) shows that the apparent capacitance of the capacitor 210 in the capacitance converter circuit 14a is (1–K4) times of the actual capacitance C0 of the capacitor 210.

If the gain K4 is negative, (1–K4) is always larger than 1, thereby increasing the capacitance C0.

Incidentally, the gain of the capacitance converter circuit 14a in FIG. 32, i.e., the gain K4 of the amplifier comprising the operational amplifiers 212 and 214 is given by the following expression (31) by using the above expression (26) and (27):

$$k4 = -\left(1 + \frac{R18}{R16}\right) \cdot \frac{R22}{R20} \tag{31}$$

By replacing the expression (31) into the expression (30)

$$C = \left\{1 + \left(1 + \frac{R18}{R16}\right) \cdot \frac{R22}{R20}\right\} C0 \tag{32}$$

This means that the apparent capacitance C between the two terminals 224, 226 can be set to any desired large value by choosing the four resistors 216, 218, 220 and 222.

When the gain of the amplifier including the first stage operational amplifier 212 is unity (1), i.e., R16=∞ or R18=0 to achieve R18/R16=0 as mentioned above, the above expression (32) can be simplified as follows:

$$C = \left(1 + \frac{R22}{R20}\right) C0 \tag{33}$$

Figure 35:
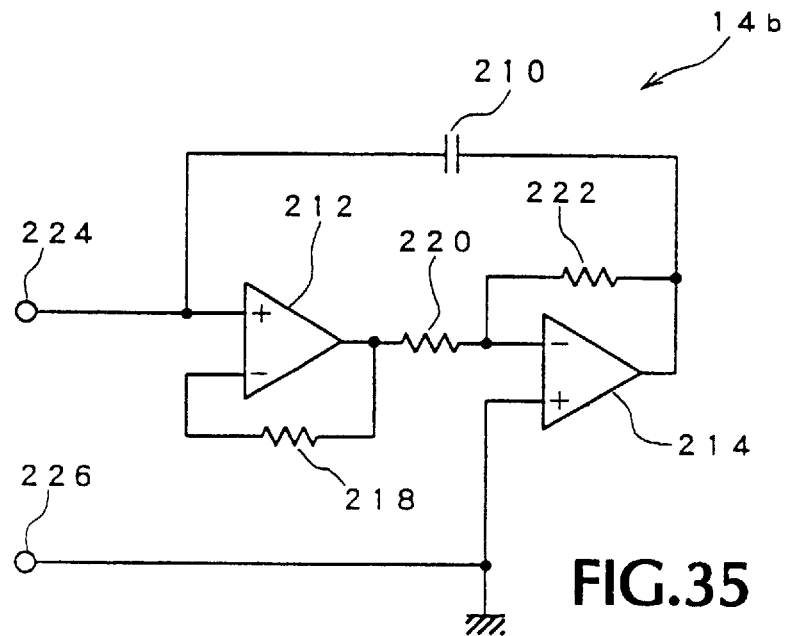
FIG. 35 is a simplified circuit schematic of the capacitance converter circuit illustrated in FIG. 32.

Now, illustrated in FIG. 35 is another capacitance converter circuit 14b excluding the resistor 216 connected to the inverting input terminal of the first operational amplifier 212 in FIG. 32. In this case, since the capacitance C between the terminals 224 and 226 is represented by the expression (33), C0 can be increased by increasing the ratio R22/R20.

As described above, the capacitance converter circuit 14a or 14b increases apparent capacitance of the capacitor 210 formed on a semiconductor substrate by varying the resistance ratio R22/R20 of the two resistors 220, 222 or the resistance ratio R18/R16 of the two resistors 216, 218. In a case of forming the entire tuned amplifier 1 and the like in FIG. 1 on a semiconductor substrate, a capacitor 210 having a small capacitance $C_0$ is formed on a semiconductor substrate and the circuit as shown in FIG. 32 or FIG. 35 is used to provide a large apparent capacitance C and thus suitable for integrated circuit.

Also, at least one of the resistors 216, 218, 220 and 222 (or at least one of the resistors 220 and 222 in the capacitance converter circuit 14b in FIG. 35) is formed as a variable resistor, preferably a junction type FET, a MOS type FET or a parallel combination of a p=channel FET and an n-channel FET in order to configure a capacitance converter circuit for easily varying its capacitance. Such capacitance converter circuit may be replaced for a variable capacitance diode shown in FIG. 31, thereby varying the phase shift in a certain range. For this end, the frequency to provide 0° overall phase shift of the tuned amplifier can be controlled, thereby providing desired tuned frequency of the tuned amplifier in each of the above embodiments.

As described above, the first stage operational amplifier 212 is used as a buffer to increase the input impedance. As a result, the operational amplifier 212 may be replaced by an emitter follower circuit or a source follower circuit.

Figure 36:
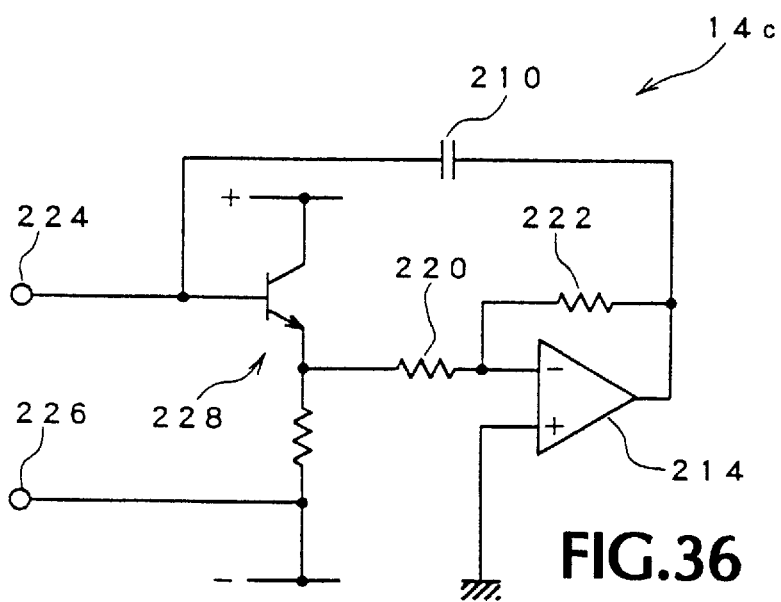
FIG. 36 is a circuit schematic of the capacitance converter circuit using an emitter follower at the input stage.

Illustrated in FIG. 36 is a capacitance converter circuit 14C having an emitter follower circuit in the first stage, in which the first stage operational amplifier and two resistors 216, 218 as shown in FIG. 32 are replaced by an emitter follower circuit 228 comprising a bipolar transistor and a resistor.

Figure 37:
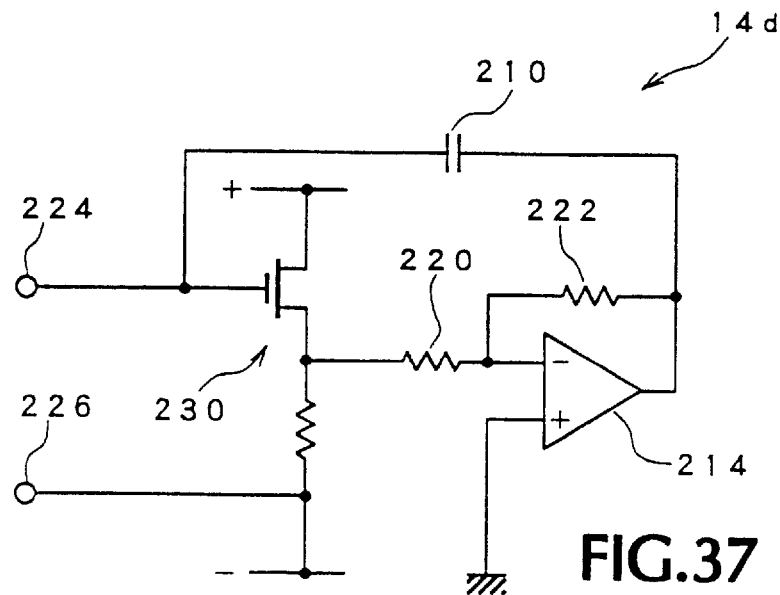
FIG. 37 is a circuit schematic of the capacitance converter circuit using a source follower circuit at the input stage.

Illustrated in FIG. 37 is a capacitance converter circuit 14d having a source follower circuit in the front stage, in which the first stage operational amplifier 212 and two resistors 216, 218 as shown in FIG. 32 are replaced by a source follower circuit 230 comprising an FET and a resistor.

The above described capacitance converter circuit 14c, 14d are similar to the capacitance converter circuit 14a as shown in FIG. 32 in that the apparent capacitance C between the terminals 224, 226 can be controlled by varying the resistance ratio of the resistors 220, 222 connected to the operational amplifier 214. However, replacement of at least one of the resistors 220, 222 by a junction type FET, a MOS type FET or a parallel combination of a p-channel FET and an n-channel FET realizes a capacitance converter circuit with variable capacitance. Such variable capacitance converter circuit can be used as a replacement of the variable capacitance diode in FIG. 31 for controlling the phase shift in a certain range. The tuned frequency of the tuned amplifier can be controlled by varying the frequency at which the overall phase shift of the tuned amplifier becomes 0°.

In the above FIGS. 32 through 37, the apparent capacitance of an actual capacitor is increased by using a combination of an amplifier having a given gain and a capacitor. It is also true that the capacitor is replaced by an inductor to increase apparent inductance.

As described above, the impedance $Z_0$ in FIG. 33 is used and the impedance Z1 in FIG. 34 is represented by the expression (28). In case of an inductor having an inductance $L_0$, its impedance $Z_0 = j\omega L_0$ is replaced in the above expression (28) to obtain the following expression (34):

$$Z1 = \frac{j\omega L0}{1 - K4} = j\omega \cdot \frac{L0}{1 - K4} \tag{34}$$

$$L = \frac{L0}{1 - K4} \tag{35}$$

The expression (35) proves that the apparent inductance is equal to $1/(1-K_4)$ times of the actual inductance of the inductor. If the gain K4 is set between 0 and 1, the apparent inductance is increased.

Figure 38:
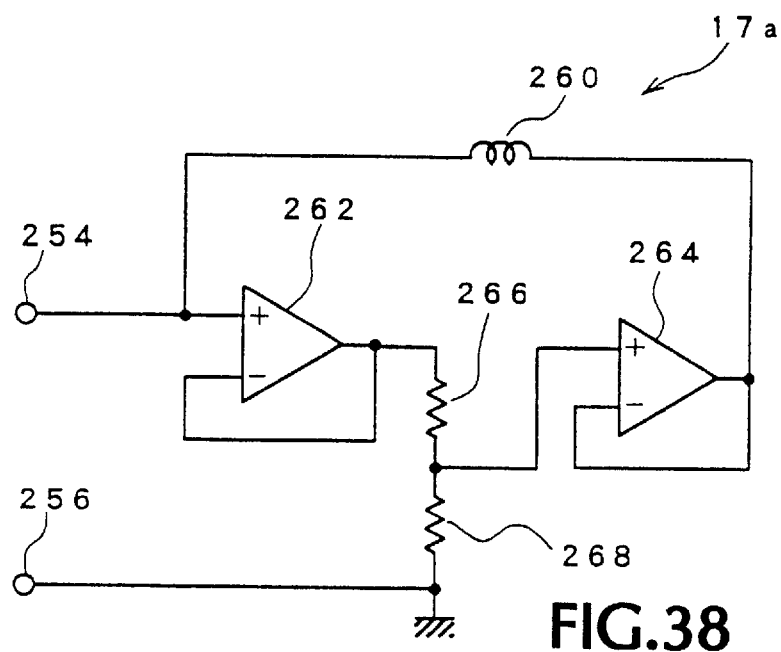
FIG. 38 is a circuit schematic of an inductance converter circuit to be used in the tuned amplifier of the present invention.

Illustrated in FIG. 38 is a modified circuit schematic of the phase shift circuit 10L, 30L in FIG. 12 having a circuit to replace the discrete inductor 17 or 37. This circuit operates as an inductance converter circuit to increase the apparent inductance of the inductor formed on a semiconductor substrate. Note that the entire circuit in FIG. 38 corresponds to the inductor 17 or 37 in the phase shift circuit 10L, 30L.

The inductance converter circuit 17a as shown in FIG. 38 comprises an inductor 260 having a certain inductance L0, two operational amplifiers 262, 264 and two resistors 266, 268.

The front stage operational amplifier 262 is a non-inverting amplifier having its output terminal connected to the input terminal to provide a unity (1) gain, thereby primarily acting as a buffer for impedance conversion. Similarly, the second stage operational amplifier 264 acts as a unity (1) gain non-inverting amplifier by coupling its output terminal to its input terminal. Connected between these two non-inverting amplifiers is a voltage divider comprising two resistors 266, 268.

Such insertion of the voltage divider allows one to set the gain of the entire amplifier including the two non-inverting amplifiers to any desired value between 0 and 1.

In the inductance converter circuit 17a as shown in FIG. 38, let the transfer function of the entire circuit (amplifier) excluding the inductor 260 be K4. Then, the gain K4 is determined by the dividing ratio of the voltage divider comprising the resistors 266, 268 having resistance R66 and R68, respectively.

$$K4 = \frac{R68}{R66 + R68} \quad (36)$$

The gain K4 is replaced in the above expression (35) to obtain the apparent inductance L:

$$L = \frac{L0}{1 - \frac{R68}{R66 + R68}} = \left\{ 1 + \frac{R68}{R66} \right\} \cdot L0 \quad (37)$$

This means that the apparent inductance L between the two terminals 254, 256 can be increased depending on the resistance ratio R68/R66 of the two resistors 266 and 268. When R68=R66, for example, the above expression (37) proves that apparent inductance L is equal to twice of L0 (L=2L0).

As understood from the above description, the inductance converter circuit 17a can increase the apparent inductance L of the actual inductance of the inductor 260 by controlling the dividing ratio of the voltage divider interposed between the two non-inverting amplifiers. This is particularly effective when forming the entire tuned amplifier 2 in FIG. 11 by using a spiral conductor as the inductor 260 having a small inductance L0 on a semiconductor substrate. If the inductance can be increased in the above manner, the tuned frequency of the tuned amplifier 2 as shown in FIG. 11 can be reduced to a relatively low frequency range. Also, integration of the entire tuned amplifier is effective to minimize the installation area and to reduce material cost.

It is to be noted that the voltage divider comprising the resistors 266, 268 may be variable by replacing at least one of the two resistors 266, 268 by a variable resistor, more practically to a junction type FET, a MOS type FET or a parallel combination of a p-channel FET and an n-channel FET, thereby continuously controlling the dividing ratio. In this case, the gain of the entire amplifier including the operational amplifiers 262, 264 in FIG. 38 can be controlled, thereby continuously varying the apparent inductance L between the terminals 254, 256. This changes the frequency at which the phase shift along the tuned amplifier becomes 0°, thereby controlling the tuned frequency of the above tuned amplifier to a desired value.

Also, since the overall gain of the amplifier including the two operational amplifiers 262, 264 of the inductance converter circuit 17a in FIG. 38 can be set to unity (1) or less, the overall circuit may be replaced by an emitter follower circuit or a source follower circuit.

Figure 39A:
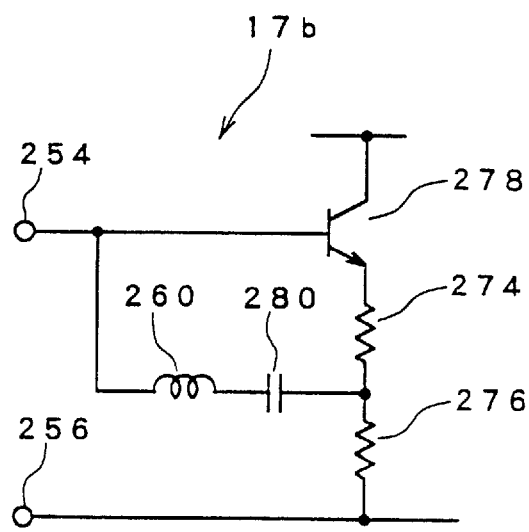
FIGS. 39A and 39B are circuit schematics of an inductance converter circuit replacing the amplifier including a pair of operational amplifiers in FIG. 38 by an emitter follower circuit.

Illustrated in FIG. 39 is an alternative inductance converter circuit with the entire amplifier including the operational amplifiers 262, 264 replaced by an emitter follower circuit. The inductance converter circuit 17b as shown in FIG. 39(A) comprises a bipolar transistor 278 having two resistors 274, 276 connected to the emitter and an inductor 260 and a DC current blocking capacitor 280 connected between the base of the transistor 278 and a dividing point of the two resistors 274, 276. The capacitor 280 connected to one end of the inductor 260 has very small impedance (i.e., large capacitance) at the operation frequency so that the frequency characteristic is not affected.

The gain of the above described emitter follower circuit is determined by primarily two resistors 274, 276 and is less than unity (1). As apparent from the above expression (35), the actual inductance L0 of the inductor 260 is increased in apparent. Also, since only one emitter follower circuit is needed, this is very simple in circuit configuration and the maximum operation frequency may be set to high.

Figure 39B:
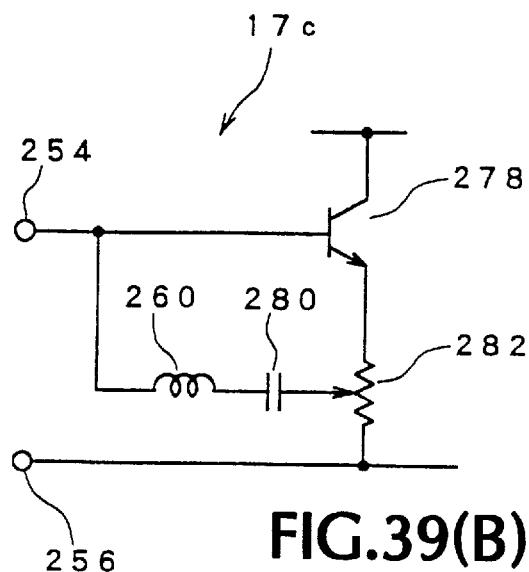

Shown in FIG. 39(B) is a modification of the emitter follower circuit in FIG. 39(A) and differs therefrom in replacing the two resistors 274, 276 by a variable resistor (potentiometer) 282. The use of such variable resistor 282 is effective to continuously change the gain and also continuously controlling the apparent inductance L. If the inductance converter circuit 17c is used as a variable inductor, phase shift of each phase shift circuit can be adjusted within a given range. This enables to vary the frequency at which the phase shift along the loop of the tuned amplifier becomes 0°, thereby enabling to alter the tuned frequency of the tuned amplifier to any frequency.

Although the inductance converter circuit 17c as shown in FIG. 39(B) replaces the two resistors 274, 276 in FIG. 39(A) by a single variable resistor 282, only one of the two resistors 274, 276 may be replaced by a variable resistor.

Figure 40A:
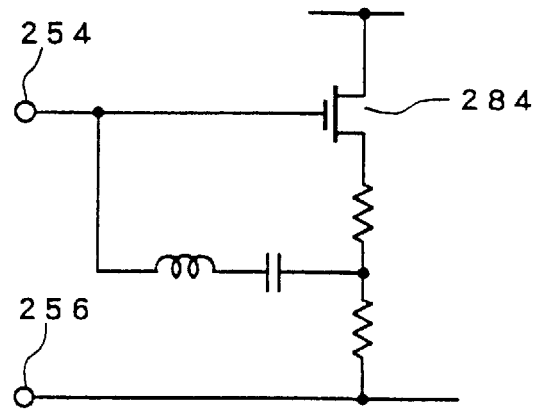
FIGS. 40A and 40B are circuit schematics of the inductance converter circuit in FIG. 39 incorporating a source follower circuit.
Figure 40B:
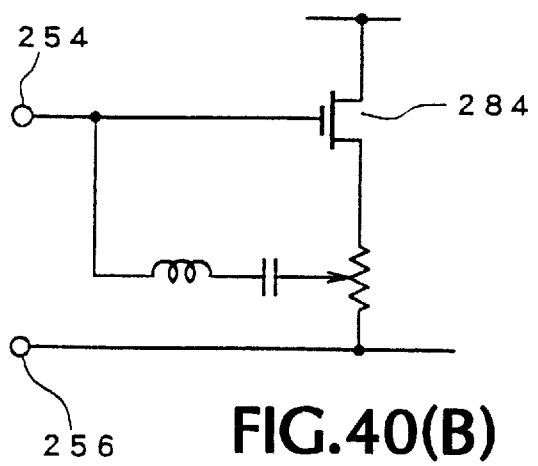

Illustrated in FIG. 40 are modifications of the inductance converter circuits 17b and 17c as shown in FIG. 39(A) and (B) by using a source follower circuit, i.e., replacing the bipolar transistor 278 by an FET 284. The circuits in FIG. 40(A) and (B) correspond to the circuits in FIG. 39(A) and (B), respectively.

Figure 41:
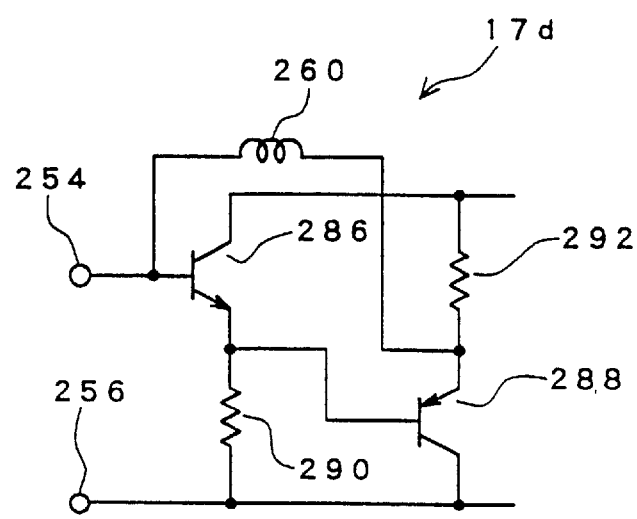
FIG. 41 is a circuit schematic of another example of the inductance converter circuit.

Illustrated in FIG. 41 is a modification of the inductance converter circuit 17a as shown in FIG. 38. The inductance converter circuit 17d in FIG. 41 comprises an npn bipolar transistor 286, a resistor 290 connected to the emitter thereof, a pnp bipolar transistor 288, its emitter resistor 292 and an inductor 260 having inductance L.

One transistor 286 and its emitter resistor 290 constitute a first emitter follower circuit while the other transistor 288 and its emitter resistor 292 constitute a second emitter follower circuit. The both emitter follower circuits are connected in a cascade manner. The use of the npn transistor 286 and the pnp transistor 288 helps to substantially equalize potentials on the base of the transistor 286 and on the emitter of the transistor 288 which are coupled to both ends of the inductor 260, thereby eliminating the need for a DC blocking capacitor.

It is to be understood that various modifications may be made on each of the above embodiments.

For example, although the differential amplifiers 12, 32 in the phase shift circuits 10C, 10L or 30C, 30L amplify the voltage difference between the two inputs by the factor of two (2) in each of the above embodiments of the tuned amplifier to set the loop gain thereof to substantially unity (1), amplification factors of the differential amplifiers 12, 32 may be set to different value. For example, each differential amplifier 12, 32 does not amplify the difference of the two inputs or amplify by any amplification factor other than 2 but the amplification factor of the non-inverting circuit 50 or the phase inverter circuit 80 is adjusted to set the loop gain of the tuned amplifier to substantially unity (1).

Also, in each of the tuned amplifiers as shown in FIG. 1 and other figures, a fixed feedback resistor 70 is employed as the feedback impedance element and a fixed input resistor 74 as the input impedance element. However, at least one of the resistors may be a variable resistor for controlling the maximum attenuation. In this case, the variable resistor may be a channel resistance of an FET as shown in FIG. 29, more preferably a parallel combination of a p-channel FET and an n-channel FET to which voltages of the same amplitude but opposite polarity are applied between the base and the substrate thereof. In this manner, non-linear characteristic of an FET can be improved and distortion in the tuned signal may be minimized.

Similarly, in case of using capacitors as the feedback and input impedance elements, at least one of the capacitors may be a variable resistance diode or a variable gate capacitance FET for arbitrarily controlling the maximum attenuation.

Although a pair of phase shift circuits are included in the tuned amplifier 1 and the like in each of the above embodiments, the tuned frequency can be controlled by adjusting at least one resistor and capacitor or inductor in the CR or LR circuit in both of the phase shift circuits. Alternatively, at least one of the resistor and capacitor or inductor in one of the CR or LR circuit in either one of the phase shift circuits may be controlled. If it is desirable, the variable resistor in each of the phase shift circuits in FIG. 1 and the like may be replaced by a fixed resistor to constitute a tuned amplifier of a fixed tuned frequency.

(Industrial Usage of the Invention)

As apparent from the above descriptions of preferred embodiments of the present invention, the tuned amplifier according to the present invention can be implemented in an integrated circuit including all elements. This suggests that the entire tuned amplifier may be integrated on a semiconductor substrate and less expensive because of quantity production.

Especially, the variable resistor constituting the CR or LR circuit in each of the phase shift circuits may be replaced by the channel resistance between the source and the drain of an FET which can be controlled depending on the control voltage to be applied to the gate of such FET. In this way, any adverse effect of the wiring to apply the control voltage and associated inductance and capacitance thereof may be avoided, thereby obtaining a tuned amplifier with an ideal operation characteristic.

Also, since the tuned amplifier according to the present invention provides the maximum attenuation determined by the ratio of the input impedance element and the feedback impedance element and also the tuned frequency determined by the time constant of the CR or LR circuit in each phase shift circuit, the maximum attenuation, the tuned frequency and the gain at the tuned frequency are set without interference.

If the capacitor of the CR circuit in the phase shift circuit is replaced by a capacitance converter circuit and if the inductor of the LR circuit in the phase shift circuit is replaced by an inductance converter circuit, apparent capacitance or inductance can be easily increased, thereby enabling to reduce the tuned frequency and to miniaturize the entire tuned amplifier.

In a conventional tuned amplifier using an LC resonance circuit, the tuned or resonance frequency ω=1√LC. If the capacitance C or the inductance L is varied in order to control the tuned frequency, the tuned frequency varies in a square root of LC. On the contrary, the tuned amplifier according to the present invention varies in proportion to the resistance of the resistors in the two phase shift circuits, thereby controlling the tuned frequency over wide range.

We claim:

1. A tuned amplifier comprising:
    a summing circuit including an input impedance element to receive an input signal at one end thereof and a feedback impedance element to receive a feedback signal at one end thereof to add the input signal and the feedback signal; and
    a pair of phase shift circuits each including a first series circuit of first and second resistors of substantially equal resistance across which an input AC signal is applied, a second series circuit of a third resistor and a capacitor across which the input AC signal is applied, and a differential amplifier for amplifying by a predetermined amplification factor a potential difference on the junction of said first and second resistors and on the junction of said third resistor and said capacitor;
    wherein said pair of phase shift circuits are connected in any order in a cascade manner to apply the added signal from said summing circuit to the front stage of said pair of phase shift circuits, the output signal from the subsequent stage phase shift circuit is applied to the one end of said feedback impedance element as the feedback signal, and an output is derived from the one of said pair of phase shift circuits in the subsequent stage.

2. The tuned amplifier of claim 1, wherein said third resistor and said capacitor in said second series circuit are connected in opposite series relationship to each other in said pair of phase shift circuits.

3. The tuned amplifier of claim 1, wherein said input and feedback impedance elements are resistors with one of said resistors being variable for controlling the maximum attenuation by varying the resistance ratio of said input and feedback impedance elements.

4. The tuned amplifier of claim 3, wherein said variable resistor comprises a channel of an FET capable of controlling its channel resistance by adjusting the gate voltage.

5. The tuned amplifier of claim 3, wherein said variable resistor comprises a parallel connection of a p-channel FET and an n-channel FET capable of controlling the channel resistances by applying gate voltages of different polarity to said FETs.

6. The tuned amplifier of claim 1, wherein said third resistor of at least one of said pair of phase shift circuits comprises a channel of an FET which can control the tuned frequency by adjusting the gate voltage for adjusting the channel resistance.

7. The tuned amplifier of claim 1, wherein said third resistor of at least one of said pair of phase shift circuits is formed with a parallel connection of a p-channel FET and an n-channel FET which controls the tuned frequency by varying the gate voltages of different polarity for adjusting the channel resistances.

8. The tuned amplifier of claim 1, wherein said capacitor in at least one of said pair of phase shift circuits is a capacitance converter circuit comprising a negative gain amplifier, and a capacitor element connected in parallel between the output and input of said amplifier.

9. The tuned amplifier of claim 1 wherein the entire circuit is implemented in an integrated circuit.

10. The tuned amplifier of claim 2 wherein the entire circuit is implemented in an integrated circuit.

11. The tuned amplifier of claim 3 wherein the entire circuit is implemented in an integrated circuit.

12. The tuned amplifier of claim 4 wherein the entire circuit is implemented in an integrated circuit.

13. The tuned amplifier of claim 5 wherein the entire circuit is implemented in an integrated circuit.

14. The tuned amplifier of claim 6 wherein the entire circuit is implemented in an integrated circuit.

15. The tuned amplifier of claim 7 wherein the entire circuit is implemented in an integrated circuit.

16. The tuned amplifier of claim 8 wherein the entire circuit is implemented in an integrated circuit.

17. A tuned amplifier comprising:
    a summing circuit including an input impedance element to receive an input signal at one end thereof and a feedback impedance element to receive a feedback signal at one end thereof for summing the input signal and the feedback signal;
    a pair of phase shift circuits each including a first series circuit of first and second resistors having substantially equal resistance to receive an input AC signal thereacross and a second series circuit of a third resistor and a capacitor to receive the input AC signal thereacross, and a differential amplifier to amplify by a given amplification factor a potential difference on the junction point of said first and second resistors and the junction point of said third resistor and said capacitor; and a non-inverting circuit to output the input AC signal without changing the phase;

wherein said pair of phase shift circuits and said non-inverting circuit are connected in any order in a cascade manner, the summed signal from said summing circuit is applied to the front stage circuit of said plurality of cascade connected circuits, the output signal from the final stage circuit is applied to one input of said feedback impedance element as the feedback signal, and the output from the one of said cascade connected circuits in the final stage is derived as the tuned signal.

18. The tuned amplifier of claim 17, wherein said third resistor and said capacitor in said second series circuit are connected in opposite series relationship in said pair of phase shift circuits.

19. The tuned amplifier of claim 17, wherein said input andfeedback impedance elements are resistors, at least one of said resistors is a variable resistor, and the resistance ratio of said input and feedback impedance elements is varied to control the maximum attenuation.

20. The tuned amplifier of claim 19, wherein said variable resistor is composed of a channel of an FET capable of controlling the channel resistance depending on the gate voltage.

21. The tuned amplifier of claim 19, wherein said variable resistor is formed by a parallel connection of a p-channel FET and an n-channel FET for controlling the channel resistances by varying the gate voltages of different polarity.

22. The tuned amplifier of claim 17, said third resistor in at least one of said pair of said phase shift circuits is formed by a channel of an FET for controlling the tuned frequency by varying the channel resistance depending on the gate voltage.

23. The tuned amplifier of claim 17, wherein said third resistor in at least one of said pair of phase shift circuits is formed by a parallel connection of a p-channel FET and an n-channel FET for controlling the tuned frequency by varying the channel resistances of said FETs depending on the gate voltages of opposite polarity.

24. The tuned amplifier of claim 17, wherein said capacitor of at least one of said pair of phase shift circuits is formed by a capacitance converter circuit comprising a negative gain amplifier, a capacitor connected between the output and input of said amplifier.

25. The tuned amplifier of claim 17 wherein the entire circuit is implemented in an integrated circuit.

26. The tuned amplifier of claim 18 wherein the entire circuit is implemented in an integrated circuit.

27. The tuned amplifier of claim 19 wherein the entire circuit is implemented in an integrated circuit.

28. The tuned amplifier of claim 20 wherein the entire circuit is implemented in an integrated circuit.

29. The tuned amplifier of claim 21 wherein the entire circuit is implemented in an integrated circuit.

30. The tuned amplifier of claim 22 wherein the entire circuit is implemented in an integrated circuit.

31. The tuned amplifier of claim 23 wherein the entire circuit is implemented in an integrated circuit.

32. The tuned amplifier of claim 24 wherein the entire circuit is implemented in an integrated circuit.

33. A tuned amplifier comprising:

a summing circuit including an input impedance element to receive an input signal at one end thereof and a feedback impedance element to receive a feedback signal at one end thereof for summing the input signal and the feedback signal; and a pair of phase shift circuits each including a first series circuit of first and second resistors having substantially equal resistance for receiving an input AC signal thereacross, a second series circuit of a third resistor and an inductor for receiving the input AC signal thereacross, and a differential amplifier to amplify with a predetermined amplification factor the potential difference between the junction of said first and second resistors and the junction of said third resistor and said inductor;

wherein said pair of phase shift circuits are connected in any order in a cascade manner with the summed signal applied to the front stage phase shift circuit and with the output signal from the phase shift circuit in the subsequent stage applied to the other end of said feedback impedance element as the feedback signal, and the output tuned signal is derived from the one of said pair of phase shift circuits in the subsequent stage.

34. The tuned amplifier of claim 33, wherein the way of connecting serially said third resistor and said inductor constituting said second series circuit is opposite to each other in said pair of phase shift circuits.

35. The tuned amplifier of claim 33, wherein said input and feedback impedance elements are resistors with at least one of said resistors being a variable resistor, and the resistance ratio of said input and feedback impedance elements is varied to control the maximum attenuation.

36. The tuned amplifier of claim 35, wherein said variable resistor is formed by an FET whose channel resistance is varied by controlling the gate voltage.

37. The tuned amplifier of claim 35, wherein said variable resistor is formed by a parallel connection of a p-channel FET and an n-channel FET with the channel resistances thereof varied by controlling the gate voltages of opposite polarity to each other.

38. The tuned amplifier of claim 33, wherein said third resistor of at least one of said pair of phase shift circuits is formed by the channel resistance of an FET to control the tuned frequency by varying the channel resistance depending on the gate voltage.

39. The tuned amplifier of claim 33, wherein said third resistor of at least one of said pair of phase shift circuits consists of a parallel connection of a p-channel FET and an n-channel FET whose gate voltages are varied in opposite polarity to each other for controlling the tuned frequency.

40. The tuned amplifier of claim 33, wherein said inductor in at least one of said pair of phase shift circuits is an inductance converter circuit comprising an amplifier having a gain between 0 and 1, and an inductance element connected between the input and output of said amplifier.

41. The tuned amplifier of claim 33 wherein the entire circuit is implemented in an integrated circuit.

42. The tuned amplifier of claim 34 wherein the entire circuit is implemented in an integrated circuit.

43. The tuned amplifier of claim 35 wherein the entire circuit is implemented in an integrated circuit.

44. The tuned amplifier of claim 36 wherein the entire circuit is implemented in an integrated circuit.

45. The tuned amplifier of claim 37 wherein the entire circuit is implemented in an integrated circuit.

46. The tuned amplifier of claim 38 wherein the entire circuit is implemented in an integrated circuit.

47. The tuned amplifier of claim 39 wherein the entire circuit is implemented in an integrated circuit.

48. The tuned amplifier of claim 40 wherein the entire circuit is implemented in an integrated circuit.

49. A tuned amplifier comprising:
a summing circuit including an input impedance element to receive an input signal at one end thereof and a feedback impedance element to receive a feedback signal at one end thereof for summing the input signal and the feedback signal;
a pair of phase shift circuits each including a first series circuit of first and second resistors of substantially equal resistance to receive an input AC signal thereacross, a second series circuit of a third resistor and an inductor to receive the input AC signal thereacross, and a differential amplifier to amplify with a predetermined gain a potential difference between the junction of said first and second resistors and the junction of said third resistor and said inductor; and
a non-inverting circuit to output the input signal without altering its phase;
wherein said pair of phase shift circuits and said non-inverting circuit are connected in any order in a cascade manner to apply the summed signal to the front most stage of said cascade connected circuits and feeding the output from the final stage circuit as the feedback signal by way of said feedback impedance element, and the output from the one of said plurality of circuits in the final stage is derived as the output tuned signal.

50. The tuned amplifier of claim 49, wherein the way of serially connecting said third resistor and said inductor in said second series circuit is opposite to each other in said pair of phase shift circuits.

51. The tuned amplifier of claim 49, wherein said input and feedback impedance elements are resistors at least one of which is a variable resistor for controlling the maximum attenuation by varying the resistance ratio of said input and feedback impedance elements.

52. The tuned amplifier of claim 51, wherein said variable resistor is formed by the channel resistance of an FET controlled by varying the gate voltage.

53. The tuned amplifier of claim 51, wherein said variable resistor is formed by a parallel connection of a p-channel FET and an n-channel FET whose channel resistance can be controlled by varying the gate voltages of opposite polarity to each other.

54. The tuned amplifier of claim 49, wherein said third resistor of at least one of said pair of phase shift circuits is formed by the channel resistance of an FET which is varied depending on the gate voltage for controlling the tuned frequency.

55. The tuned amplifier of claim 49, wherein said third resistor in at least one of said pair of phase shift circuits is formed by a parallel connection of a p-channel FET and an n-channel FET whose channel resistances are varied by the gate voltages of opposite polarity to each other for controlling the tuned frequency.

56. The tuned amplifier of claim 49, wherein said inductor in at least one of said pair of phase shift circuits is an inductance converter circuit comprising an amplifier having a gain in the range from 0 to 1 and an inductance element connected between the input and output of said amplifier.

57. The tuned amplifier of claim 49 wherein the entire circuit is implemented in an integrated circuit.

58. The tuned amplifier of claim 50 wherein the entire circuit is implemented in an integrated circuit.

59. The tuned amplifier of claim 51 wherein the entire circuit is implemented in an integrated circuit.

60. The tuned amplifier of claim 52 wherein the entire circuit is implemented in an integrated circuit.

61. The tuned amplifier of claim 53 wherein the entire circuit Is implemented in an integrated circuit.

62. The tuned amplifier of claim 54 wherein the entire circuit is implemented in an integrated circuit.

63. The tuned amplifier of claim 55 wherein the entire circuit is implemented in an integrated circuit.

64. The tuned amplifier of claim 56 wherein the entire circuit is implemented in an integrated circuit.

65. A tuned amplifier comprising:
a summing circuit including an input impedance element to receive an input signal at one end thereof and a feedback impedance element to receive a feedback signal at one end thereof for summing the input and feedback signals;
a first phase shift circuit including a first series circuit of first and second resistors of substantially equal resistance to receive an input AC signal thereacross, a second series circuit of a third resistor and a capacitor to receive the input AC signal thereacross, and a differential amplifier to amplify by a predetermined amplification factor a potential difference between the junction of said first and second resistors and the junction of said third resistor and said capacitor; and
a second phase shift circuit including a first series circuit of first and second resistors of substantially equal resistance to receive an input AC signal thereacross, a second series circuit of a third resistor and an inductor to receive the input AC signal thereacross, and a differential amplifier to amplify by a predetermined amplification factor a potential difference between the junction point of said first and second resistors and the junction point of said third resistor and said inductor;
wherein said first and second phase shift circuits are connected in any order in a cascade manner to receive the summed signal from said summing circuit at the front stage phase shift circuit while applying the output from the subsequent stage phase shift circuit to one end of said feedback impedance element as the feedback signal, and output from the one of said first and second phase shift circuits in the subsequent stage is derived as the output tuned signal.

66. The tuned amplifier of claim 65, wherein the way of serially connecting said capacitor or inductor and said third resistor in said second series circuit is identical in said pair of phase shift circuits.

67. The tuned amplifier of claim 65, wherein said input and feedback impedance elements are resistors at least one of which is a variable resistor, and the resistance ratio of said input and feedback impedance elements is varied to control the maximum attenuation.

68. The tuned amplifier of claim 65, wherein said third resistor in at least one of said pair of phase shift circuits is formed by the channel resistance of an FET which may be varied depending on the gate voltage for controlling the tuned frequency.

69. The tuned amplifier of claim 65 wherein the entire circuit is implemented in an integrated circuit.

70. The tuned amplifier of claim 66 wherein the entire circuit is implemented in an integrated circuit.

71. The tuned amplifier of claim 67 wherein the entire circuit is implemented in an integrated circuit.

72. The tuned amplifier of claim 68 wherein the entire circuit is implemented in an integrated circuit.

73. A tuned amplifier comprising:
a summing circuit including an input impedance element to receive an input signal at one end thereof, and a feedback impedance element to receive a feedback signal at one end thereof for summing the input signal and the feedback signal;

a first phase shift circuit including a first series circuit of first and second resistors of substantially equal resistance to receive an input AC signal thereacross, a second series circuit of a third resistor and a capacitor to receive the input AC signal thereacross, and a differential amplifier for amplifying by a predetermined amplification factor a potential difference between the junction point of said first and second resistors and the junction point of said third resistor and said capacitor;

a second phase shift circuit including a first series circuit of first and second resistors of substantially equal resistance to receive an input AC signal thereacross, a second series circuit of a third resistor and an inductor to receive the input AC signal thereacross, and a differential amplifier for amplifying by a predetermined amplification factor a potential difference between the junction point of said first and second resistors and the junction point of said third resistor and said inductor; and a non-inverting circuit to provide an output without altering the phase of an input signal applied thereto;

wherein said first and second phase shift circuits and said non-inverting circuit are connected in any order in a cascade manner to receive at the front most stage of said plural circuits the summed signal from said summing circuit, an output from the final stage circuit is applied to one end of said feedback impedance element as the feedback signal, and an output from the one of the phase circuits in the final stage is derived as an output tuned signal.

74. The tuned amplifier of claim 73, wherein the way of serially connecting said capacitor or inductor and said third resistor in said second series circuit is identical in said pair of phase shift circuits.

75. The tuned amplifier of claim 73, wherein said input and feedback impedance elements are resistors at least one of which is variable resistor for varying the resistance ratio of said input and feedback impedance elements, thereby controlling the maximum attenuation.

76. The tuned amplifier of claim 73, wherein said third resistor in at least one of said pair of phase shift circuits is formed by an FET the channel resistance of which can be varied depending on the gate voltage for controlling the tuned frequency.

77. The tuned amplifier of claim 73 wherein the entire circuit is implemented in an integrated circuit.

78. The tuned amplifier of claim 74 wherein the entire circuit is implemented in an integrated circuit.

79. The tuned amplifier of claim 75 wherein the entire circuit is implemented in an integrated circuit.

80. The tuned amplifier of claim 76 wherein the entire circuit is implemented in an integrated circuit.

81. A tuned amplifier comprising:

a summing circuit including an input impedance element to receive an input signal at one end thereof, and a feedback impedance element to receive a feedback signal at one end thereof for summing the input and feedback signals;

a pair of phase shift circuits each including a first series circuit of first and second resistors of substantially equal resistance to receive an input AC signal thereacross, a second series circuit of a third resistor and a capacitor to receive the input AC signal thereacross, and a differential amplifier for amplifying by a predetermined amplification factor a potential difference between the junction point of said first and second resistors and the junction point of said third resistor and said capacitor; and a phase inverter circuit to provide an output inverting the phase of the input AC signal thereto;

wherein said pair of phase shift circuits and said phase inverter circuit are connected in any order in a cascade manner to receive the summed signal from said summing circuit to the front most stage of said plural circuits, an output from the final stage circuit is applied to one end of said feedback impedance element as the feedback signal, and an output from the one of said plural circuits in the final stage is derived as an output tuned signal.

82. The tuned amplifier of claim 81, wherein the way of serially connecting said third resistor and said capacitor in said second series circuit is opposite to each other in said pair of phase shift circuits.

83. The tuned amplifier of claim 81, wherein said input and feedback impedance elements are resistors at least one of which is a variable resistor to vary the resistance ratio of said input and feedback impedance elements for controlling the maximum attenuation.

84. The tuned amplifier of claim 83, wherein said variable resistor is the channel resistance of an FET which is varied by adjusting the gate voltage.

85. The tuned amplifier of claim 83, wherein said variable resistor is formed by a parallel connection of a p-channel FET and an n-channel FET the channel resistance of which can be varied by adjusting the gate voltages of opposite polarity to said FETs.

86. The tuned amplifier of claim 81, wherein said third resistor in at least one of said pair of phase shift circuits is the channel resistance of an FET which is varied depending on the gate voltage for controlling the tuned frequency.

87. The tuned amplifier of claim 81, wherein said third resistor in at least one of said phase shift circuits is a parallel connection of a p-channel FET and an n-channel FET the channel resistances of which are varied by adjusting the gate voltages of different polarity for controlling the tuned frequency.

88. The tuned amplifier of claim 81, wherein said capacitor in at least one of said pair of phase shift circuits is a capacitance converter circuit comprising a negative gain amplifier and a capacitance element connected between the output and input of said amplifier.

89. The tuned amplifier of claim 81 wherein the entire circuit is implemented in an integrated circuit.

90. The tuned amplifier of claim 82 wherein the entire circuit is implemented in an integrated circuit.

91. The tuned amplifier of claim 83 wherein the entire circuit is implemented in an integrated circuit.

92. The tuned amplifier of claim 84, wherein the entire circuit is implemented in an integrated circuit.

93. The tuned amplifier of claim 85 wherein the entire circuit is implemented in an integrated circuit.

94. The tuned amplifier of claim 86 wherein the entire circuit is implemented in an integrated circuit.

95. The tuned amplifier of claim 87 wherein the entire circuit is implemented in an integrated circuit.

96. The tuned amplifier of claim 88 wherein the entire circuit is implemented in an integrated circuit.

97. A tuned amplifier comprising:

a summing circuit including an input impedance element to receive an input signal at one end thereof, and a feedback impedance element to receive a feedback signal at one end thereof for summing the input and feedback signals;

a pair of phase shift circuits each including a first series circuit of first and second resistors of substantially equal resistance to receive an input AC signal thereacross, a second series circuit of a third resistor and an inductor to receive the input AC signal thereacross, and a differential amplifier for amplifying by a predetermined amplification factor a potential difference between the junction point of said first and second resistors and the junction point of said third resistor and said inductor; and a phase inverter circuit to provide an output inverted in phase with respect to the input signal thereto;

wherein said pair of phase shift circuits and said phase inverter circuit are connected in any order in a cascade manner to receive the summed signal from said summing circuit at the front most stage of said plural circuits while an output from the final stage circuit is applied as the feedback signal to one end of said feedback impedance element, and an output from the one of said plural circuits in the final stage is derived as an output tuned signal.

98. The tuned amplifier of claim 97, wherein the way of serially connecting said third resistor and said inductor in said second series circuit is identical in said pair of phase shift circuits.

99. The tuned amplifier of claim 97, wherein said input and feedback impedance elements are resistors at least one of which is variable resistor to vary the resistance ratio of said input and feedback impedance element for controlling the maximum attenuation.

100. The tuned amplifier of claim 99, wherein said variable resistor is the channel resistance of an FET which is varied by adjusting the gate voltage thereof.

101. The tuned amplifier of claim 99, wherein said variable resistor is a parallel connection of a p-channel FET and an n-channel FET the channel resistance of which vary with the gate voltages of different polarity to said FETs.

102. The tuned amplifier of claim 97, wherein said third resistor in at least one of said pair of phase shift circuits is the channel resistance of an FET which varies with the gate voltage for controlling the tuned frequency.

103. The tuned amplifier of claim 97, wherein said third resistor in at least one of said pair of phase shift circuits is a parallel connection of a p-channel FET and an n-channel FET the channel resistance of which vary with the gate voltages of opposite polarity for controlling the tuned frequency.

104. The tuned amplifier of claim 97, wherein said inductor in at least one of said pair of phase shift circuits is an inductance converter circuit comprising an amplifier with its gain set between 0 to 1 and an inductance element connected between the input and output of said amplifier.

105. The tuned amplifier of claim 97 wherein the entire circuit is implemented in an integrated circuit.

106. The tuned amplifier of claim 98 wherein the entire circuit is implemented in an integrated circuit.

107. The tuned amplifier of claim 99 wherein the entire circuit is implemented in an integrated circuit.

108. The tuned amplifier of claim 100 wherein the entire circuit is implemented in an integrated circuit.

109. The tuned amplifier of claim 101 wherein the entire circuit is implemented in an integrated circuit.

110. The tuned amplifier of claim 102 wherein the entire circuit is implemented in an integrated circuit.

111. The tuned amplifier of claim 103 wherein the entire circuit is implemented in an integrated circuit.

112. The tuned amplifier of claim 104 wherein the entire circuit is implemented in an integrated circuit.

113. A tuned amplifier comprising:

a summing circuit including an input impedance element to receive an input signal at one end thereof, and a feedback impedance element to receive a feedback signal at one end thereof for summing the input and feedback signals;

a first phase shift circuit including a first series circuit of first and second resistors of substantially equal resistance to receive an input AC signal thereacross, a second series circuit of a third resistor and a capacitor to receive the input AC signal thereacross, and a differential amplifier for amplifying by a predetermined amplification factor a potential difference between the junction point of said first and second resistors and the junction point of said third resistor and said capacitor;

a second phase shift circuit including a first series circuit of first and second resistors of substantially equal resistance to receive an input AC signal thereacross, a second series circuit of a third resistor and an inductor to receive the input AC signal thereacross, and a differential amplifier for amplifying by a predetermined amplification factor a potential difference between the junction point of said first and second resistors and the junction point of said third resistor and said inductor; and a phase inverter circuit to invert the phase of the input AC signal thereto;

wherein said first and second phase shift circuits and said phase inverter circuit are connected in any order in a cascade manner to apply the summed signal from said summing circuit to the front most stage of said plural circuits, an output from the final stage circuit is applied to one end of said feedback impedance element as the feedback signal, and output from the one of said plural circuits in the final stage is derived as an output tuned signal.

114. The tuned amplifier of claim 113, wherein the way of serially connecting said capacitor or inductor with respect to said third resistor in said second series circuit is opposite to each other in said pair of phase shift circuits.

115. The tuned amplifier of claim 113, wherein said input and feedback impedance elements are resistors at least one of which is variable resistor to vary the resistance ratio of said input and feedback impedance elements for controlling the maximum attenuation.

116. The tuned amplifier of claim 113, wherein said third resistor in at least one of said pair of phase shift circuits is the channel resistance of an FET which varies with the gate voltage for controlling the tuned frequency.

117. The tuned amplifier of claim 113 wherein the entire circuit is implemented in an integrated circuit.

118. The tuned amplifier of claim 114 wherein the entire circuit is implemented in an integrated circuit.

119. The tuned amplifier of claim 115 wherein the entire circuit is implemented in an integrated circuit.

120. The tuned amplifier of claim 116 wherein the entire circuit is implemented in an integrated circuit.

* * * * *